(12) United States Patent
Kobayashi et al.

(10) Patent No.: US 11,075,095 B2
(45) Date of Patent: Jul. 27, 2021

(54) SUBSTRATE PROCESSING APPARATUS

(71) Applicant: SCREEN Holdings Co., Ltd., Kyoto (JP)

(72) Inventors: Kenji Kobayashi, Kyoto (JP); Jun Sawashima, Kyoto (JP); Yuta Nishimura, Kyoto (JP); Akito Hatano, Kyoto (JP); Motoyuki Shimai, Kyoto (JP); Toyohide Hayashi, Kyoto (JP)

(73) Assignee: SCREEN Holdings Co., Ltd.

( * ) Notice: Subject to any disclaimer, the term of this patent is extended or adjusted under 35 U.S.C. 154(b) by 138 days.

(21) Appl. No.: 16/406,419

(22) Filed: May 8, 2019

(65) Prior Publication Data
US 2019/0267257 A1 Aug. 29, 2019

Related U.S. Application Data

(62) Division of application No. 15/019,246, filed on Feb. 9, 2016, now Pat. No. 10,332,761.

(30) Foreign Application Priority Data

| Feb. 18, 2015 | (JP) | JP2015-029843 |
| Feb. 25, 2015 | (JP) | JP2015-035519 |
| Feb. 25, 2015 | (JP) | JP2015-035520 |
| Feb. 25, 2015 | (JP) | JP2015-035521 |
| Mar. 26, 2015 | (JP) | JP2015-064802 |

(51) Int. Cl.
*H01L 21/67* (2006.01)

(52) U.S. Cl.
CPC .... *H01L 21/6708* (2013.01); *H01L 21/67017* (2013.01); *H01L 21/67028* (2013.01); *H01L 21/67051* (2013.01); *H01L 21/67109* (2013.01); *H01L 21/67248* (2013.01)

(58) Field of Classification Search
CPC .............. H01L 21/67051; H01L 21/6708
See application file for complete search history.

(56) References Cited

U.S. PATENT DOCUMENTS

| 6,190,063 B1 | 2/2001 | Akimoto |
| 2006/0234503 A1 | 10/2006 | Yamada et al. ............ 438/667 |
| 2007/0175863 A1 | 8/2007 | Koyata et al. ............. 216/84 |
| 2009/0004876 A1 | 1/2009 | Koyata et al. ............ 438/753 |
| 2009/0056746 A1 | 3/2009 | Sandhu ...................... 134/3 |
| 2009/0103960 A1 | 4/2009 | Harumoto et al. ......... 399/377 |
| 2009/0229641 A1 | 9/2009 | Yoshida ................... 134/107 |
| 2010/0130022 A1 | 5/2010 | Park et al. ............... 438/758 |
| 2010/0319734 A1 | 12/2010 | Minami ..................... 134/26 |
| 2013/0020284 A1 | 1/2013 | Osada ....................... 216/57 |

(Continued)

FOREIGN PATENT DOCUMENTS

| CN | 101582372 A | 11/2009 |
| JP | 07-245287 A | 9/1995 |

(Continued)

*Primary Examiner* — Spencer E Bell
(74) *Attorney, Agent, or Firm* — Ostrolenk Faber LLP

(57) ABSTRACT

A supply flow passage branches into a plurality of upstream flow passages. The plurality of upstream flow passages include a branching upstream flow passage that branches into a plurality of downstream flow passages. A plurality of discharge ports are respectively disposed at a plurality of positions differing in distance from a rotational axis and discharge processing liquids, supplied via the plurality of upstream flow passages, toward an upper surface of a substrate held by a substrate holding unit.

13 Claims, 19 Drawing Sheets

(56) References Cited

U.S. PATENT DOCUMENTS

| | | | |
|---|---|---|---|
| 2013/0048609 A1 | 2/2013 | Ito et al. | 216/83 |
| 2013/0076829 A1 | 3/2013 | Yamamoto | 347/32 |
| 2014/0000659 A1 | 1/2014 | Lee | 134/26 |
| 2014/0065295 A1 | 3/2014 | Emoto et al. | 427/8 |
| 2014/0231010 A1 | 8/2014 | Park | 156/345.11 |
| 2015/0075571 A1 | 3/2015 | Miura | 134/99.1 |
| 2016/0071746 A1 | 3/2016 | Hayashi | |

FOREIGN PATENT DOCUMENTS

| | | |
|---|---|---|
| JP | 08-274052 A | 10/1996 |
| JP | H09-150092 A | 6/1997 |
| JP | H09-162097 A | 6/1997 |
| JP | H11-165114 A | 6/1999 |
| JP | H11-260718 A | 9/1999 |
| JP | 2003-289033 A | 10/2003 |
| JP | 2005-217226 A | 8/2005 |
| JP | 2006-041086 A | 2/2006 |
| JP | 2006-231130 A | 9/2006 |
| JP | 2006-344907 | 12/2006 |
| JP | 2007-180144 A | 7/2007 |
| JP | 2007-200954 A | 8/2007 |
| JP | 2007-207810 A | 8/2007 |
| JP | 2007-529106 A | 10/2007 |
| JP | 2009-099851 A | 5/2009 |
| JP | 2009-218405 A | 9/2009 |
| JP | 2009-231732 A | 10/2009 |
| JP | 2010-050226 A | 3/2010 |
| JP | 2010-130014 A | 6/2010 |
| JP | 2013-045972 A | 3/2013 |
| JP | 2013-175672 A | 9/2013 |
| JP | 2013-207267 A | 10/2013 |
| JP | 2014-022678 A | 2/2014 |
| JP | 2014-197571 A | 10/2014 |
| JP | 2014-209605 A | 11/2014 |
| KR | 10-2008-0088916 A1 | 10/2008 |
| WO | WO 2007/088755 A1 | 8/2007 |

FIG. 1 Discharging state

FIG. 2 Discharge stoppage state

「←」 conceptually indicates increase of etching amount due to supplying of high temperature gas.

FIG. 21 Discharging state

FIG. 22 Discharge stoppage state

SUBSTRATE PROCESSING APPARATUS

CROSS REFERENCE TO RELATED APPLICATION

This application is a divisional of U.S. patent application Ser. No. 15/019,246, filed Feb. 9, 2016, which claims the benefit of Japanese Patent Application Nos. 2015-029843, filed Feb. 18, 2015, 2015-035519, filed Feb. 25, 2015, 2015-035520, filed Feb. 25, 2015, 2015-035521, filed Feb. 25, 2015 and 2015-064802, filed Mar. 26, 2015, which are incorporated herein by reference.

BACKGROUND OF THE INVENTION

1. Field of the Invention

The present invention relates to a substrate processing apparatus which processes a substrate. Substrates to be processed include, for example, semiconductor wafers, liquid crystal display device substrates, plasma display substrates, FED (Field Emission Display) substrates, optical disk substrates, magnetic disk substrates, magneto-optical disk substrates, photomask substrates, ceramic substrates, and photovoltaic cell substrates.

2. Description of Related Art

Japanese Patent Application Publication No. 2006-344907 discloses a single substrate processing type substrate processing apparatus that processes a substrate, such as a semiconductor wafer, etc., one by one. The substrate processing apparatus includes a spin chuck that rotates the substrate while holding the substrate horizontally and a nozzle that discharges a processing liquid of higher temperature than room temperature toward an upper surface central portion of the substrate held by the spin chuck. The high temperature processing liquid discharged from the nozzle lands on the upper surface central portion of the substrate and thereafter flows outward along the upper surface of the rotating substrate. The high temperature processing liquid is thereby supplied to an entire upper surface of the substrate.

The processing liquid that lands on the upper surface central portion of the rotating substrate flows from a central portion to a peripheral edge portion along the upper surface of the substrate. In this process, the temperature of the processing liquid decreases gradually. Temperature uniformity is thus decreased and processing uniformity is degraded. Although increasing a flow rate of the processing liquid discharged from the nozzle reduces the time taken for the processing liquid to reach the upper surface peripheral edge portion of the substrate and alleviates the lowering of the temperature of the processing liquid, in this case, the consumption amount of the processing liquid increases.

SUMMARY OF THE INVENTION

A preferred embodiment of the present invention provides a substrate processing apparatus including a substrate holding unit rotating a substrate around a vertical rotational axis passing through a central portion of the substrate while holding the substrate horizontally, and a processing liquid supplying system supplying a processing liquid to the substrate held by the substrate holding unit.

The processing liquid supplying system includes a supply flow passage, a plurality of upstream flow passages, a plurality of downstream flow passages, and a plurality of discharge ports. The supply flow passage guides the processing liquid toward the plurality of upstream flow passages. The plurality of upstream flow passages branch from the supply flow passage and guide the processing liquids, supplied from the supply flow passage, toward the plurality of discharge ports. The plurality of discharge ports include a main discharge port, discharging the processing liquid toward an upper surface central portion of the substrate, and a plurality of auxiliary discharge ports, disposed away from the upper surface central portion, differing in distance from the rotational axis, and respectively discharging the processing liquids toward a plurality of positions within an upper surface of the substrate, and are respectively disposed at a plurality of positions differing in distance from the rotational axis and discharge the processing liquids, supplied via the plurality of upstream flow passages, toward the upper surface of the substrate held by the substrate holding unit. The plurality of upstream flow passages include a main upstream flow passage connected to the main discharge port and a plurality of auxiliary upstream flow passages connected to the plurality of auxiliary discharge ports via the plurality of downstream flow passages. Each of the plurality of the auxiliary upstream flow passages is a branching upstream flow passage that branches into a plurality of the downstream flow passages and each auxiliary discharge port is respectively provided according to each downstream flow passage.

With this arrangement, the supply flow passage guiding the processing liquid branches into the plurality of upstream flow passages. The number of discharge ports can thereby be increased. Further, the branching upstream flow passages branching into the plurality of downstream flow passages are included in the plurality of upstream flow passages and the number of discharge ports can thus be increased further. The processing liquid flowing through the supply flow passage is supplied to the discharge ports from the upstream flow passages or the downstream flow passages and discharged toward the upper surface of the substrate that rotates around the rotational axis. The plurality of discharge ports are respectively disposed at the plurality of positions differing in distance from the rotational axis. Temperature uniformity of the processing liquid on the substrate can thus be increased in comparison to a case where the processing liquid is discharged from just a single discharge port. Processing uniformity can thereby be increased while reducing the consumption amount of the processing liquid.

In a case where processing liquids are discharged from a plurality of discharge ports toward a plurality of positions that are separated in a radial direction, it is important, in terms of improvement of processing uniformity, that processing liquids of the same quality are supplied to the respective portions of the substrate. If a tank and a filter, etc., are provided for each discharge port, the processing liquid supplied to a certain discharge port may differ in quality from the processing liquid supplied to another discharge port. On the other hand, with the present preferred embodiment, the supply flow passage is branched so that the processing liquids supplied from the same flow passage (supply flow passage) are discharged from the respective discharge ports. Processing liquids of the same quality can thereby be discharged from the respective discharge ports. Further, in comparison to an arrangement where a tank and a filter, etc., are provided according to each discharge port, the number of parts can be reduced and maintenance work can be simplified.

In the present preferred embodiment, at least one of the following features may be added to the above substrate processing apparatus.

The processing liquid supplying system further includes an upstream heater and a plurality of downstream heaters, the upstream heater heats the processing liquid, supplied to the supply flow passage, at an upstream temperature, and the plurality of downstream heaters are respectively connected to the plurality of auxiliary upstream flow passages and heat the processing liquids, flowing through the plurality of auxiliary upstream flow passages, at downstream temperatures higher than the upstream temperature.

If the processing liquid is higher in temperature than the substrate, the heat of the processing liquid is transferred from the processing liquid to the substrate. Also, since the processing liquid rotates together with the substrate, the processing liquid on the substrate flows outward along the upper surface of the substrate while being cooled by air. Circumferential speeds of respective portions of the substrate increase as the distance from the rotational axis increases. The processing liquid on the substrate is cooled more readily when the circumferential speed is higher. Also, if it is supposed that the upper surface of the substrate can be divided into a plurality of circular annular regions at equal intervals in a radial direction, the respective regions increase in area as the distance from the rotational axis increases. When the surface area increases, heat to be transferred from the processing liquid to a circular annular region increases. Therefore if the temperatures of the processing liquids discharged from the discharge ports are all the same, sufficient temperature uniformity may not be obtained.

With this arrangement, the processing liquids that have been heated at the downstream temperatures higher than the upstream temperature by the downstream heaters are supplied to the plurality of auxiliary discharge ports from the plurality of auxiliary upstream flow passages and are discharged from the discharge ports. That is, whereas the processing liquid of the upstream temperature is discharged from the main discharge port, the processing liquid of higher temperature than the upstream temperature is discharged from each of the plurality of auxiliary discharge ports. Since the temperatures of the processing liquids supplied to the upper surface of the substrate increase stepwise as the distance from the rotational axis increases, the temperature uniformity of the processing liquid on the substrate can thus be increased in comparison to a case where the processing liquid of the same temperature is discharged from each discharge port. The processing uniformity can thereby be increased while reducing the consumption amount of the processing liquid.

The processing liquid supplying system further includes a plurality of return flow passages, a plurality of downstream heaters, and a downstream switching unit, the plurality of return flow passages are respectively connected to the plurality of auxiliary upstream flow passages at positions further upstream than the plurality of auxiliary discharge ports, the plurality of downstream heaters are respectively connected to the plurality of auxiliary upstream flow passages at positions further upstream than the connection positions of the return flow passages and the auxiliary upstream flow passages and heat liquids flowing through the plurality of auxiliary upstream flow passages, and the downstream switching unit switches to any of a plurality of states including a discharging state, in which the liquid supplied to the plurality of upstream flow passages from the supply flow passage is supplied to the plurality of discharge ports, and a discharge stoppage state, in which the liquid supplied to the plurality of upstream flow passages from the supply flow passage is supplied to the plurality of return flow passages.

The temperature of the processing liquid may have a large influence on the processing of the substrate. If the downstream heaters are stopped during discharge stoppage, it will take time for the temperatures of the processing liquids, heated by the downstream heaters, to stabilize at the intended temperatures when operation of the downstream heaters is restarted. The discharges of the processing liquids thus cannot be restarted immediately and throughput (number of substrates processed per unit time) decreases. It is therefore preferable for the liquids to be heated by the downstream heaters even during discharge stoppage.

With this arrangement, during discharge stoppage, the liquids are supplied to the upstream flow passages and heated by the downstream heaters. The liquids heated by the downstream heaters are not discharged from the plurality of discharge ports but flow from the upstream flow passages into the return flow passages. A state where the temperatures of the downstream heaters are stable can thus be maintained even during discharge stoppage. The discharge of the processing liquid can thus be restarted immediately.

The substrate processing apparatus further includes a chamber housing the substrate held by the substrate holding unit and the branching upstream flow passages branch into the plurality of downstream flow passages inside the chamber.

With this arrangement, upstream ends of the plurality of downstream flow passages are disposed inside the chamber. The branching upstream flow passages branch into the plurality of downstream flow passages inside the chamber. Each downstream flow passage can thus be reduced in length (length in a direction in which the liquid flows) in comparison to a case where the branching upstream flow passages are branched outside the chamber. Temperature decrease of the processing liquid due to heat transfer from the processing liquid to each downstream flow passage can thereby be suppressed.

The processing liquid supplying system further includes a first nozzle and a second nozzle, the plurality of discharge ports include a first discharge port, disposed in the first nozzle, and a second discharge port, disposed in the second nozzle, and are aligned in a plan view in a radial direction orthogonal to the rotational axis, the first nozzle includes a first arm portion extending in a horizontal longitudinal direction and a first tip portion extending downward from a tip of the first arm portion, the second nozzle includes a second arm portion extending in the longitudinal direction and a second tip portion extending downward from a tip of the second arm portion, the first arm portion and the second arm portion are aligned in a horizontal alignment direction orthogonal to the longitudinal direction, and the tip of the first arm portion and the tip of the second arm portion are separated in the longitudinal direction in a plan view such that the tip of the first arm portion is positioned at the rotational axis side.

With this arrangement, the plurality of discharge ports are aligned in a plan view in the radial direction. When a plurality of nozzles of the same length are aligned in the horizontal direction orthogonal to the longitudinal direction so that the plurality of discharge ports are aligned in a plan view in the radial direction, an entirety of the plurality of nozzles increases in width (see FIG. 9). When a plurality of nozzles of different lengths are aligned in a vertical direction so that the plurality of discharge ports are aligned in a plan view in the radial direction, the entirety of the plurality of nozzles increases in height (see FIG. 10A and FIG. 10B).

On the other hand, when the first arm portion and the second arm portion are aligned in the horizontal alignment direction orthogonal to the longitudinal direction and the tip of the first arm portion and the tip of the second arm portion are shifted in the longitudinal direction in a plan view such that the tip of the first arm portion is positioned at the rotational axis side, the plurality of discharge ports can be aligned in the radial direction in a plan view while suppressing both the width and the height of the entirety of the plurality of nozzles (see FIG. 4). The plurality of nozzles and associated members, such as a standby pot, etc., can thereby be made compact.

The plurality of discharge ports include an oblique discharge port that discharges the processing liquid in a discharge direction that is obliquely inclined with respect to the upper surface of the substrate, held by the substrate holding unit, so as to approach the rotational axis as the upper surface of the substrate is approached.

With this arrangement, the oblique discharge port, which is included in the plurality of discharge ports, discharges the processing liquid in the discharge direction that is inclined inwardly with respect to the upper surface of the substrate. The discharged processing liquid has kinetic energy of a direction directed toward the rotational axis and therefore flows along the upper surface of the substrate toward the rotational axis. Thereafter, the processing liquid flows outward along the upper surface of the substrate due to a centrifugal force generated by the rotation of the substrate and is expelled from the upper surface of the substrate. A retention time of the processing liquid on the substrate is thus increased in comparison to a case where the processing liquid is discharged in a direction perpendicular to the upper surface of the substrate or in a case where it is discharged in a direction that is outwardly inclined with respect to the upper surface of the substrate. The processing liquid can thus be used efficiently and the consumption amount of the processing liquid can be reduced.

The substrate processing apparatus further includes a controller controlling the processing liquid supplying system, the processing liquid supplying system further includes a plurality of discharge valves, the plurality of discharge ports include a first discharge port and a second discharge port disposed further from the rotational axis than the first discharge port, the plurality of upstream flow passages include a first upstream flow passage guiding the processing liquid toward the first discharge port and a second upstream flow passage guiding the processing liquid toward the second discharge port, the plurality of discharge valves include a first discharge valve opening and closing the first upstream flow passage and a second discharge valve opening and closing the second upstream flow passage, and the controller opens the first discharge valve and the second discharge valve so that a time during which the second discharge valve is open is longer than a time during which the first discharge valve is open and thereafter closes the first discharge valve and the second discharge valve.

The controller may successively open the first discharge valve and the second discharge valve in the order of the second discharge valve and the first discharge valve and thereafter close the first discharge valve and the second discharge valve at the same time. The controller may open the first discharge valve and the second discharge valve at the same time and thereafter successively close the first discharge valve and the second discharge valve in the order of the first discharge valve and the second discharge valve.

The controller may successively open the first discharge valve and the second discharge valve in the order of the second discharge valve and the first discharge valve and thereafter successively close the first discharge valve and the second discharge valve in the order of the first discharge valve and the second discharge valve.

With this arrangement, the first discharge port is disposed further inward than the second discharge port. The processing liquid discharged from the first discharge port lands on a first liquid landing position within the upper surface of the substrate. The processing liquid discharged from the second discharge port lands on a second liquid landing position within the upper surface of the substrate. The second liquid landing position is a position further outward than the first liquid landing position. The discharges of processing liquids from the first discharge port and the second discharge port are controlled by the controller.

For example, the controller starts the discharge of the processing liquid from the second discharge port and thereafter starts the discharge of the processing liquid from the first discharge port. Thereafter, the controller ends the discharge of the processing liquid from the first discharge port and the discharge of the processing liquid from the second discharge port at the same time. A processing liquid supplying time for a region further to the outer side than the second liquid landing position is thus longer than a processing liquid supplying time for a region further to the inner side than the second liquid landing position.

If the processing liquid is discharged from just a single discharge port, an etching rate (etching amount of the substrate per unit time) tends to decrease with distance away from a central portion of the substrate. Therefore, by increasing the processing liquid supplying time with distance away from the central portion of the substrate, the etching amounts at positions besides the central portion of the substrate can be increased. The processing uniformity can thereby be increased.

The processing liquid supplying system further includes a nozzle moving unit and a discharge position adjusting unit, the nozzle moving unit moves the plurality of discharge ports and the discharge position adjusting unit horizontally between a processing position, at which the plurality of discharge ports and the substrate overlap in a plan view, and a standby position, at which the plurality of discharge ports and the substrate do not overlap in a plan view, and the discharge position adjusting unit moves the plurality of discharge ports in a horizontal adjusting direction differing from a direction of movement of the plurality of discharge ports by the nozzle moving unit.

With this arrangement, the nozzle moving unit moves the plurality of discharge ports and the discharge position adjusting unit horizontally between the processing position and the standby positions. At the processing position, the plurality of discharge ports are respectively disposed at the plurality of positions differing in distance from the rotational axis. When the discharge position adjusting unit moves the plurality of discharge ports in the adjusting direction, all of the discharge ports are either moved closer to or further away from the rotational axis and the liquid landing positions of the processing liquids with respect to the upper surface of the substrate are moved. An etching profile (cross-sectional shape of the upper surface of the substrate after etching) can be adjusted by making the discharge position adjusting unit move the plurality of discharge ports.

Another preferred embodiment of the present invention provides a substrate processing apparatus including a substrate holding unit rotating a substrate around a vertical rotational axis passing through a central portion of the substrate while holding the substrate horizontally, and a processing liquid supplying system supplying a processing liquid to the substrate held by the substrate holding unit.

The processing liquid supplying system includes a supply flow passage, a plurality of upstream flow passages, a plurality of discharge ports, and a nozzle moving unit. The supply flow passage guides the processing liquid toward the plurality of upstream flow passages. The plurality of upstream flow passages branch from the supply flow passage and guide the processing liquids, supplied from the supply flow passage, toward the plurality of discharge ports. The plurality of discharge ports include a main discharge port, discharging the processing liquid toward an upper surface central portion of the substrate, and a plurality of auxiliary discharge ports, disposed away from the upper surface central portion, differing in distance from the rotational axis, and respectively discharging the processing liquids toward a plurality of positions within an upper surface of the substrate, and are respectively disposed at a plurality of positions differing in distance from the rotational axis and discharge the processing liquids, supplied via the plurality of upstream flow passages, toward the upper surface of the substrate held by the substrate holding unit. The plurality of upstream flow passages include a main upstream flow passage connected to the main discharge port and a plurality of auxiliary upstream flow passages connected to the plurality of auxiliary discharge ports. The nozzle moving unit swings the plurality of discharge ports to change the distances from the rotational axis to the plurality of discharge ports in a state where the substrate holding unit is rotating the substrate and the plurality of discharge ports are discharging the processing liquids toward the upper surface of the substrate. The swinging of the plurality of discharge ports may be a reciprocal movement or a zigzag movement.

With this arrangement, the supply flow passage guiding the processing liquid branches into the plurality of upstream flow passages. The number of discharge ports can thereby be increased. The processing liquid flowing through the supply flow passage is supplied to the discharge ports via the upstream flow passages and discharged toward the upper surface of the substrate that rotates around the rotational axis. The plurality of discharge ports are respectively disposed at the plurality of positions differing in distance from the rotational axis. The temperature uniformity of the processing liquid on the substrate can thus be increased in comparison to a case where the processing liquid is discharged from just a single discharge port. The processing uniformity can thereby be increased while reducing the consumption amount of the processing liquid.

Further with the present arrangement, the nozzle moving unit swings the plurality of discharge ports in the state where the substrate is rotating and the plurality of discharge ports are discharging the processing liquids. The distances from the rotational axis to the respective discharge ports are thereby changed. The processing liquids discharged from the plurality of discharge ports land on the plurality of liquid landing positions within the upper surface of the substrate. The etching amount of the substrate is greatest at each liquid landing position and decreases with distance away from the liquid landing position. The plurality of discharge ports are moved horizontally and the plurality of liquid landing positions are moved within the upper surface of the substrate accordingly. The processing uniformity can thereby be increased in comparison to a case where the plurality of discharge ports are not moved.

In the present preferred embodiment, at least one of the following features may be added to the substrate processing apparatus.

The processing liquid supplying system further includes a plurality of downstream flow passages, each of the plurality of auxiliary upstream flow passages is a branching upstream flow passage that branches into a plurality of the downstream flow passages, and each auxiliary discharge port is respectively provided according to each downstream flow passage.

With this arrangement, the flow passages supplying the processing liquids to the plurality of discharge ports are branched into multiple stages. That is, the supply flow passage branches into the plurality of upstream flow passages (first branching) and the branching upstream flow passages, included among the plurality of upstream flow passages, branch into the plurality of downstream flow passages (second branching). The number of discharge ports can thus be increased in comparison to a case where the branching upstream flow passages are not included among the plurality of upstream flow passages. The temperature uniformity of the processing liquid on the substrate can thereby be increased further and the processing uniformity can be increased further.

The substrate processing apparatus further includes a chamber housing the substrate held by the substrate holding unit and the branching upstream flow passages branch into the plurality of downstream flow passages inside the chamber.

With this arrangement, upstream ends of the plurality of downstream flow passages are disposed inside the chamber. The branching upstream flow passages branch into the plurality of downstream flow passages inside the chamber. Each downstream flow passage can thus be reduced in length (length in a direction in which the liquid flows) in comparison to a case where the branching upstream flow passages are branched outside the chamber. Temperature decrease of the processing liquid due to heat transfer from the processing liquid to each downstream flow passage can thereby be suppressed.

The processing liquid supplying system further includes an upstream heater and a plurality of downstream heaters, the upstream heater heats the processing liquid, supplied to the supply flow passage, at an upstream temperature, and the plurality of downstream heaters are respectively connected to the plurality of auxiliary upstream flow passages at positions further upstream than the plurality of auxiliary discharge ports and heat the processing liquids flowing through the plurality of auxiliary upstream flow passages, at downstream temperatures higher than the upstream temperature.

With this arrangement, the processing liquids that have been heated at the downstream temperatures higher than the upstream temperature by the downstream heaters are supplied to the plurality of auxiliary discharge ports from the plurality of auxiliary upstream flow passages and are discharged from the discharge ports. That is, whereas the processing liquid of the upstream temperature is discharged from the main discharge port, the processing liquid of higher temperature than the upstream temperature is discharged from each auxiliary discharge port. The temperatures of the processing liquids supplied to the upper surface of the substrate thus increase stepwise with distance away from the rotational axis and the temperature uniformity of the processing liquid on the substrate can thus be increased in comparison to a case where the processing liquid of the same temperature is discharged from each discharge port. The processing uniformity can thus be increased while reducing the consumption amount of the processing liquid.

The processing liquid supplying system further includes a plurality of return flow passages, a plurality of downstream heaters, and a downstream switching unit, the plurality of return flow passages are respectively connected to the plurality of auxiliary upstream flow passages at positions further upstream than the plurality of auxiliary discharge ports, the plurality of downstream heaters are respectively connected to the plurality of auxiliary upstream flow passages at positions further upstream than the connection positions of the return flow passages and the auxiliary upstream flow passages and heat the processing liquids flowing through the plurality of auxiliary upstream flow passages, and the downstream switching unit switches to any of a plurality of states including a discharging state, in which the processing liquid supplied to the plurality of upstream flow passages from the supply flow passage is supplied to the plurality of discharge ports, and a discharge stoppage state, in which the processing liquid supplied to the plurality of upstream flow passages from the supply flow passage is supplied to the plurality of return flow passages.

With this arrangement, during discharge stoppage, the processing liquid is supplied to the upstream flow passage and heated by the downstream heaters. The processing liquids heated by the downstream heaters are not discharged from the plurality of discharge ports but flow from the upstream flow passages into the return flow passages. A state where the temperatures of the downstream heaters are stable can thus be maintained even during discharge stoppage. The discharge of the processing liquid can thus be restarted immediately.

The processing liquid supplying system further includes a first nozzle and a second nozzle, the plurality of discharge ports include a first discharge port, disposed in the first nozzle, and a second discharge port, disposed in the second nozzle, and are aligned in a plan view in a radial direction orthogonal to the rotational axis, the first nozzle includes a first arm portion extending in a horizontal longitudinal direction and a first tip portion extending downward from a tip of the first arm portion, the second nozzle includes a second arm portion extending in the longitudinal direction and a second tip portion extending downward from a tip of the second arm portion, the first arm portion and the second arm portion are aligned in a horizontal alignment direction orthogonal to the longitudinal direction, and the tip of the first arm portion and the tip of the second arm portion are separated in the longitudinal direction in a plan view such that the tip of the first arm portion is positioned at the rotational axis side.

With this arrangement, the first discharge port and the second discharge port are aligned in a plan view in the radial direction. When a plurality of nozzles of the same length are aligned in the horizontal direction orthogonal to the longitudinal direction so that the plurality of discharge ports are aligned in a plan view in the radial direction, the entirety of the plurality of nozzles increases in width (see FIG. 9). When a plurality of nozzles of different lengths are aligned in a vertical direction so that the plurality of discharge ports are aligned in a plan view in the radial direction, the entirety of the plurality of nozzles increases in height (see FIG. 10A and FIG. 10B).

On the other hand, when the first arm portion and the second arm portion are aligned in the horizontal alignment direction orthogonal to the longitudinal direction and the tip of the first arm portion and the tip of the second arm portion are shifted in the longitudinal direction in a plan view such that the tip of the first arm portion is positioned at the rotational axis side, the plurality of discharge ports can be aligned in the radial direction in a plan view while suppressing both the width and the height of the entirety of the plurality of nozzles (see FIG. 4). The plurality of nozzles and associated members, such as a standby pot, etc., can thereby be made compact.

Another preferred embodiment of the present invention provides a substrate processing apparatus including a substrate holding unit rotating a substrate around a vertical rotational axis passing through a central portion of the substrate while holding the substrate horizontally, a processing liquid supplying system supplying a processing liquid to the substrate held by the substrate holding unit, and a gas supplying unit supplying a gas to the substrate held by the substrate holding unit.

The processing liquid supplying system includes a supply flow passage, a plurality of upstream flow passages, and a plurality of discharge ports. The gas supplying unit includes a plurality of gas discharge ports. The supply flow passage guides the processing liquid toward the plurality of upstream flow passages. The plurality of upstream flow passages branch from the supply flow passage and guide the processing liquids, supplied from the supply flow passage, toward the plurality of discharge ports. The plurality of discharge ports include a main discharge port, discharging the processing liquid toward an upper surface central portion of the substrate, and a plurality of auxiliary discharge ports, disposed away from the upper surface central portion, differing in distance from the rotational axis, and respectively discharging the processing liquids toward a plurality of positions within an upper surface of the substrate, and are respectively disposed at a plurality of positions differing in distance from the rotational axis and discharge the processing liquids, supplied via the plurality of upstream flow passages, toward the upper surface of the substrate held by the substrate holding unit. The plurality of upstream flow passages include a main upstream flow passage connected to the main discharge port and a plurality of auxiliary upstream flow passages connected to the plurality of auxiliary discharge ports. The plurality of gas discharge ports are respectively disposed at a plurality of positions differing in distance from the rotational axis and discharge a gas of temperature higher than room temperature toward the upper surface of the substrate held by the substrate holding unit. The gas may be an inert gas, such as nitrogen gas, etc., clean air filtered by a filter, or a gas besides the above. The temperature of the gas is preferably lower than a boiling point of the processing liquid on the substrate.

With this arrangement, the supply flow passage guiding the processing liquid branches into the plurality of upstream flow passages. The number of discharge ports can thereby be increased. The processing liquid flowing through the supply flow passage is supplied to the discharge ports via the upstream flow passages and discharged toward the upper surface of the substrate that rotates around the rotational axis. The plurality of discharge ports are respectively disposed at the plurality of positions differing in distance from the rotational axis. The temperature uniformity of the processing liquid on the substrate can thus be increased in comparison to a case where the processing liquid is discharged from just a single discharge port. The processing uniformity can thereby be increased while reducing the consumption amount of the processing liquid.

Further with the present arrangement, the gas discharge ports discharge the gas toward blowing-on positions within the upper surface of the substrate in a state where the upper surface of the substrate is covered with a liquid film of the processing liquid. A discharge pressure of the gas is a pressure such that the blowing-on positions do not become exposed from the processing liquid. The discharged gas is a high temperature gas of higher temperature than room temperature. Therefore, by the supplying of the gas, an improvement can be made in regard to temperature decrease of the processing liquid on the substrate. Further, the plurality of gas discharge ports are respectively disposed at the plurality of positions differing in distance from the rotational axis and the processing liquid on the substrate can thus be heated at the plurality of positions that are separated in a radial direction. The temperature uniformity of the processing liquid can thereby be increased.

In the present preferred embodiment, at least one of the following features may be added to the substrate processing apparatus.

The plurality of discharge ports discharge the processing liquids toward a plurality of liquid landing positions within the upper surface of the substrate held by the substrate holding unit and the plurality of gas discharge ports discharge the gas toward the plurality of blowing-on positions within the upper surface of the substrate held by the substrate holding unit, and the plurality of liquid landing positions and the plurality of blowing-on positions are shifted such that in regard to the radial direction orthogonal to the rotational axis, a blowing-on position is positioned between two adjacent liquid landing positions. The number of discharge ports positioned between two adjacent gas discharge ports may be not less than two (see FIG. 17) or may be one.

With this arrangement, the plurality of liquid landing positions and the plurality of blowing-on positions are not aligned in a circumferential direction (a direction around the rotational axis) but are shifted in the radial direction. The etching amount of the substrate decreases with distance away from a liquid landing position and is the smallest at an intermediate position between two liquid landing positions in the radial direction. Each blowing-on position is a position between two liquid landing positions in the radial direction. Temperature decrease of the processing liquid at a position between two liquid landing positions is thus suppressed or prevented and improvement is achieved in regard to the decrease of the etching amount at this position. The processing uniformity is thereby increased.

The processing liquid supplying system further includes a plurality of downstream flow passages, each of the plurality of auxiliary upstream flow passages is a branching upstream flow passage that branches into a plurality of the downstream flow passages, and each auxiliary discharge port is respectively provided according to each downstream flow passage.

With this arrangement, the flow passages supplying the processing liquids to the plurality of discharge ports are branched into multiple stages. That is, the supply flow passage branches into the plurality of upstream flow passages (first branching) and the branching upstream flow passages, included among the plurality of upstream flow passages, branch into the plurality of downstream flow passages (second branching). The number of discharge ports can thus be increased in comparison to a case where the branching upstream flow passages are not included among the plurality of upstream flow passages. The temperature uniformity of the processing liquid on the substrate can thereby be increased further and the processing uniformity can be increased further.

The substrate processing apparatus further includes a chamber housing the substrate held by the substrate holding unit and the branching upstream flow passages branch into the plurality of downstream flow passages inside the chamber.

With this arrangement, upstream ends of the plurality of downstream flow passages are disposed inside the chamber. The branching upstream flow passages branch into the plurality of downstream flow passages inside the chamber. Each downstream flow passage can thus be reduced in length (length in a direction in which the liquid flows) in comparison to a case where the branching upstream flow passages are branched outside the chamber. Temperature decrease of the processing liquid due to heat transfer from the processing liquid to each downstream flow passage can thereby be suppressed.

The processing liquid supplying system further includes an upstream heater and a plurality of downstream heaters, the upstream heater heats the processing liquid, supplied to the supply flow passage, at an upstream temperature, and the plurality of downstream heaters are respectively connected to the plurality of auxiliary upstream flow passages at positions further upstream than the plurality of auxiliary discharge ports and heat the processing liquids flowing through the plurality of auxiliary upstream flow passages, at downstream temperatures higher than the upstream temperature.

With this arrangement, the processing liquids that have been heated at the downstream temperatures higher than the upstream temperature by the downstream heaters are supplied to the plurality of auxiliary discharge ports from the plurality of auxiliary upstream flow passages and are discharged from the discharge ports. That is, whereas the processing liquid of the upstream temperature is discharged from the main discharge port, the processing liquid of higher temperature than the upstream temperature is discharged from each auxiliary discharge port. The temperatures of the processing liquids supplied to the upper surface of the substrate thus increase stepwise with distance away from the rotational axis and the temperature uniformity of the processing liquid on the substrate can thus be increased in comparison to a case where the processing liquid of the same temperature is discharged from each discharge port. The processing uniformity can thus be increased while reducing the consumption amount of the processing liquid.

The processing liquid supplying system further includes a plurality of return flow passages, a plurality of downstream heaters, and a downstream switching unit, the plurality of return flow passages are respectively connected to the plurality of auxiliary upstream flow passages at positions further upstream than the plurality of auxiliary discharge ports, the plurality of downstream heaters are respectively connected to the plurality of auxiliary upstream flow passages at positions further upstream than the connection positions of the return flow passages and the auxiliary upstream flow passages and heat the processing liquids flowing through the plurality of auxiliary upstream flow passages, and the downstream switching unit switches to any of a plurality of states including a discharging state, in which the processing liquid supplied to the plurality of upstream flow passages from the supply flow passage is supplied to the plurality of discharge ports, and a discharge stoppage state, in which the processing liquid supplied to the plurality of upstream flow passages from the supply flow passage is supplied to the plurality of return flow passages.

With this arrangement, during discharge stoppage, the processing liquid is supplied to the upstream flow passage and heated by the downstream heaters. The processing liquids heated by the downstream heaters are not discharged from the plurality of discharge ports but flow from the upstream flow passages into the return flow passages. A state where the temperatures of the downstream heaters are stable can thus be maintained even during discharge stoppage. The discharge of the processing liquid can thus be restarted immediately.

The processing liquid supplying system further includes a first nozzle and a second nozzle, the plurality of discharge ports include a first discharge port, disposed in the first nozzle, and a second discharge port, disposed in the second nozzle, and are aligned in a plan view in the radial direction orthogonal to the rotational axis, the first nozzle includes a first arm portion extending in a horizontal longitudinal direction and a first tip portion extending downward from a tip of the first arm portion, the second nozzle includes a second arm portion extending in the longitudinal direction and a second tip portion extending downward from a tip of the second arm portion, the first arm portion and the second arm portion are aligned in a horizontal alignment direction orthogonal to the longitudinal direction, and the tip of the first arm portion and the tip of the second arm portion are separated in the longitudinal direction in a plan view such that the tip of the first arm portion is positioned at the rotational axis side.

With this arrangement, the first discharge port and the second discharge port are aligned in a plan view in the radial direction. When a plurality of nozzles of the same length are aligned in the horizontal direction orthogonal to the longitudinal direction so that the plurality of discharge ports are aligned in a plan view in the radial direction, the entirety of the plurality of nozzles increases in width (see FIG. 9). When a plurality of nozzles of different lengths are aligned in a vertical direction so that the plurality of discharge ports are aligned in a plan view in the radial direction, the entirety of the plurality of nozzles increases in height (see FIG. 10A and FIG. 10B).

On the other hand, when the first arm portion and the second arm portion are aligned in the horizontal alignment direction orthogonal to the longitudinal direction and the tip of the first arm portion and the tip of the second arm portion are shifted in the longitudinal direction in a plan view such that the tip of the first arm portion is positioned at the rotational axis side, the plurality of discharge ports can be aligned in the radial direction in a plan view while suppressing both the width and the height of the entirety of the plurality of nozzles (see FIG. 4). The plurality of nozzles and associated members, such as a standby pot, etc., can thereby be made compact.

Another preferred embodiment of the present invention provides a substrate processing apparatus including a substrate holding unit rotating a substrate around a vertical rotational axis passing through a central portion of the substrate while holding the substrate horizontally, and a processing liquid supplying system supplying a processing liquid to the substrate held by the substrate holding unit.

The processing liquid supplying system includes a supply flow passage, a plurality of upstream flow passages, a plurality of discharge ports, a first nozzle, and a second nozzle. The supply flow passage guides the processing liquid toward the plurality of upstream flow passages. The plurality of upstream flow passages branch from the supply flow passage, are respectively connected to the plurality of discharge ports, and guide the processing liquids, supplied from the supply flow passage, toward the plurality of discharge ports. The plurality of discharge ports include a first discharge port, disposed in the first nozzle, and a second discharge port, disposed in the second nozzle, are aligned in a plan view in a radial direction orthogonal to the rotational axis, and respectively discharge the processing liquids, supplied via the plurality of upstream flow passages, toward a plurality of positions within an upper surface of the substrate, including an upper surface central portion of the substrate. The first nozzle includes a first arm portion extending in a horizontal longitudinal direction and a first tip portion extending downward from a tip of the first arm portion. The second nozzle includes a second arm portion extending in the longitudinal direction and a second tip portion extending downward from a tip of the second arm portion. The first arm portion and the second arm portion are aligned in a horizontal alignment direction orthogonal to the longitudinal direction. The tip of the first arm portion and the tip of the second arm portion are separated in the longitudinal direction in a plan view such that the tip of the first arm portion being positioned at the rotational axis side.

With this arrangement, the supply flow passage guiding the processing liquid branches into the plurality of upstream flow passages. The number of discharge ports can thereby be increased. The processing liquid flowing through the supply flow passage is supplied to the discharge ports from the upstream flow passages and discharged toward the upper surface of the substrate that rotates around the rotational axis. The plurality of discharge ports are respectively disposed at the plurality of positions differing in distance from the rotational axis. The temperature uniformity of the processing liquid on the substrate can thus be increased in comparison to a case where the processing liquid is discharged from just a single discharge port. The processing uniformity can thereby be increased while reducing the consumption amount of the processing liquid.

Further with the present arrangement, the plurality of discharge ports are aligned in a plan view in the radial direction. When a plurality of nozzles of the same length are aligned in the horizontal direction orthogonal to the longitudinal direction so that the plurality of discharge ports are aligned in a plan view in the radial direction, the entirety of the plurality of nozzles increases in width (see FIG. 9). When a plurality of nozzles of different lengths are aligned in a vertical direction so that the plurality of discharge ports are aligned in a plan view in the radial direction, the entirety of the plurality of nozzles increases in height (see FIG. 10A and FIG. 10B).

On the other hand, when the first arm portion and the second arm portion are aligned in the horizontal alignment direction orthogonal to the longitudinal direction and the tip of the first arm portion and the tip of the second arm portion are shifted in the longitudinal direction in a plan view such that the tip of the first arm portion is positioned at the rotational axis side, the plurality of discharge ports can be aligned in the radial direction in a plan view while suppressing both the width and the height of the entirety of the plurality of nozzles (see FIG. 4). The plurality of nozzles and associated members, such as a standby pot, etc., can thereby be made compact.

Another preferred embodiment of the present invention provides a substrate processing apparatus including a substrate holding unit rotating a substrate around a vertical rotational axis passing through a central portion of the substrate while holding the substrate horizontally, and a processing liquid supplying system supplying a processing liquid to the substrate held by the substrate holding unit.

The processing liquid supplying system includes a supply flow passage, a plurality of upstream flow passages, a plurality of downstream heaters, a collective flow passage, and a slit discharge port. The supply flow passage branches into the plurality of upstream flow passages and guides the processing liquid toward the plurality of upstream flow passages. The plurality of upstream flow passages include a plurality of auxiliary upstream flow passages having a plurality of auxiliary downstream ends that are aligned in a radial direction orthogonal to the rotational axis in a plan view and a main upstream flow passage having a main downstream end disposed further to the rotational axis side than the plurality of auxiliary downstream ends. The plurality of downstream heaters are respectively connected to the plurality of auxiliary upstream flow passages and heat the processing liquids flowing through the plurality of auxiliary upstream flow passages such that temperatures of the processing liquids supplied to the plurality of auxiliary downstream ends increase with increase of distance from the rotational axis to each auxiliary downstream end. The collective flow passage is connected to the plurality of auxiliary upstream flow passages. The slit discharge port is connected to the collective flow passage at a position further downstream than the plurality of auxiliary upstream flow passages, has a slit shape extending in the radial direction between an upper surface central portion of the substrate and an upper surface peripheral edge portion of the substrate in a plan view, and discharges the processing liquids, supplied from the collective flow passage, toward an upper surface of the substrate. As long as it is connected to two or more of the auxiliary upstream flow passages, the collective flow passage does not have to be connected to all of the auxiliary upstream flow passages.

With this arrangement, the processing liquid is supplied from the supply flow passage to the plurality of upstream flow passages. The processing liquid supplied to the plurality of auxiliary upstream flow passages, included among the plurality of upstream flow passages, is heated by the plurality of downstream heaters. The processing liquids heated by the plurality of downstream heaters are supplied from the plurality of auxiliary upstream flow passages to the collective flow passage and discharged from the slit discharge port toward the upper surface of the substrate. A band-shaped liquid film extending in the radial direction between the upper surface central portion of the substrate and the upper surface peripheral edge portion of the substrate is thereby formed between the slit discharge port and the substrate and lands on a rectilinear region within the upper surface of the substrate.

When processing liquids are discharged toward the upper surface of the substrate from a plurality of discharge ports that are aligned in the radial direction, the processing liquids land on a plurality of liquid landing positions (positions at which the processing liquids first contact the substrate) that are separated in the radial direction. If the processing liquid is an etching liquid, an etching rate (etching amount of the substrate per unit time) at a liquid landing position will be higher than an etching rate at a position between two adjacent liquid landing positions. The processing uniformity is thus decreased. Such decrease of uniformity can thus be prevented by making the processing liquids, discharged from the slit discharge port, land on the rectilinear region that is continuous in the radial direction.

Also, the temperatures of the processing liquids supplied to the plurality of auxiliary downstream ends of the plurality of auxiliary upstream flow passages increase with the increase of distance from the rotational axis to the auxiliary downstream ends. The processing liquids of the same or substantially the same temperatures as the processing liquids supplied to the plurality of auxiliary downstream ends land on positions directly below the plurality of auxiliary downstream ends. On the other hand, a mixed liquid of processing liquids, supplied to two of the plurality of auxiliary downstream ends that are adjacent to each other, lands at each position between the directly-below positions. That is, processing liquids that mutually differ in temperature are supplied to two of the plurality of auxiliary downstream ends that are adjacent to each other, and a processing liquid of a temperature between the two temperatures lands on a position between the directly-below positions.

The temperature of the processing liquid at each position of the slit discharge port thus increases stepwise or continuously with distance from the rotational axis and the temperature uniformity of the processing liquid on the substrate can thus be increased in comparison to a case where a processing liquid of uniform temperature is discharged from the slit discharge port. The processing uniformity can thereby be increased further. Therefore in comparison to a case where a processing liquid is made to land on just the upper surface central portion of the substrate, the processing uniformity can be increased while reducing the consumption amount of the processing liquid supplied to the substrate.

Also, in substrate processing, it is important, in terms of improvement of processing uniformity, that the processing liquid of the same quality is supplied to each portion of the substrate. If a tank and a filter, etc., are provided for each upstream flow passage, the processing liquid supplied to a certain upstream flow passage may differ in quality from the processing liquid supplied to another upstream flow passage. On the other hand, with the present preferred embodiment, the processing liquid in the same flow passage (supply flow passage) is supplied to the respective upstream flow passages. The processing liquids of the same quality can thereby be supplied to each portion of the substrate. Further, in comparison to an arrangement where a tank and a filter, etc., are provided according to each upstream flow passage, the number of parts can be reduced and maintenance work can be simplified.

In the present preferred embodiment, at least one of the following features may be added to the substrate processing apparatus.

The slit discharge port extends in a radial direction, in a plan view, from the upper surface central portion of the substrate to the upper surface peripheral edge portion of the substrate.

With this arrangement, the slit discharge port overlaps, in a plan view, with the upper surface central portion and the upper surface peripheral edge portion of the substrate. The processing liquids discharged from the slit discharge port land at the same time on the rectilinear region that includes the upper surface central portion and the upper surface peripheral edge portion of the substrate. The slit discharge port discharges the processing liquids toward the upper surface of the rotating substrate. A relative positional relationship of the substrate and the rectilinear region changes due to the rotation of the substrate. The processing liquids are thereby made to land on the entire upper surface of the substrate and the processing uniformity can thus be increased.

In a plan view, a width of the slit discharge port is less than a width of the auxiliary downstream ends of the auxiliary upstream flow passages, that is, for example, is less than a maximum value of the widths of the auxiliary downstream ends. The "width" means a length in a horizontal direction orthogonal to the radial direction (longitudinal direction of the slit discharge port).

With this arrangement, the width of the slit discharge port is narrow and therefore a portion of the processing liquid supplied to an auxiliary upstream flow passage spreads in the longitudinal direction within the collective flow passage before arriving at the slit discharge port while the remaining portion of the processing liquid supplied to the auxiliary upstream flow passage arrives at the slit discharge port without spreading in the longitudinal direction of the slit discharge port within the collective flow passage. A portion of the processing liquid is thus mixed with the processing liquid supplied to another auxiliary upstream flow passage in an interior of the collective passage or in a space between the substrate and the slit discharge port. The temperatures of the processing liquids supplied to the substrate can thereby be increased stepwise or continuously with distance away from the rotational axis.

A width of a downstream end of the collective flow passage is equal to the width of the slit discharge port. Preferably, a width of an upstream end of the collective flow passage is not less than a width of the auxiliary downstream ends. The width of the collective flow passage may decrease continuously or decrease stepwise from the upstream end to the downstream end. If the width of the upstream end of the collective flow passage is not less than the width of auxiliary downstream ends, the flow of the processing liquid within the collective flow passage is unlikely to be obstructed at the upstream end of the collective flow passage. Pressure decrease of the processing liquid discharged from the slit discharge port can thus be reduced in comparison to a case where the width of the upstream end of the collective flow passage is less than the width of auxiliary downstream ends.

The processing liquid supplying system further includes a plurality of return flow passages and a downstream switching unit, the plurality of return flow passages are respectively connected to the plurality of auxiliary upstream flow passages at positions further downstream than the plurality of downstream heaters, and the downstream switching unit switches to any of a plurality of states including a discharging state, in which the processing liquid supplied to the plurality of upstream flow passages from the supply flow passage is supplied to the slit discharge port, and a discharge stoppage state, in which the processing liquid supplied to the plurality of upstream flow passages from the supply flow passage is supplied to the plurality of return flow passages.

With this arrangement, during discharge stoppage, the processing liquid is supplied to the upstream flow passage and heated by the downstream heaters. The processing liquids heated by the downstream heaters are not discharged from the slit discharge port but flow from the upstream flow passages into the return flow passages. A state where the temperatures of the downstream heaters are stable can thus be maintained even during discharge stoppage. The discharge of the processing liquid can thus be restarted immediately.

The above and other elements, features, steps, characteristics and advantages of the present invention will become more apparent from the following detailed description of the preferred embodiments with reference to the attached drawings.

DETAILED DESCRIPTION OF PREFERRED EMBODIMENTS

Figure 1:
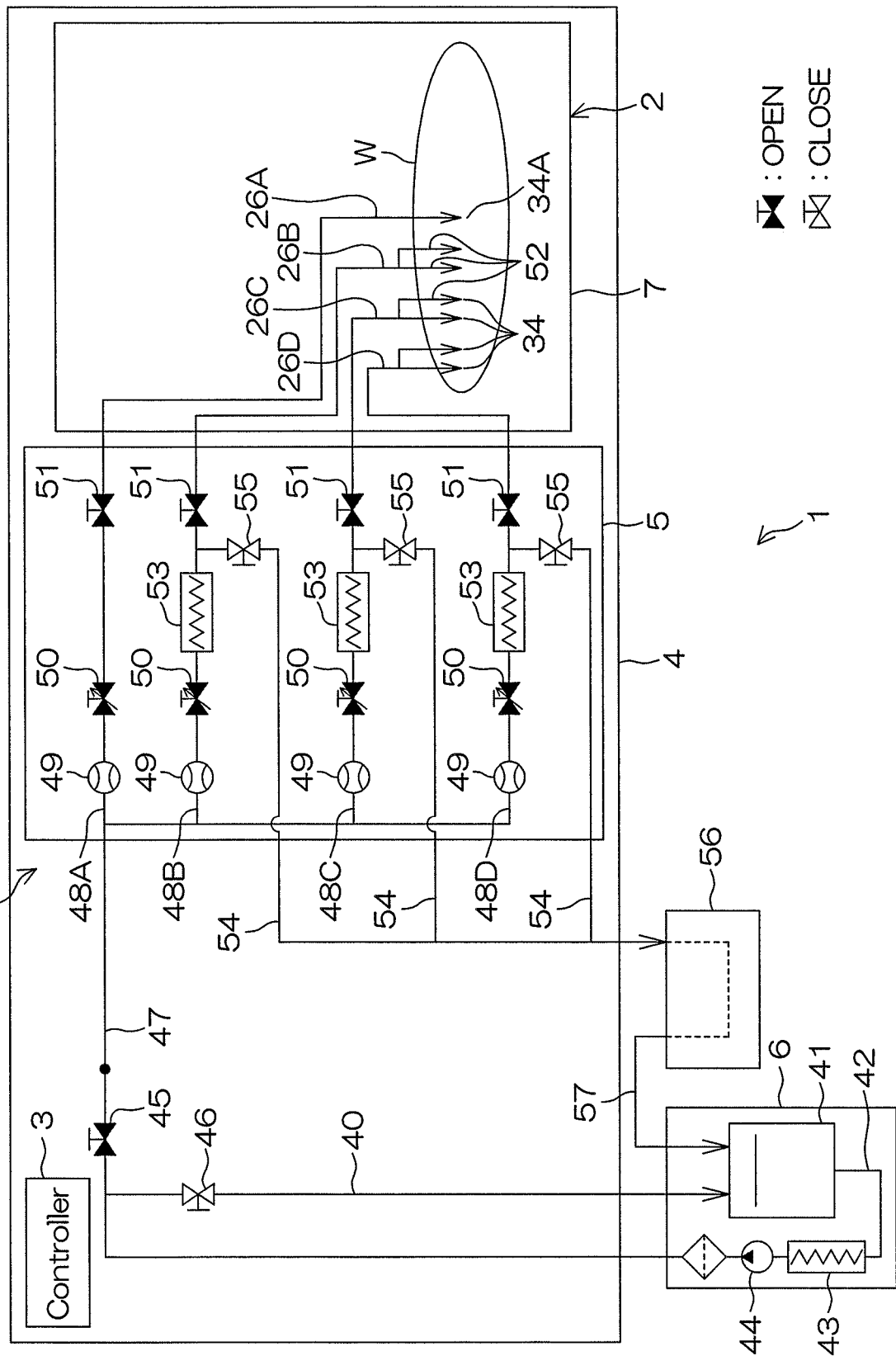
FIG. 1 is a schematic view of a processing liquid supplying system of a substrate processing apparatus according to a first preferred embodiment of the present invention and shows the processing liquid supplying system in a discharging state.
Figure 2:
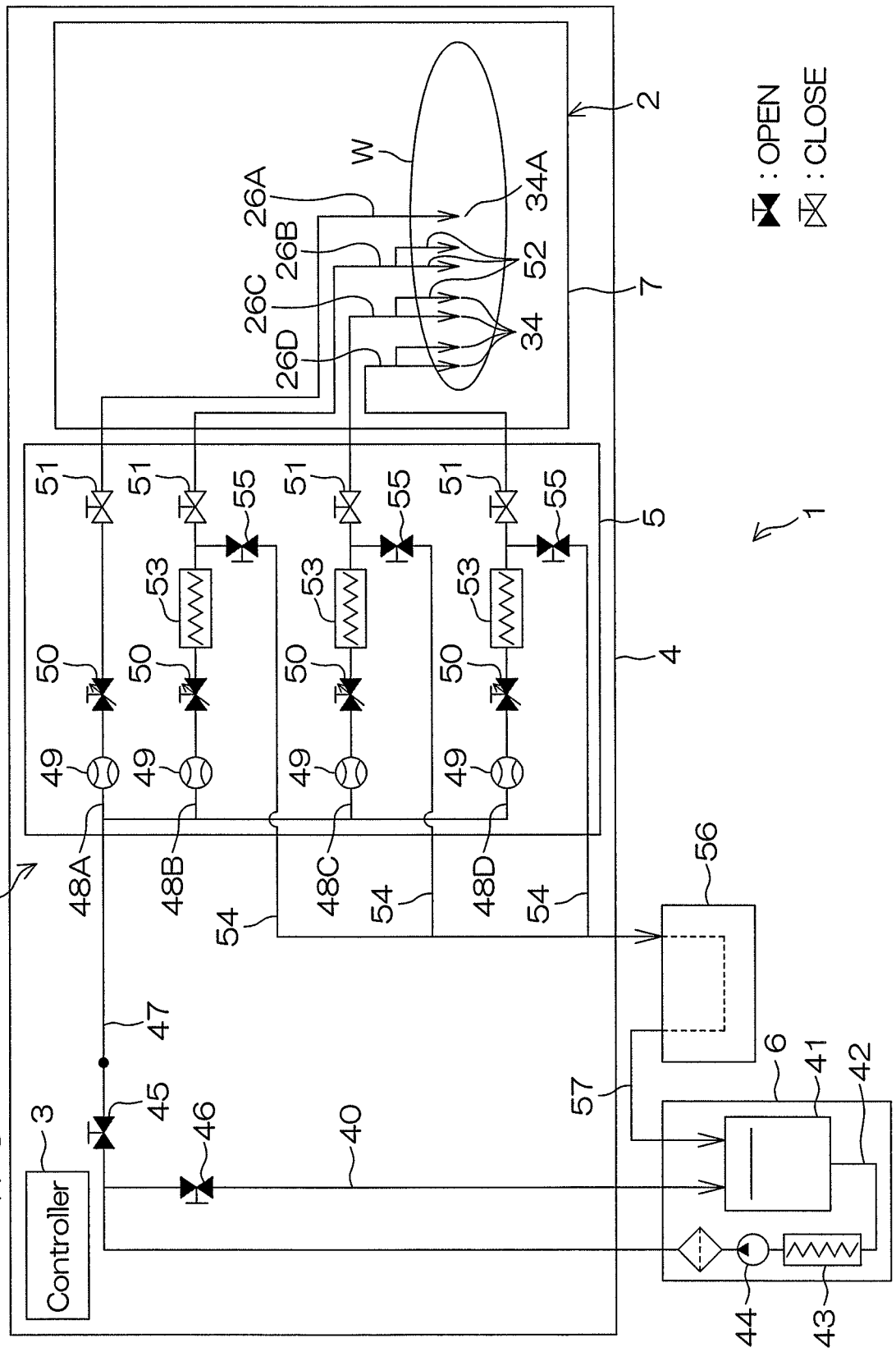
FIG. 2 is a schematic view of a processing liquid supplying system of the substrate processing apparatus according to the first preferred embodiment of the present invention and shows the processing liquid supplying system in a discharge stoppage state.

FIG. 1 and FIG. 2 are schematic views of a processing liquid supplying system of a substrate processing apparatus 1 according to a preferred embodiment of the present invention. FIG. 1 shows the processing liquid supplying system in a discharging state and FIG. 2 shows the processing liquid supplying system in a discharge stoppage state.

The substrate processing apparatus 1 is a single substrate processing type apparatus that processes a disk-shaped substrate W, such as a semiconductor wafer, etc., one by one. The substrate processing apparatus 1 includes a processing unit 2 that processes the substrate W with a processing liquid, a transfer robot (not shown) that conveys the substrate W to the processing unit 2, and a controller 3 that controls the substrate processing apparatus 1. The controller 3 is a computer that includes a computing portion and a storage portion.

The substrate processing apparatus 1 includes a plurality of fluid boxes 5, each housing fluid devices including a valve 51 that controls supplying of the processing liquid to the processing unit 2 and its stoppage, and a plurality of storage boxes 6, each housing a tank 41 storing the processing liquid to be supplied to the processing unit 2 via the fluid boxes 5. The processing unit 2 and the fluid boxes 5 are disposed inside a frame 4 of the substrate processing apparatus 1. A chamber 7 of the processing unit 2 and the fluid boxes 5 are aligned in a horizontal direction. The storage boxes 6 are disposed outside the frame 4. The storages boxes 6 may be disposed inside the frame 4.

Figure 3:
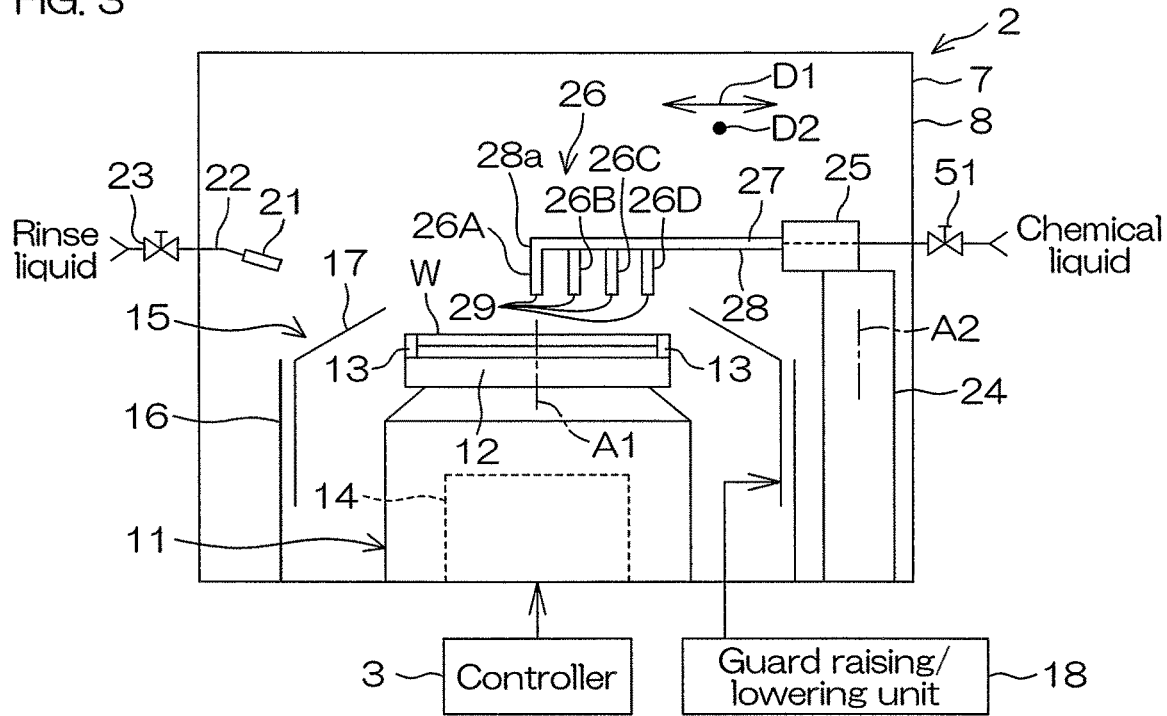
FIG. 3 is a schematic front view of an interior of a processing unit included in the substrate processing apparatus.
Figure 4:
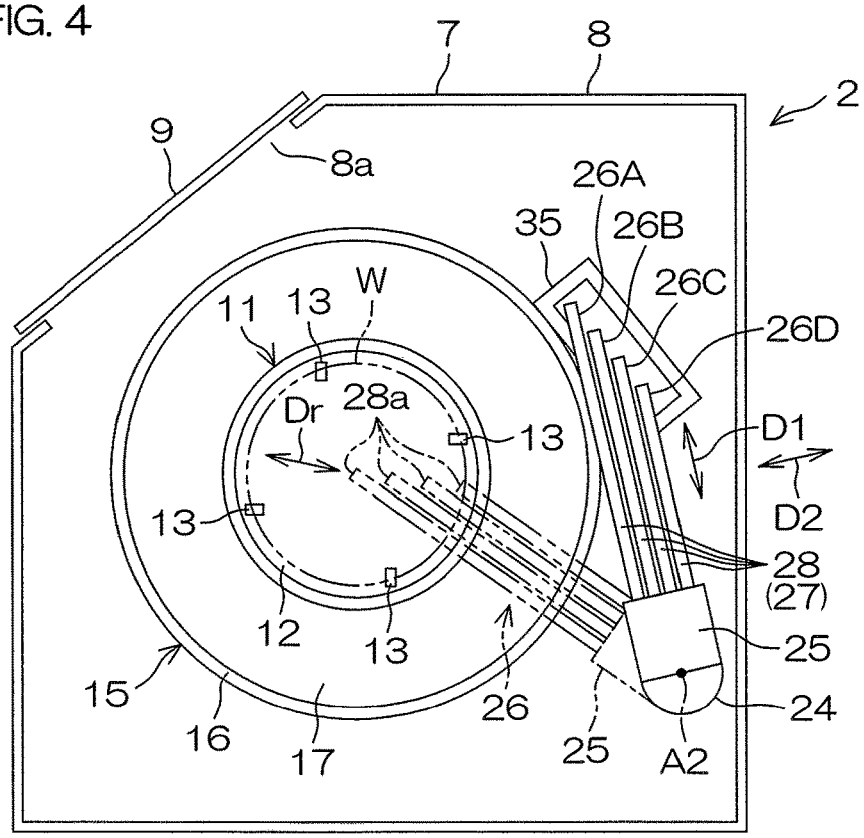
FIG. 4 is a schematic plan view of the interior of the processing unit included in the substrate processing apparatus.

FIG. 3 is a schematic front view of an interior of the processing unit 2. FIG. 4 is a schematic plan view of the interior of the processing unit 2.

As shown in FIG. 3, the processing unit 2 includes a box-shaped chamber 7, a spin chuck 11 rotating the substrate W around a vertical rotational axis A1 passing through a central portion of the substrate W while holding the substrate W horizontally inside the chamber 7, and a cylindrical cup 15 receiving the processing liquid expelled from the substrate W.

As shown in FIG. 4, the chamber 7 includes a box-shaped partition wall 8, provided with a carry-in/carry-out port 8a through which the substrate W passes, and a shutter 9 that opens and closes the carry-in/carry-out port 8a. The shutter 9 is movable with respect to the partition wall 8 between an open position at which the carry-in/carry-out port 8a is open and a closed position (position shown in FIG. 4) at which the carry-in/carry-out port 8a is closed. The unillustrated transfer robot carries the substrate W into the chamber 7 through the carry-in/carry-out port 8a and carries out the substrate W from the chamber 7 through the carry-in/carry-out port 8a.

As shown in FIG. 3, the spin chuck 11 includes a disk-shaped spin base 12 that is held in a horizontal orientation, a plurality of chuck pins 13 that hold the substrate W in a horizontal orientation above the spin base 12, and a spin motor 14 that rotates the plurality of chuck pins 13 to rotate the substrate W around a rotational axis A1. The spin chuck 11 is not restricted to a clamping type chuck in which the plurality of chuck pins 13 are brought into contact with a peripheral end surface of the substrate W, and may be a vacuum type chuck in which a rear surface (lower surface) of the substrate W that is a non-device forming surface is suctioned onto an upper surface of the spin base 12 to hold the substrate horizontally.

As shown in FIG. 3, the cup 15 includes a cylindrical splash guard 17 that surrounds the spin chuck 11 around the rotational axis A1 and a circular cylindrical outer wall 16 surrounding the splash guard 17 around the rotational axis A1. The processing unit 2 includes a guard raising/lowering unit 18 that raises and lowers the splash guard 17 vertically between an upper position (position shown in FIG. 3) at which an upper end of the splash guard 17 is positioned higher than a position at which the spin chuck 11 holds the substrate W and a lower position at which the upper end of the splash guard 17 is positioned lower than the position at which the spin chuck 11 holds the substrate W.

As shown in FIG. 3, the processing unit 2 includes a rinse liquid nozzle 21 that discharges a rinse liquid downward toward an upper surface of the substrate W held by the spin chuck 11. The rinse liquid nozzle 21 is connected to a rinse liquid piping 22 in which a rinse liquid valve 23 is interposed. The processing unit 2 may include a nozzle moving unit that moves the rinse liquid nozzle 21 between a processing position and a standby position.

When the rinse liquid valve 23 is opened, the rinse liquid is supplied from the rinse liquid piping 22 to the rinse liquid nozzle 21 and discharged from the rinse liquid nozzle 21. The rinse liquid is, for example, pure water (deionized water). The rinse liquid is not restricted to pure water and may instead be any of carbonated water, electrolyzed ion water, hydrogen water, ozone water, or aqueous hydrochloric acid solution of dilute concentration (of, for example, approximately 10 to 100 ppm), etc.

As shown in FIG. 4, the processing unit 2 includes a plurality of nozzles 26 (first nozzle 26A, second nozzle 26B, third nozzle 26C, and fourth nozzle 26D) that discharge chemical liquids downward, a holder 25 that holds each of the plurality of nozzles 26, and a nozzle moving unit 24 that moves the holder 25 to move the plurality of nozzles 26 between a processing position (position indicated by alternate long and two short dashes lines in FIG. 4) and a standby position (position indicated by solid lines in FIG. 4).

Representative examples of the chemical liquid include etching liquids, such as TMAH (tetramethylammonium hydroxide aqueous solution), etc., and resist removing liquids, such as SPM (sulfuric acid/hydrogen peroxide mixture), etc. The chemical liquid is not restricted to TMAH and SPM, and may be a liquid containing at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali besides TMAH, a surfactant, and a corrosion inhibitor.

As shown in FIG. 3, each of the nozzles 26 includes a main nozzle body 27 that is cantilevered by the holder 25. The main nozzle body 27 includes an arm portion 28 extending in a horizontal longitudinal direction D1 from the holder 25 and a tip portion 29 extending downward from a tip 28a of the arm portion 28. The tip 28a of the arm portion 28 means a portion disposed furthest in the longitudinal direction D1 from the holder 25 in a plan view.

As shown in FIG. 4, the plurality of arm portions 28 are aligned in a horizontal alignment direction D2, orthogonal to the longitudinal direction D1, in the order of the first nozzle 26A to the fourth nozzle 26D. The plurality of arm portions 28 are disposed at the same height. An interval between two arm portions 28 that are adjacent in the alignment direction D2 may be the same as any of the other intervals or may differ from at least one of the other intervals. FIG. 4 shows an example where the plurality of arm portions 28 are disposed at equal intervals.

Lengths of the plurality of arm portions 28 in the longitudinal direction D1 decrease in the order of the first nozzle 26A to the fourth nozzle 26D. Tips of the plurality of nozzles 26 (the tips 28a of the plurality of arm portions 28) are shifted in the longitudinal direction D1 so as to be aligned in the order of the first nozzle 26A to the fourth nozzle 26D in regard to the longitudinal direction D1. The tips of the plurality of nozzles 26 are aligned rectilinearly in a plan view.

The nozzle moving unit 24 makes the holder 25 pivot around a nozzle pivoting axis A2 extending vertically at a periphery of the cup 15 to move the plurality of nozzles 26 along an arcuate path passing the substrate W in a plan view. The plurality of nozzles 26 are thereby moved horizontally between the processing position and the standby position. The processing unit 2 includes a bottomed cylindrical standby pot 35 that is disposed below the standby position of the plurality of nozzles 26. The standby pot 35 is disposed at a periphery of the cup 15 in a plan view.

The processing position is a position at which the chemical liquids discharged from the plurality of nozzles 26 land on the upper surface of the substrate W. At the processing position, the plurality of nozzles 26 and the substrate W overlap in a plan view and the tips of the plurality of nozzles 26 are aligned in a radial direction Dr in the order of the first nozzle 26A to the fourth nozzle 26D from the rotational axis A1 side. In this state, the tip of the first nozzle 26A overlaps with a central portion of the substrate W in a plan view and the tip of the fourth nozzle 26D overlaps with a peripheral edge portion of the substrate W in a plan view.

The standby position is a position to which the plurality of nozzles 26 are retracted so that the plurality of nozzles 26 and the substrate W do not overlap in a plan view. At the standby position, the tips of the plurality of nozzles 26, in a plan view, are positioned outside the cup 15 and along an outer circumferential surface of the cup 15 (outer circumferential surface of the outer wall 16) and are aligned in a circumferential direction (direction around the rotational axis A1) in the order of the first nozzle 26A to the fourth nozzle 26D. The plurality of nozzles 26 are disposed so as to move away from the rotational axis A1 in the order of the first nozzle 26A to the fourth nozzle 26D.

The plurality of nozzles 26 shall now be described with reference to FIG. 5 and FIG. 6. Thereafter, the processing liquid supplying system shall be described.

In the following description, "first" and "A" may be added to the beginning and the end of an arrangement corresponding to the first nozzle 26A. For example, an upstream flow passage 48 associated with the first nozzle 26A may be referred to as the "first upstream flow passage 48A." The same applies to arrangements associated with the second nozzle 26B to the fourth nozzle 26D.

Also in the following description, a temperature at which the processing liquid is heated by an upstream heater 43 may be referred to as the "upstream temperature" and a temperature at which the processing liquid is heated by a downstream heater 53 may be referred to as the "downstream temperature." Temperatures at which the processing liquids are heated by a second downstream heater 53 to a fourth downstream heater 53 may be referred to respectively as the "second downstream temperature" to the "fourth heating temperature."

Figure 5:
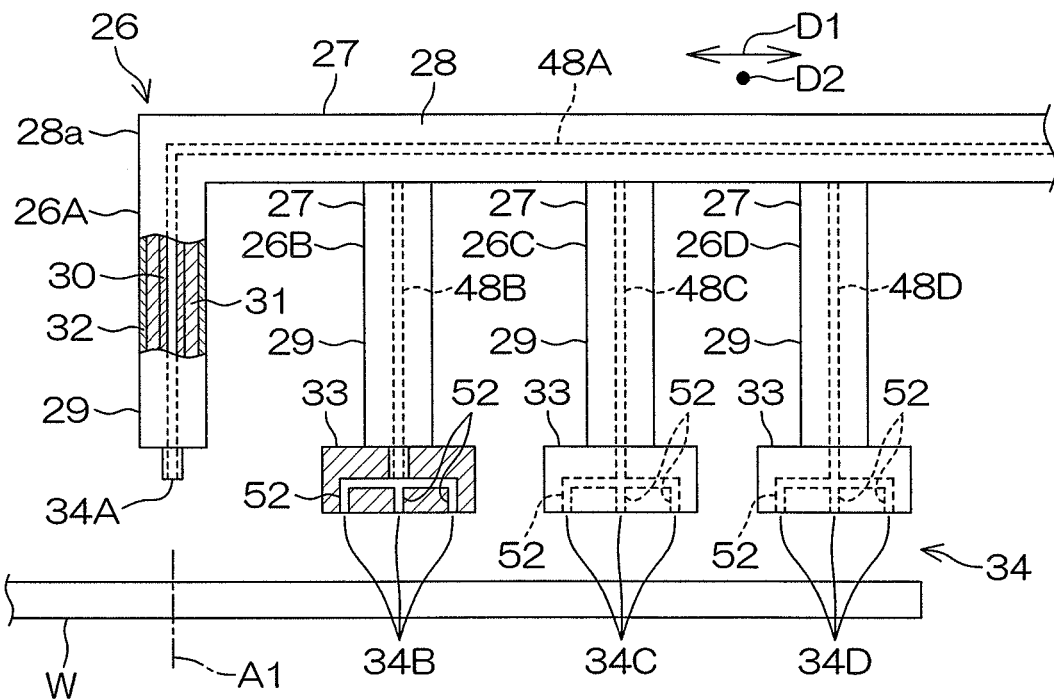
FIG. 5 is a schematic front view of a plurality of nozzles.

As shown in FIG. 5, each main nozzle body 27 includes a resin tube 30 that guides the processing liquid, a core bar 31 including cylindrical cross section that surrounds the resin tube 30, and a resin coating 32 including cylindrical cross section that surrounds an outer surface of the core bar 31. Each of the nozzles 26 besides the first nozzle 26A further includes a nozzle head 33 mounted on the tip portion 29 of the main nozzle body 27.

Each main nozzle body 27 defines a single flow passage extending along the main nozzle body 27. Each nozzle head 33 defines a plurality of flow passages guiding the processing liquid supplied from the main nozzle body 27. The flow passage of the main nozzle body 27 defines a discharge port 34 opening at an outer surface of the main nozzle body 27. The plurality of flow passages of the nozzle head 33 define a plurality of discharge ports 34 opening at an outer surface of the nozzle head 33. The flow passage of the main nozzle body 27 corresponds to a portion of an upstream flow passage 48 to be described below. Each of the flow passages of the nozzle head 33 corresponds to a downstream flow passage 52 to be described below. Downstream ends of the first upstream flow passage 48A to the fourth upstream flow passage 48D are respectively disposed at a plurality of positions differing in distance from the rotational axis A1.

Figure 6:
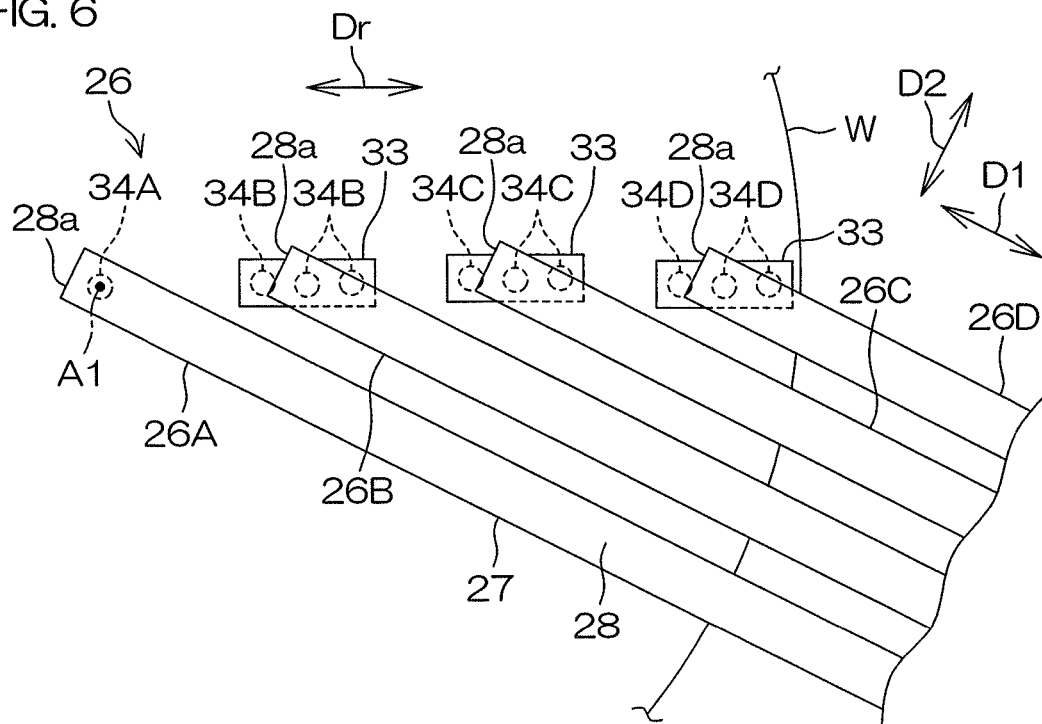
FIG. 6 is a schematic plan view of the plurality of nozzles.

FIG. 5 and FIG. 6 show an example where the total number of discharge ports 34 disposed in the plurality of nozzles 26 is ten. The first nozzle 26A includes a single discharge port 34 disposed in the main nozzle body 27. Each of the nozzles 26 besides the first nozzle 26A includes three discharge ports 34 disposed in the nozzle head 33. The three discharge ports 34 disposed in the same nozzle head 33 are constituted of an inner discharge port that is closest to the rotational axis A1 among the three discharge ports 34, an outer discharge port that is furthest from the rotational axis A1 among the three discharge ports 34, and a middle discharge port disposed between the inner discharge port and the outer discharge port.

As shown in FIG. 6, the plurality of discharge ports 34 are aligned rectilinearly in a plan view. An interval between the two discharge ports 34 at the respective ends is not more than a radius of the substrate W. An interval between two discharge ports 34 that are adjacent may be the same as any of the other intervals or may differ from at least one of the other intervals. Also, the plurality of discharge ports 34 may be disposed at the same height or maybe disposed at two or more different heights.

When the plurality of nozzles 26 are disposed at the processing position, the plurality of discharge ports 34 are respectively disposed at a plurality of positions that differ in distance (shortest distance in a plan view) from the rotational axis A1. In this state, an innermost discharge port (first discharge port 34A) that is closest to the rotational axis A1 among the plurality of discharge ports 34 is disposed above a central portion of the substrate W, and an outermost discharge port (fourth discharge port 34D) that is furthest from the rotational axis A1 among the plurality of discharge ports 34 is disposed above a peripheral edge portion of the substrate W, The plurality of discharge ports 34 are aligned in the radial direction Dr in a plan view.

The first discharge port 34A disposed in the first nozzle 26A is a main discharge port that discharges the processing liquid toward an upper surface central portion of the substrate W. The second discharge port 34B to the fourth discharge port 34D that are disposed in the respective nozzles 26 besides the first nozzle 26A are a plurality of auxiliary discharge ports that discharge the processing liquids toward a portion of the upper surface of the substrate W besides the central portion. The first upstream flow passage 48A connected to the first discharge port 34A is a main upstream flow passage and the second upstream flow passage 48B to the fourth upstream flow passage 48D that are connected to the second discharge port 34B to the fourth discharge port 34D are a plurality of auxiliary upstream flow passages.

As shown in FIG. 5, each discharge port 34 discharges the chemical liquid in a discharge direction perpendicular to the upper surface of the substrate W. The plurality of discharge ports 34 discharge the chemical liquids toward a plurality of liquid landing positions within the upper surface of the substrate W. The plurality of liquid landing positions are separate positions that differ in distance from the rotational axis A1. If the liquid landing position that is closest to the rotational axis A1 among the plurality of liquid landing positions is referred to as the "first liquid landing position" and the liquid landing position that is second closest to the rotational axis A1 among the plurality of liquid landing positions is referred to as the "second liquid landing position," the chemical liquid discharged from the first discharge port 34A lands on the first liquid landing position and the chemical liquid discharged from the second discharge port 34B lands on the second liquid landing position.

The processing liquid supplying system shall now be described in detail with reference to FIG. 1 and FIG. 2.

The processing liquid supplying system includes a chemical liquid tank 41 storing the chemical liquid, a chemical liquid flow passage 42 guiding the chemical liquid fed from chemical liquid tank 41, an upstream heater 43 heating the chemical liquid flowing inside the chemical liquid flow passage 42 at the upstream temperature higher than room temperature (for example, of 20 to 30° C.) to adjust the temperature of the chemical liquid inside the chemical liquid tank 41, a pump 44 feeding the chemical liquid inside the chemical liquid tank 41 to the chemical liquid flow passage 42, and a circulation flow passage 40 returning the chemical liquid inside the chemical liquid flow passage 42 to the chemical liquid tank 41.

The processing liquid supplying system includes a supply valve 45 that opens and closes the chemical liquid flow passage 42, a circulation valve 46 that opens and closes the circulation flow passage 40, and a supply flow passage 47 connected to the chemical liquid flow passage 42. An upstream switching unit includes the supply valve 45.

The processing liquid supplying system includes the plurality of upstream flow passages 48 guiding the liquid supplied from the supply flow passage 47 to the plurality of discharge ports 34, a plurality of flowmeters 49 detecting flow rates of the liquids flowing inside the plurality of upstream flow passages 48, a plurality of flow control valves 50 that change the flow rates of the liquids flowing inside the plurality of upstream flow passages 48, and a plurality of discharge valves 51 respectively opening and closing the plurality of upstream flow passages 48. Although unillustrated, each flow control valve 50 includes a main valve body that opens and closes the flow passage and an actuator that changes an open degree of the main valve body. The actuator may be a pneumatic actuator or an electric actuator or an actuator besides these.

The processing liquid supplying system includes the plurality of downstream flow passages 52 that guide the liquids supplied from the upstream flow passages 48 to the plurality of discharge ports 34. The downstream end of each of the upstream flow passages 48 besides the first upstream flow passage 48A branches into a plurality of downstream flow passage 52. That is, each of the upstream flow passages 48 besides the first upstream flow passage 48A is a branching upstream flow passage that branches into a plurality of downstream flow passage 52.

FIG. 1 and FIG. 2 show an example where each branching upstream flow passage branches into two downstream flow passages 52. FIG. 5 shows an example where each branching upstream flow passage branches into three downstream flow passages 52. The three downstream flow passages 52 branching from the second upstream flow passage 48B are respectively connected to the three discharge ports 34 (the inner discharge port, middle discharge port, and the outer discharge port) disposed in the same nozzle head 33. The same as the second upstream flow passage 48B applies to the third upstream flow passage 48C and the fourth upstream flow passage 48D. The first upstream flow passage 48A is connected to the first discharge port 34A disposed in the first nozzle 26A.

The processing liquid supplying system includes a plurality of downstream heaters 53 that heat the liquids flowing inside the plurality of upstream flow passages 48 besides the first upstream flow passage 48A at downstream temperatures higher than the upstream temperature. The processing liquid supplying system further includes a plurality of return flow passages 54, respectively connected to the plurality of upstream flow passages 48 besides the first upstream flow passage 48A at positions further downstream than the plurality of downstream heaters 53, and a plurality of return valves 55, respectively opening and closing the plurality of return flow passages 54. A downstream switching unit includes the plurality of discharge valves 51 and the plurality of return valves 55.

The processing liquid supplying system includes a cooler 56 cooling the chemical liquids supplied from the plurality of return flow passages 54 and a tank recovery flow passage 57 guiding the chemical liquid from the cooler 56 to the chemical liquid tank 41. The chemical liquids supplied from the plurality of return flow passage 54 to the cooler 56 are made closer in temperature to the upstream temperature by the cooler 56 and thereafter guided via the tank recovery flow passage 57 to the chemical liquid tank 41. The cooler 56 may be a water cooled unit or an air cooled unit or may be a cooling unit other than these.

The processing liquid supplying system in a discharging state in which the chemical liquids are discharged from the plurality of discharge ports 34 shall now be described with reference to FIG. 1. In FIG. 1, an open valve is indicated in black and a closed valve is indicated in white.

The chemical liquid inside the chemical liquid tank 41 is fed to the chemical liquid flow passage 42 by the pump 44. The chemical liquid fed by the pump 44 is heated by the upstream heater 43 and thereafter flows from the chemical liquid flow passage 42 to the supply flow passage 47 and flows to the plurality of upstream flow passages 48 from the supply flow passage 47. The chemical liquids supplied to the plurality of branching upstream flow passages, i.e. the plurality of upstream flow passages 48 besides the first upstream flow passage 48A are heated by the downstream heaters 53 and thereafter flow to the plurality of downstream flow passage 52.

The chemical liquid inside the first upstream flow passage 48A is supplied to the single first discharge port 34A disposed in the first nozzle 26A. The chemical liquid inside the second upstream flow passage 48B is supplied via the plurality of downstream flow passages 52 to the plurality of second discharge ports 34B disposed in the second nozzle 26B. The same as the second upstream flow passage 48B applies to the third upstream flow passage 48C and the fourth upstream flow passage 48D. The chemical liquids are thereby discharged from all discharge ports 34.

The heating temperatures (downstream temperatures) of the processing liquids by the downstream heaters 53 are higher than the heating temperature (upstream temperature) of the processing liquid by the upstream heater 43. The second to fourth downstream temperatures increase in the order of the second to the fourth downstream temperatures. The first discharge port 34A discharges the chemical liquid of the upstream temperature. Each of the second discharge ports 34B discharges the chemical liquid of the second downstream temperature. Each of the third discharge ports 34C discharges the chemical liquid of the third downstream temperature. Each of the fourth discharge ports 34D discharges the chemical liquid of the fourth downstream temperature. The temperatures of the chemical liquids discharged from the plurality of discharge ports 34 thus increase stepwise with distance away from the rotational axis A1.

The processing liquid supplying system in a discharge stoppage state in which the discharges of chemical liquids from the plurality of discharge ports 34 are stopped shall now be described with reference to FIG. 2. In FIG. 2, an open valve is indicated in black and a closed valve is indicated in white.

The chemical liquid inside the chemical liquid tank 41 is fed to the chemical liquid flow passage 42 by the pump 44. A portion of the chemical liquid fed by the pump 44 is heated by the upstream heater 43 and thereafter returned to the chemical liquid tank 41 via the circulation flow passage 40. The remaining portion of the chemical liquid fed by the pump 44 flows from the chemical liquid flow passage 42 to the supply flow passage 47 and flows from the supply flow passage 47 to the plurality of upstream flow passages 48 besides the first upstream flow passage 48A.

The chemical liquid inside the second upstream flow passage 48 is heated by the downstream heater 53 associated with the second upstream flow passage 48B and thereafter flows via the return flow passage 54 to the cooler 56. The same as the second upstream flow passage 48B applies to the third upstream flow passage 48C and the fourth upstream flow passage 48D. The chemical liquids supplied to the cooler 56 are cooled by the cooler 56 and return to the chemical liquid tank 41 via the tank recovery flow passage 57. All of the chemical liquid fed to the chemical liquid flow passage 42 by the pump 44 is thereby returned to the chemical liquid tank 41.

The temperature of the processing liquid may have a large influence on the processing of the substrate W. If the downstream heaters 53 are stopped during discharge stoppage, it will take time for the temperatures of the processing liquids, heated by the downstream heaters 53, to stabilize at the intended temperatures when operation of the downstream heaters 53 is restarted. The discharge of processing liquid thus cannot be restarted immediately and throughput decreases.

As described above, even during discharge stoppage, the chemical liquids flow to the downstream heaters 53 and the downstream heaters 53 heat the chemical liquids. A state where the temperatures of the downstream heaters 53 are stable can thus be maintained. Further, the chemical liquids heated by the downstream heaters 53 are returned to the chemical liquid tank 41 and consumption amount of the chemical liquid can thus be reduced. Moreover, the chemical liquid that is cooled by the cooler 56 is returned to the chemical liquid tank 41 and therefore variation of temperature of the chemical liquid inside the chemical liquid tank 41 can be suppressed.

Figure 7:
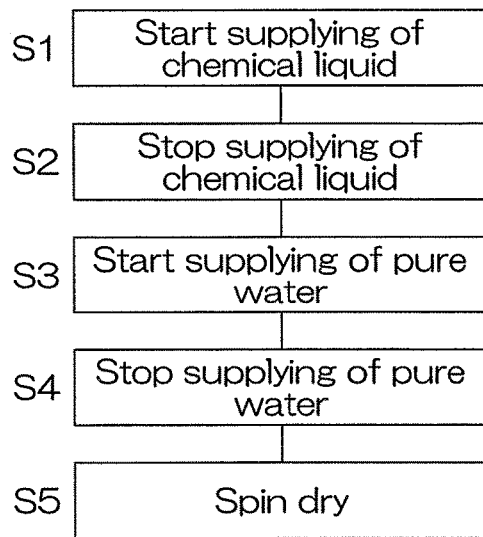
FIG. 7 is a process flowchart for describing an example of substrate processing executed by the substrate processing apparatus.

FIG. 7 is a process flowchart for describing an example of processing of the substrate W executed by the substrate processing apparatus 1. The respective operations described below are executed by the controller 3 controlling the substrate processing apparatus 1. FIG. 3 and FIG. 4 shall be referenced in the following description. FIG. 7 shall be referenced where suitable.

When the substrate W is to be processed by the processing unit 2, the substrate W is carried into the interior of the chamber 7 by a hand (not shown) of the transfer robot in a state where the plurality of nozzles 26 are retracted from above the spin chuck 11 and the splash guard 17 is positioned at the lower position. The substrate W is thereby placed, in a state where the front surface is faced up, on the plurality of chuck pins 13. Thereafter, the hand of the transfer robot is retracted from the interior of the chamber 7 and the carry-in/carry-out port 8a of the chamber 7 is closed by the shutter 9.

After the substrate W has been placed on the plurality of chuck pins 13, the plurality of chuck pins 13 are pressed against peripheral edge portions of the substrate W and the substrate W is gripped by the plurality of chuck pins 13. Also, the guard raising/lowering unit 18 moves the splash guard 17 from the lower position to the upper position. The upper end of the splash guard 17 is thereby disposed higher than the substrate W. Thereafter, the spin motor 14 is driven to start rotation of the substrate W. The substrate W is thereby rotated at a predetermined liquid processing speed (of, for example, several hundred rpm).

Thereafter, the nozzle moving unit 24 moves the plurality of nozzles 26 from the standby position to the processing position. The plurality of discharge ports 34 are thereby overlapped with the substrate W in a plan view. Thereafter, the plurality of discharge valves 51, etc., are controlled and the chemical liquids are discharged at the same time from the plurality of nozzles 26 (step S1 of FIG. 7). The plurality of nozzles 26 discharge the chemical liquids in a state where the nozzle moving unit 24 keeps the plurality of nozzles 26 still. When a predetermined time elapses from the opening of the plurality of discharge valves 51, the discharges of chemical liquids from the plurality of nozzles 26 are stopped at the same time (step S2 of FIG. 7). Thereafter, the nozzle moving unit 24 moves the plurality of nozzles 26 from the processing position to the standby position.

The chemical liquids discharged from the plurality of nozzles 26 land on the upper surface of the rotating substrate W and thereafter flow outward (in the direction away from the rotational axis A1) along the upper surface of the substrate W due to a centrifugal force. The chemical liquid that reaches the upper surface peripheral edge portion of the substrate W is scattered to a periphery of the substrate W and received by an inner peripheral surface of the splash guard 17. The chemical liquid is thereby supplied to the entire upper surface of the substrate W and a liquid film of the chemical liquid that covers the entire upper surface of the substrate W is formed on the substrate W. The entire upper surface of the substrate W is thereby processed by the chemical liquid.

After the discharges of chemical liquids from the plurality of nozzles 26 have been stopped, the rinse liquid valve 23 is opened and discharge of the rinse liquid (pure water) from the rinse liquid nozzle 21 is started (step S3 of FIG. 7). The chemical liquid on the substrate W is thereby rinsed off by the rinse liquid and a liquid film of the rinse liquid that covers the entire upper surface of the substrate W is formed. When a predetermined time elapses from the opening of the rinse liquid valve 23, the rinse liquid valve 23 is closed and the discharge of the rinse liquid from the rinse liquid nozzle 21 is stopped (step S4 of FIG. 7).

After the discharge of the rinse liquid from the rinse liquid nozzle 21 has been stopped, the substrate W is accelerated in the rotational direction by the spin motor 14 and the substrate W is rotated at a drying speed (of, for example, several thousand rpm) higher than the liquid processing speed (step S5 of FIG. 7). The rinse liquid attached to the substrate W is thereby spun off to the periphery of the substrate W and the substrate W is dried. When a predetermined time elapses from the start of high speed rotation of the substrate W, the rotation of the spin motor 14 and the substrate W is stopped.

After the rotation of the substrate W has been stopped, the guard raising/lowering unit 18 moves the splash guard 17 from the upper position to the lower position. Further, the holding of the substrate W by the plurality of chuck pins 13 is released. The transfer robot makes its hand enter the interior of the chamber 7 in the state where the plurality of nozzles 26 are retracted from above the spin chuck 11 and the splash guard 17 is positioned at the lower position. Thereafter, the transfer robot uses the hand to take the substrate W on the spin chuck 11 and carries out the substrate W from the chamber 7.

Figure 8:
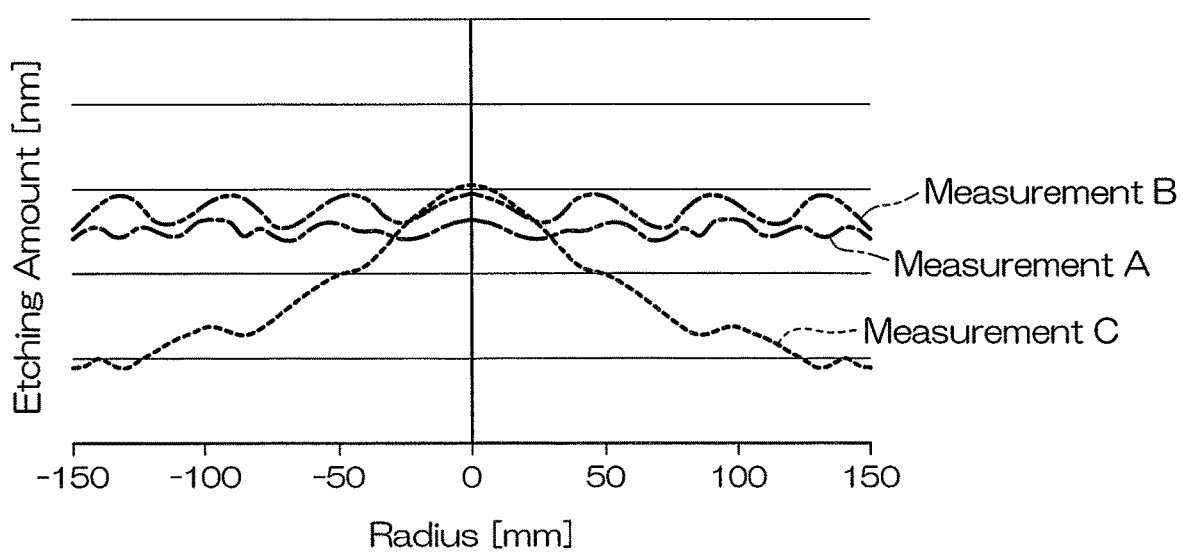
FIG. 8 is a graph of etching amount distributions of substrates.

FIG. 8 is a graph of etching amount distributions of substrates W.

The processing conditions of the substrates W of measurement A to measurement C shown in FIG. 8 are the same with the exception of the nozzles that discharge the chemical liquids.

The measurement A indicates the etching amount distribution when a substrate W is etched by making a plurality of discharge ports 34 (ten discharge ports 34) discharge the chemical liquids while keeping still the plurality of nozzles 26.

The measurement B indicates the etching amount distribution when a substrate W is etched by making a plurality of discharge ports 34 (four discharge ports 34) discharge the chemical liquids while keeping still the plurality of nozzles 26 from which all nozzle heads 33 have been removed. That is, the measurement B indicates the etching amount distribution when the four discharge ports 34 (corresponding to the first discharge port 34A) respectively disposed in the four main nozzle bodies 27 are made to discharge the chemical liquids.

The measurement C indicates the etching amount distribution when just a single discharge port 34 is made to discharge the chemical liquid and the liquid landing position of the chemical liquid is fixed at the upper surface central portion of the substrate W.

With the measurement C, the etching amount decreases with distance away from the central portion of the substrate W and the etching amount distribution exhibits a peak-shaped curve. That is, the etching amount is greatest at the liquid landing position of the chemical liquid and decreases with distance away from the liquid landing position. On the other hand, with the measurement A and the measurement B, the etching amounts at positions besides the central portion of the substrate W are increased and etching uniformity is greatly improved in comparison to the measurement C.

With the measurement B, seven peaks are formed. The apex of the central peak is at a position corresponding to the innermost liquid landing position and the apexes of the two peaks at outer sides thereof are at positions corresponding to the second liquid landing position from the inner side. The positions of the apexes of the two peaks further to the outer sides are positions corresponding to the third liquid landing position from the inner side, and the positions of the two outermost peaks are positions corresponding to the fourth liquid landing position from the inner side.

With the measurement A, a plurality of peaks corresponding to the plurality of liquid landing positions are formed similarly to the measurement B. Whereas with the measurement B, the number of discharge ports 34 is four, with the measurement A, the number of discharge ports 34 is ten and therefore the number of peaks is increased. Further in comparison to the measurement B, the curve indicating the etching amount distribution is closer to a straight line extending in a right/left direction (a straight line of fixed etching amount) and the etching uniformity is improved.

As described above, with the present preferred embodiment, the supply flow passage 47 that guides the processing liquid is branched into the plurality of upstream flow passages 48. The number of discharge ports 34 can thereby be increased. Further, the branching upstream flow passages branching into the plurality of downstream flow passages 52 are included in the plurality of upstream flow passages 48 and the number of discharge ports 34 can thus be increased further.

The processing liquid flowing through the supply flow passage 47 is supplied to the discharge ports 34 from the upstream flow passages 48 or the downstream flow passages 52 and discharged toward the upper surface of the substrate W that rotates around the rotational axis A1. The plurality of discharge ports 34 are respectively disposed at the plurality of positions differing in distance from the rotational axis A1. Temperature uniformity of the processing liquid on the substrate W can thus be increased in comparison to a case where the processing liquid is discharged from just a single discharge port 34. The processing uniformity can thereby be increased while reducing the consumption amount of the processing liquid.

Also with the present preferred embodiment, the processing liquids that have been heated at the downstream temperatures higher than the upstream temperature by the downstream heaters 53 are supplied to the discharge ports 34, besides the innermost discharge port (the first discharge port 34A), from the upstream flow passages 48 besides the innermost upstream flow passage (the first upstream flow passage 48A) and are discharged from the discharge ports 34. That is, whereas the processing liquid of the upstream temperature is discharged from the innermost discharge port, the processing liquid of higher temperature than the upstream temperature is discharged from each of the discharge ports 34 positioned further to the outer side than the innermost discharge port.

The temperatures of the processing liquids supplied to the upper surface of the substrate W thus increase stepwise with distance away from the rotational axis A1 and the temperature uniformity can thus be increased in comparison to a case where the processing liquid of the same temperature is discharged from each discharge port 34. The processing uniformity can thereby be increased while reducing the consumption amount of the processing liquid.

Also with the present preferred embodiment, the upstream ends of the plurality of downstream flow passages 52 are disposed inside the chamber 7. The branching upstream flow passages branch into the plurality of downstream flow passages 52 inside the chamber 7. Each downstream flow passage 52 can thus be reduced in length (length in a direction in which the liquid flows) in comparison to a case where the branching upstream flow passages are branched outside the chamber 7. Temperature decrease of the processing liquid due to heat transfer from the processing liquid to each downstream flow passage 52 can thereby be suppressed.

Also with the present preferred embodiment, the upstream ends of the plurality of upstream flow passages 48 are disposed inside the fluid box 5. The supply flow passage 47 branches into the plurality of upstream flow passages 48 inside the fluid box 5. Each upstream flow passage 48 can thus be reduced in length (length in a direction in which the liquid flows) in comparison to a case where the supply flow passage 47 branches into the plurality of upstream flow passages 48 at a position further upstream than the fluid box 5. Temperature decrease of the processing liquid due to heat transfer from the processing liquid to each upstream flow passage 48 can thereby be suppressed.

Figure 9:
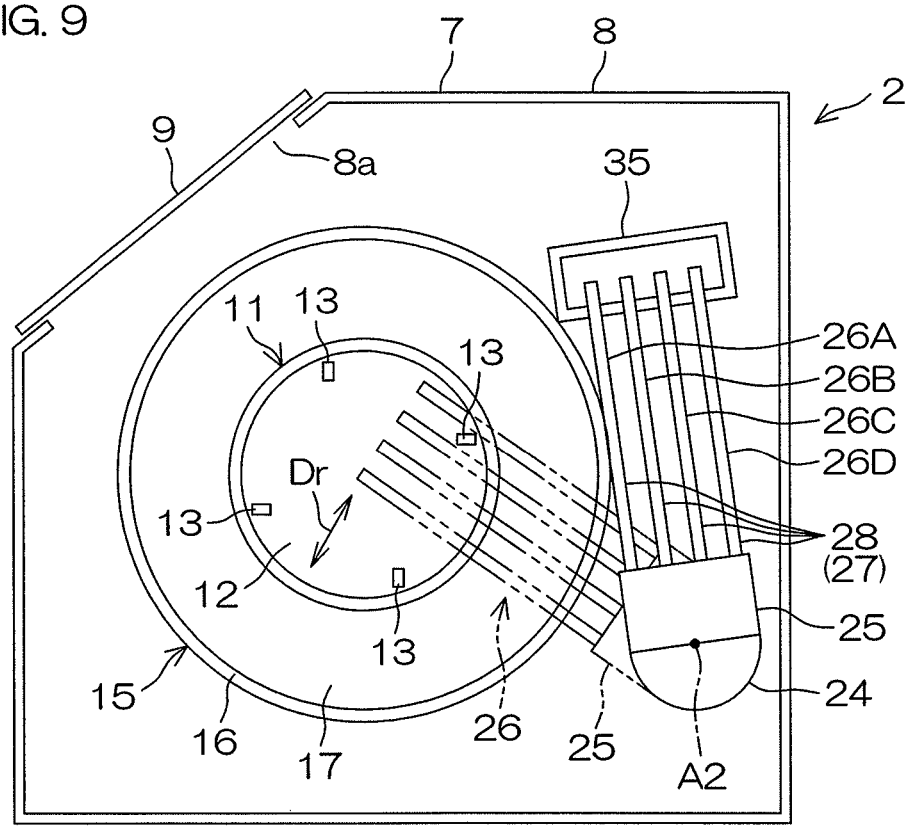
FIG. 9 is a schematic plan view of a plurality of nozzles according to a first modification example of the first preferred embodiment.
Figure 10A:
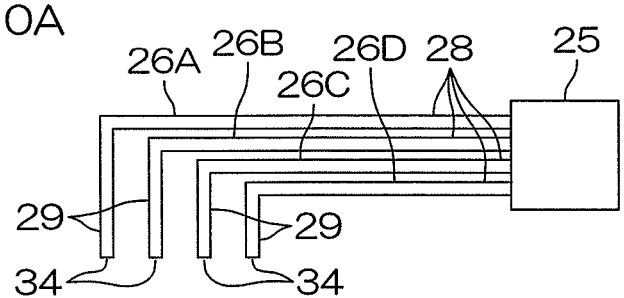
FIG. 10A and FIG. 10B are schematic views of a plurality of nozzles according to a second modification example of the first preferred embodiment, with FIG. 10A being a schematic front view of the plurality of nozzles and FIG. 10B being a schematic plan view of the plurality of nozzles.
Figure 10B:
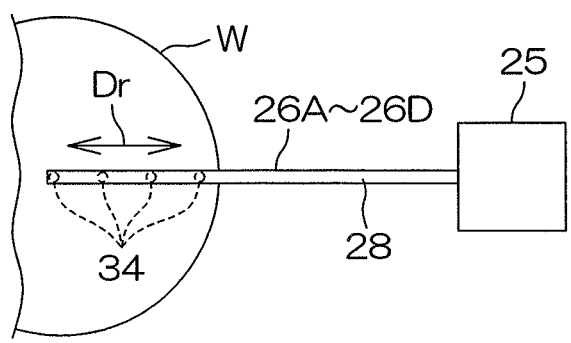

Also with the present preferred embodiment, the first discharge port 34A and the second discharge port 34B are aligned in a plan view in the radial direction Dr. When the plurality of nozzles 26 of the same length are aligned in a horizontal direction orthogonal to the longitudinal direction D1 so that the plurality of discharge ports 34 are aligned in a plan view in the radial direction Dr, an entirety of the plurality of nozzles 26 increases in width (see FIG. 9). When the plurality of nozzles 26 of different lengths are aligned in a vertical direction so that the plurality of discharge ports 34 are aligned in a plan view in the radial direction Dr, the entirety of the plurality of nozzles 26 increases in height (see FIG. 10A and FIG. 10B).

On the other hand, with the present preferred embodiment, the plurality of arm portions 28 are aligned in the horizontal alignment direction D2 orthogonal to the longitudinal direction D1. Further, the tips 28a of the plurality of arm portions 28 are shifted in the longitudinal direction D1 such that, in regard to the longitudinal direction D1, the tips 28a of the plurality of arm portions 28 are aligned in the order of the first nozzle 26A to the fourth nozzle 26D from the rotational axis A1 side (see FIG. 4). The plurality of discharge ports 34 can thereby be aligned in the radial direction Dr in a plan view while suppressing both the width and the height of the entirety of the plurality of nozzles 26.

The present invention is not restricted to the content of the preferred embodiment and various modifications are possible within the scope of the present invention.

For example, although with the preferred embodiment described above, the case where the number of the nozzles 26 is four was described, the number of the nozzles 26 may be two or three or may be five or more.

Although with the preferred embodiment, the case where the chemical liquid flowing through each of the return flow passages 54 toward the chemical tank 41 is cooled by the cooler 56 was described, the cooler 56 may be omitted.

Although with the preferred embodiment, the case where, during discharge stoppage, the liquids heated by the downstream heaters 53 are made to flow from the upstream flow passages 48 to the return flow passages 54 was described, if the downstream heaters 53 are to be stopped during discharge stoppage, the return flow passages 54 may be omitted.

Although with the preferred embodiment, the case where a downstream heater 53 is not disposed at the first upstream flow passage 48A while downstream heaters 53 are disposed at all upstream flow passages 48 besides the first upstream flow passage 48A was described, the downstream heaters 53 may be disposed at all upstream flow passages 48 including the first upstream flow passage 48A. Oppositely, the downstream heaters 53 do not have to be disposed at all of the upstream flow passages 48. The same applies to the return passages 54.

Although with the preferred embodiment, the case where a nozzle head 33 is not disposed at the first nozzle 26A while nozzle heads 33 are mounted on all nozzles 26 besides the first nozzle 26A was described, the nozzle heads 33 may be disposed at all nozzles 26 including the first nozzle 26A. Oppositely, the nozzle heads 33 do not have to be disposed at all of the nozzles 26.

Although with the preferred embodiment, the case where three downstream flow passages 52 and three discharge ports 34 are defined in a single nozzle head 33 was described, the number of downstream flow passages 52 and discharge ports 34 defined in a single nozzle head 33 may be two or may be four or more.

Although with the preferred embodiment, the case where each of the branching upstream flow passages (the upstream flow passages 48 besides the first upstream flow passage 48A) branches into a plurality of the downstream flow passages 52 within the chamber 7 was described, the branching upstream flow passages may branch outside the chamber 7 instead.

Although with the preferred embodiment, the case where the plurality of discharge ports 34 are aligned in the radial direction Dr in a plan view was described, as long as the plurality of discharge ports 34 are respectively disposed at positions differing in distance from the rotational axis A1, the plurality of discharge ports 34 do not have to be aligned in the radial direction Dr in a plan view.

Figure 11:
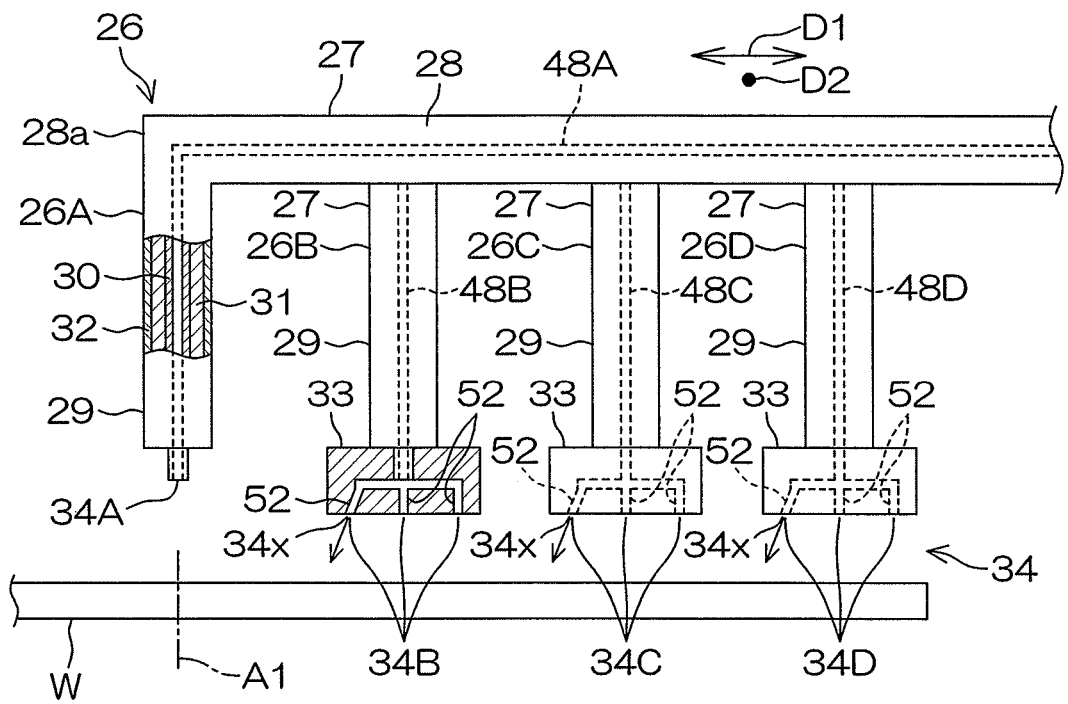
FIG. 11 is a schematic front view of a plurality of nozzles according to a third modification example of the first preferred embodiment.

Although with the preferred embodiment, the case where each discharge port 34 discharges the processing liquid in the discharge direction perpendicular to the upper surface of the substrate W was described, the plurality of discharge ports 34 may include an oblique discharge port 34x that discharges the processing liquid in a discharge direction that is inclined with respect to the upper surface of the substrate W so as to approach the rotational axis A1 as the upper surface of the substrate W is approached. FIG. 11 shows an example where an inner discharge port that is positioned closest to the rotational axis A1 side among the plurality of discharge ports 34 disposed in the nozzle head 33 is the oblique discharge port 34x.

With this arrangement, the processing liquid discharged from the oblique discharge port 34x has kinetic energy of a direction directed toward the rotational axis A1 and therefore flows along the upper surface of the substrate W toward the rotational axis A1. Thereafter, the processing liquid flows toward the outer side along the upper surface of the substrate W due to the centrifugal force due to rotation of the substrate W and is expelled from the upper surface of the substrate W. A retention time of the processing liquid on the substrate W is thus increased in comparison to a case where the processing liquid is discharged in a direction perpendicular to the upper surface of the substrate W or in a case where it is discharged in a direction that is outwardly inclined with respect to the upper surface of the substrate W. The processing liquid can thus be used efficiently and the consumption amount of the processing liquid can be reduced.

Although with the preferred embodiment, the case where the plurality of nozzles 26 are made to discharge the chemical liquids while keeping the plurality of nozzles 26 still was described, the plurality of nozzles 26 may be made to discharge the chemical liquids while making the plurality of nozzles 26 pivot around the nozzle pivoting axis A2.

Although with the preferred embodiment, the case where all of the discharge valves 51 are opened at the same time and all of the discharge valves 51 are closed at the same time was described, the controller 3 may control the plurality of discharge valves 51 so that the time during which a discharge port 34 at an outer side is discharging the processing liquid is longer than the time during which a discharge port 34 at an inner side is discharging the processing liquid.

Figure 12:
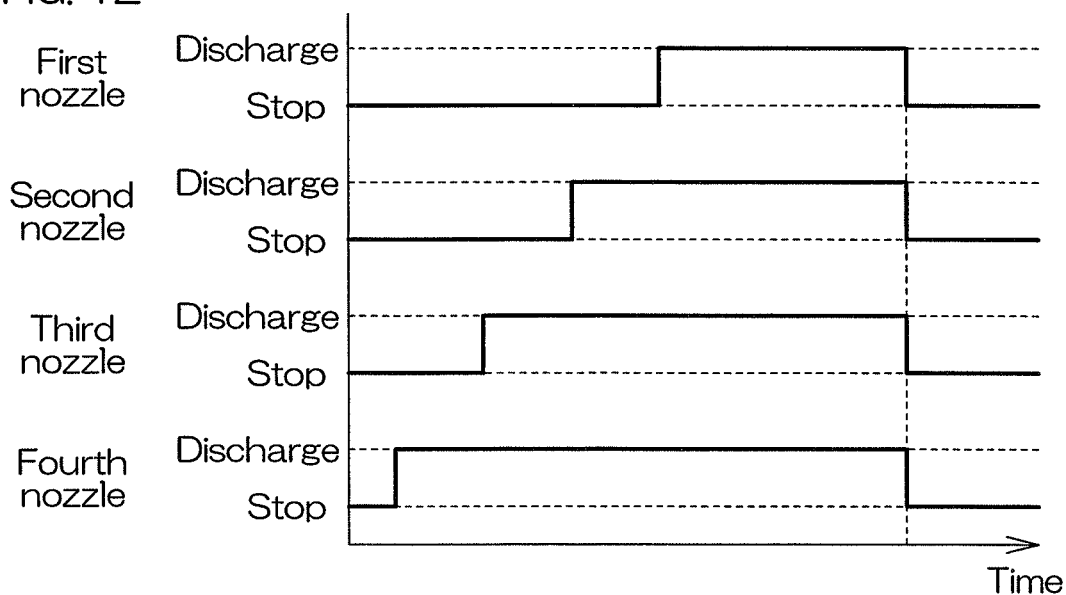
FIG. 12 is a time chart of chemical liquid discharge timings according to a fourth modification example of the first preferred embodiment.

For example, as shown in FIG. 12, the controller 3 may make the plurality of nozzles 26 discharge the processing liquids in the order of the fourth nozzle 26D to the first nozzle 26A and thereafter stop the discharges of processing liquid by the plurality of nozzles 26 at the same time. Specifically, the controller 3 may successively open the four discharge valves 51 in the order of the fourth discharge valve 51 to the first discharge valve 51 and thereafter close the four discharge valves 51 at the same time. In this case, the time of supplying of the processing liquid to each portion of the upper surface of the substrate W increases stepwise with distance away from the central portion of the substrate W.

If the processing liquid is discharged from just a single discharge port 34, an etching rate tends to decrease with distance away from the central portion of the substrate W. Therefore, by increasing the processing liquid supplying time with distance away from the central portion of the substrate W, the etching amounts at positions besides the central portion of the substrate W can be increased. The processing uniformity can thereby be increased.

Figure 13:
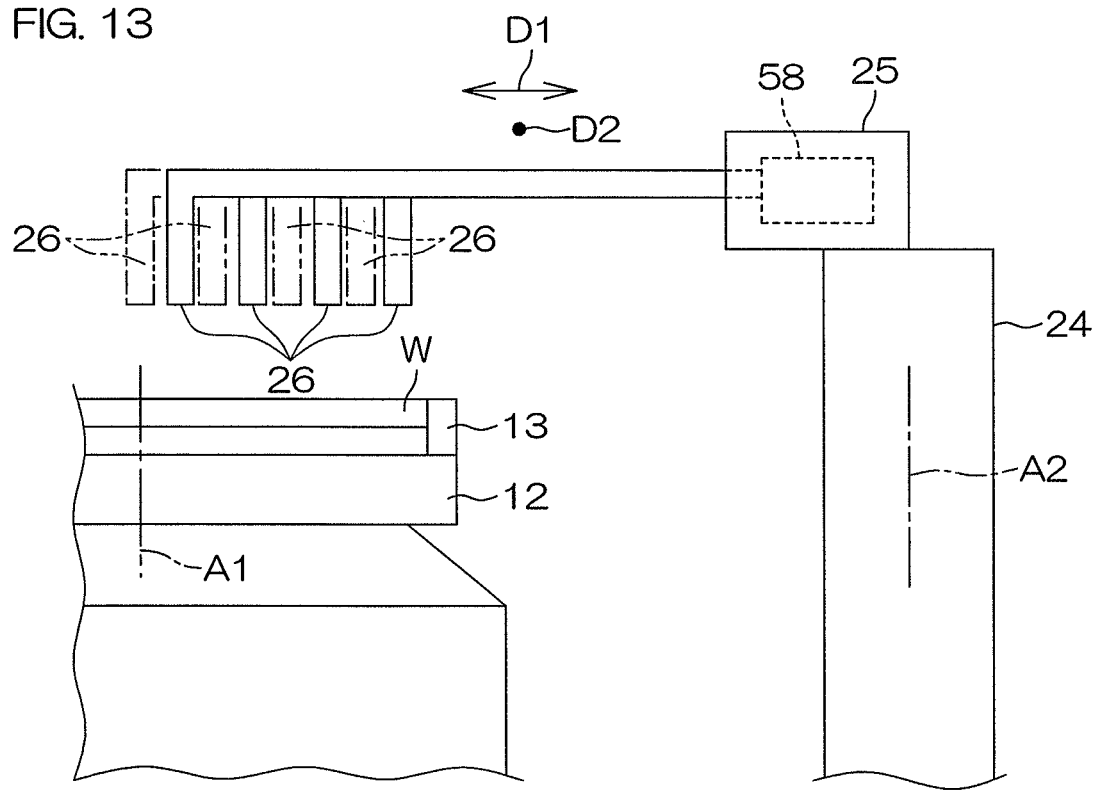
FIG. 13 is a schematic front view of a discharge position adjusting unit according to a fifth modification example of the first preferred embodiment.

Also, as shown in FIG. 13, the processing unit 2 may further include a discharge position adjusting unit 58 that moves the plurality of discharge ports 34 in a horizontal adjusting direction (the longitudinal direction D1 in FIG. 13) that differs from the direction of movement of the plurality of discharge ports 34 by the nozzle moving unit 24. The discharge position adjusting unit 58 is held by the holder 25. The discharge position adjusting unit 58 moves the plurality of nozzles 26 in the longitudinal direction D1 with respect to the holder 25. The plurality of discharge position adjusting unit 58 may be a pneumatic actuator or an electric actuator or an actuator besides these.

With this arrangement, the nozzle moving unit 24 moves the plurality of discharge ports 34 and the discharge position adjusting unit 34 horizontally. At the processing position, the plurality of discharge ports 34 are respectively disposed at the plurality of positions differing in distance from the rotational axis A1. When the discharge position adjusting unit 58 moves the plurality of discharge ports 34 in the adjusting direction, all of the discharge ports 34 are either moved closer to or further away from the rotational axis A1 and the liquid landing positions of the processing liquids with respect to the upper surface of the substrate W are moved. An etching profile (cross-sectional shape of the upper surface of the substrate W after etching) can be adjusted by making the discharge position adjusting unit 58 move the plurality of discharge ports 34.

Although with the preferred embodiment, the case where the chemical liquid flow passage 42 that supplies the chemical liquid to the supply flow passage 47 is provided was described, a plurality of processing liquid flow passages that supply liquids to the supply flow passage 47 may be provided.

For example, a first liquid may be supplied from a first liquid flow passage to the supply flow passage 47 and a second liquid may be supplied from a second liquid flow passage to the supply flow passage 47. In this case, the first liquid and the second liquid are mixed in the supply flow passage 47 and therefore a mixed liquid containing the first liquid and the second liquid is supplied from the supply flow passage 47 to the plurality of upstream flow passages 48. The first liquid and the second liquid may be liquids of the same type or may be liquids of different types. Specific examples of the first liquid and the second liquid include a combination of sulfuric acid and hydrogen peroxide water and a combination of TMAH and pure water.

The controller 3 may control the temperatures of the processing liquids supplied to respective portions of the front surface of the substrate W in accordance with a thickness of a thin film before processing to make uniform the thickness of the thin film after processing.

Figure 14:
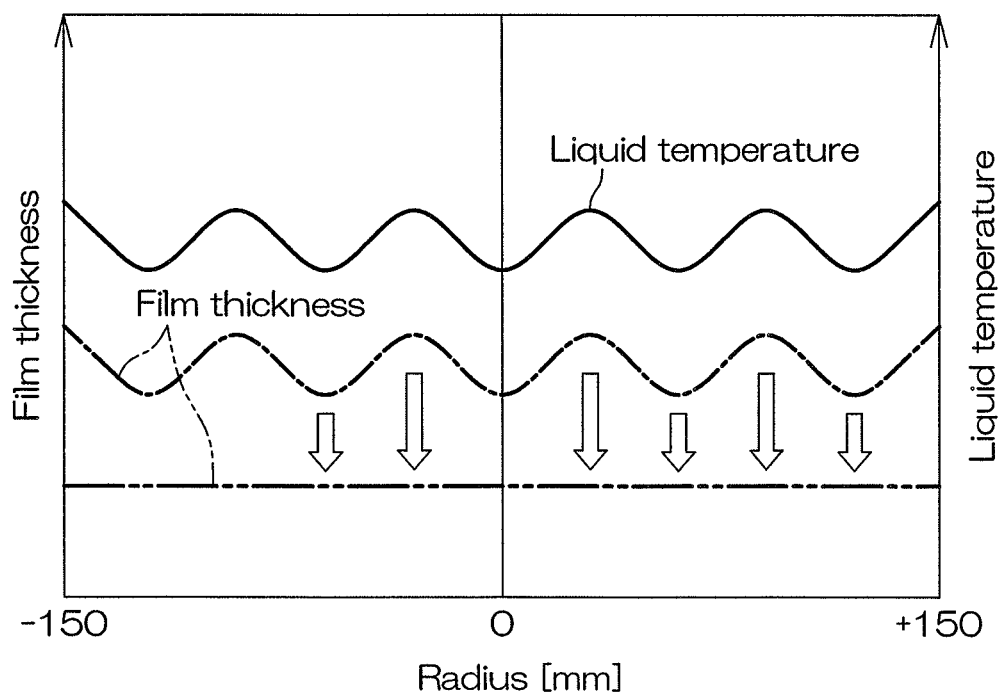
FIG. 14 is a graph showing a conceptual image of a thickness of a thin film before and after processing and a temperature of a processing liquid supplied to a substrate.

FIG. 14 is a graph showing a conceptual image of a thickness of a thin film before and after processing and a temperature of a processing liquid supplied to a substrate W. An alternate long and short dashes line in FIG. 14 indicates the film thickness before processing and an alternate long and two short dashes line in FIG. 14 indicates the film thickness after processing. A solid line in FIG. 14 indicates the temperatures of the processing liquids supplied to the substrate W. The abscissa axis of FIG. 14 indicates the radius of the substrate W. The film thickness before processing may be input into the substrate processing apparatus 1 from an apparatus (for example, a host computer) other than the substrate processing apparatus 1 or may be measured by a measuring instrument provided in the substrate processing apparatus 1.

With the example shown in FIG. 14, the controller 3 may control the substrate processing apparatus 1 so that the temperatures of the processing liquids vary similarly to the film thickness before processing. Specifically, the controller 3 may control the plurality of downstream heaters 53 so that the temperatures of the processing liquids in the plurality of upstream flow passages 48 are temperatures that are in accordance with the film thickness before processing.

In this case, processing liquid of relatively high temperature is supplied to a position at which the film thickness before processing is relatively large and processing liquid of relatively low temperature is supplied to a position at which the film thickness before processing is relatively small. The etching amount of the thin film formed on the front surface of the substrate W increases relatively at a position at which processing liquid of high temperature is supplied and decreases relatively at a position at which processing liquid of low temperature is supplied. The thin film is thus made uniform in thickness after processing.

Two or more of any of the arrangements described above may be combined. Two or more of any of the processes described above may be combined.

Second Preferred Embodiment

A second preferred embodiment of the present invention shall now be described. Components equivalent to the respective portions described above shall be provided with the same reference symbols as in FIG. 1, etc., and description thereof shall be omitted.

When the substrate W is to be processed by the processing unit 2, the substrate W is carried into the interior of the chamber 7 by the hand (not shown) of the transfer robot in the state where the plurality of nozzles 26 are retracted from above the spin chuck 11 and the splash guard 17 is positioned at the lower position. The substrate W is thereby placed, in the state where the front surface is faced up, on the plurality of chuck pins 13. Thereafter, the hand of the transfer robot is retracted from the interior of the chamber 7 and the carry-in/carry-out port 8a of the chamber 7 is closed by the shutter 9.

After the substrate W has been placed on the plurality of chuck pins 13, the plurality of chuck pins 13 are pressed against the peripheral edge portions of the substrate Wand the substrate W is gripped by the plurality of chuck pins 13. Also, the guard raising/lowering unit 18 moves the splash guard 17 from the lower position to the upper position. The upper end of the splash guard 17 is thereby disposed higher than the substrate W. Thereafter, the spin motor 14 is driven to start rotation of the substrate W. The substrate W is thereby rotated at a predetermined liquid processing speed (of, for example, several hundred rpm).

Figure 15:
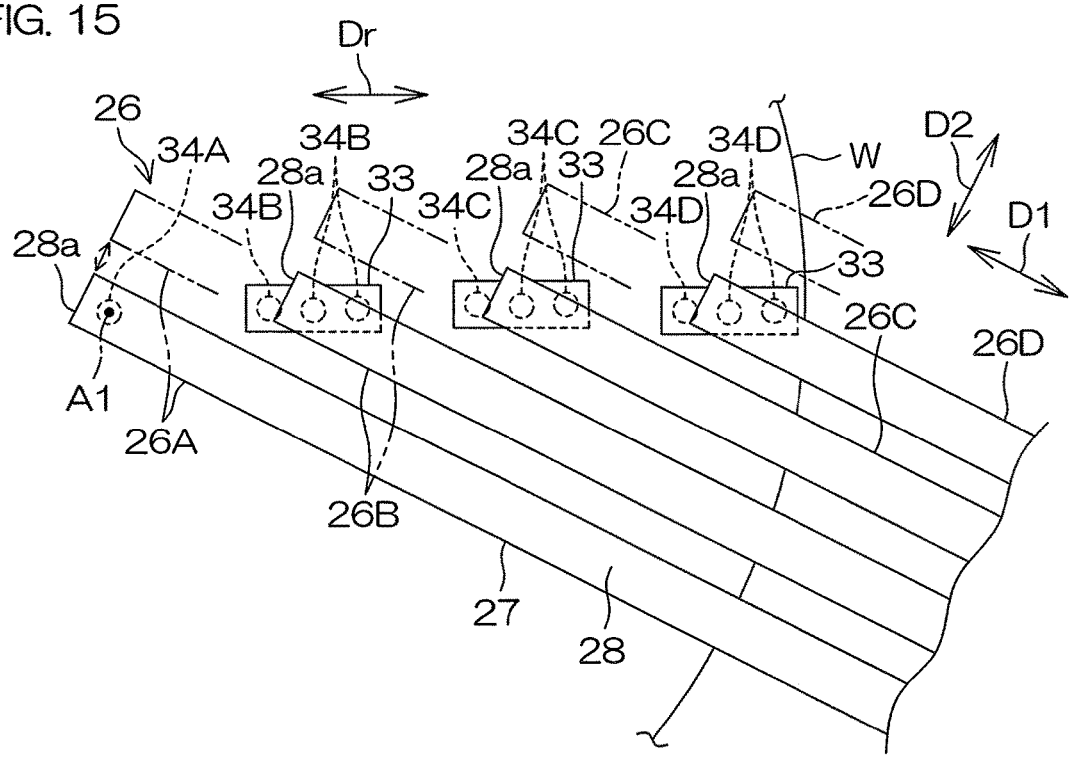
FIG. 15 is a schematic plan view of a plurality of nozzles according to a second preferred embodiment of the present invention.

Thereafter, the nozzle moving unit 24 moves the plurality of nozzles 26 from the standby position to the processing position. The plurality of discharge ports 34 are thereby overlapped with the substrate W in a plan view. Thereafter, the plurality of discharge valves 51, etc., are controlled and the chemical liquids are discharged at the same time from the plurality of nozzles 26 (step S1 of FIG. 7). The plurality of nozzles 26 discharge the chemical liquids in a state where the nozzle moving unit 24 swings the plurality of nozzles 26 around the rotational axis A1 (in regard to the swinging, see the alternate long and two short dashes lines in FIG. 15). When a predetermined time elapses from the opening of the plurality of discharge valves 51, the discharges of chemical liquids from the plurality of nozzles 26 are stopped at the same time (step S2 of FIG. 7). Thereafter, the nozzle moving unit 24 moves the plurality of nozzles 26 from the processing position to the standby position.

The chemical liquids discharged from the plurality of nozzles 26 land on the upper surface of the rotating substrate W and thereafter flow outward (in the direction away from the rotational axis A1) along the upper surface of the substrate W due to the centrifugal force. The chemical liquid that reaches the upper surface peripheral edge portion of the substrate W is scattered to a periphery of the substrate W and received by the inner peripheral surface of the splash guard 17. The chemical liquid is thereby supplied to the entire upper surface of the substrate W and the liquid film of chemical liquid that covers the entire upper surface of the substrate W is formed on the substrate W. The entire upper surface of the substrate W is thereby processed by the chemical liquid.

After the discharges of chemical liquids from the plurality of nozzles 26 have been stopped, the rinse liquid valve 23 is opened and discharge of the rinse liquid (pure water) from the rinse liquid nozzle 21 is started (step S3 of FIG. 7). The chemical liquid on the substrate W is thereby rinsed off by the rinse liquid and the liquid film of rinse liquid that covers the entire upper surface of the substrate W is formed. When a predetermined time elapses from the opening of the rinse liquid valve 23, the rinse liquid valve 23 is closed and the discharge of the rinse liquid from the rinse liquid nozzle 21 is stopped (step S4 of FIG. 7).

After the discharge of the rinse liquid from the rinse liquid nozzle 21 has been stopped, the substrate W is accelerated in the rotational direction by the spin motor 14 and the substrate W is rotated at a drying speed (of, for example, several thousand rpm) higher than the liquid processing speed (step S5 of FIG. 7). The rinse liquid attached to the substrate W is thereby spun off to the periphery of the substrate W and the substrate W is dried. When a predetermined time elapses from the start of high speed rotation of the substrate W, the rotation of the spin motor 14 and the substrate W is stopped.

After the rotation of the substrate W has been stopped, the guard raising/lowering unit 18 moves the splash guard 17 from the upper position to the lower position. Further, the holding of the substrate W by the plurality of chuck pins 13 is released. The transfer robot makes its hand enter the interior of the chamber 7 in the state where the plurality of nozzles 26 are retracted from above the spin chuck 11 and the splash guard 17 is positioned at the lower position. Thereafter, the transfer robot uses the hand to take the substrate W on the spin chuck 11 and carries out the substrate W from the chamber 7.

Figure 16:
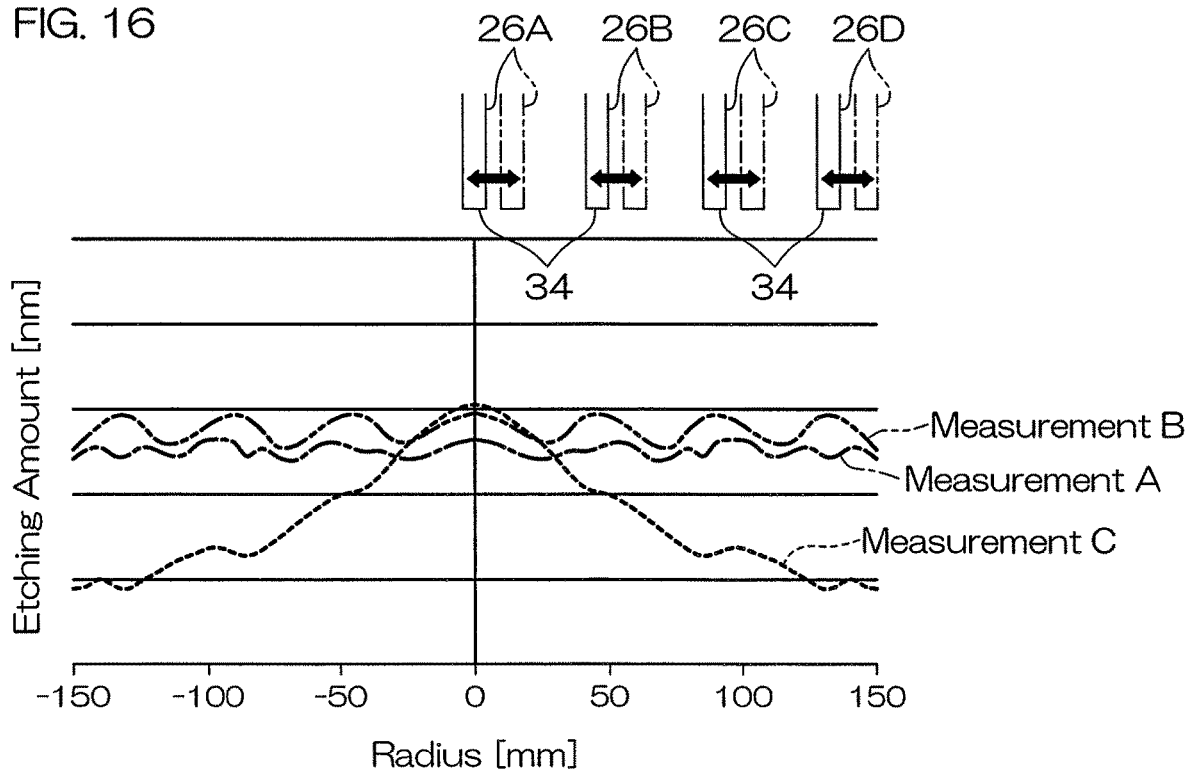
FIG. 16 is a graph of etching amount distributions of substrates.

FIG. 16 is a graph of etching amount distributions of substrates W.

The processing conditions of the substrates W of measurement A to measurement C shown in FIG. 16 are the same with the exception of the nozzles that discharge the chemical liquids.

The measurement A indicates the etching amount distribution when a substrate W is etched by making a plurality of discharge ports 34 (ten discharge ports 34) discharge the chemical liquids while keeping still the plurality of nozzles 26.

The measurement B indicates the etching amount distribution when a substrate W is etched by making a plurality of discharge ports 34 (four discharge ports 34) discharge the chemical liquids while keeping still the plurality of nozzles 26 from which all nozzle heads 33 have been removed. That is, the measurement B indicates the etching amount distribution when the four discharge ports 34 (corresponding to the first discharge port 34A) respectively disposed in the four main nozzle bodies 27 are made to discharge the chemical liquids.

The measurement C indicates the etching amount distribution when just a single discharge port 34 is made to discharge the chemical liquid and the liquid landing position of the chemical liquid is fixed at the upper surface central portion of the substrate W.

With the measurement C, the etching amount decreases with distance away from the central portion of the substrate W and the etching amount distribution exhibits a peak-shaped curve. That is, the etching amount is greatest at the liquid landing position of the chemical liquid and decreases with distance away from the liquid landing position. On the other hand, with the measurement A and the measurement B, the etching amounts at positions besides the central portion of the substrate W are increased and the etching uniformity is greatly improved in comparison to the measurement C.

With the measurement B, seven peaks are formed. The apex of the central peak is at a position corresponding to the innermost liquid landing position and the apexes of the two peaks at outer sides thereof are at positions corresponding to the second liquid landing position from the inner side. The positions of the apexes of the two peaks further to the outer sides are positions corresponding to the third liquid landing position from the inner side, and the positions of the two outermost peaks are positions corresponding to the fourth liquid landing position from the inner side.

With the measurement A, a plurality of peaks corresponding to the plurality of liquid landing positions are formed similarly to the measurement B. Whereas with the measurement B, the number of discharge ports 34 is four, with the measurement A, the number of discharge ports 34 is ten and therefore the number of peaks is increased. Further in comparison to the measurement B, the curve indicating the etching amount distribution is closer to being the straight line extending in the right/left direction (the straight line of fixed etching amount) and the etching uniformity is improved.

As mentioned above, the nozzle moving unit 24 swings the plurality of nozzles 26 around the nozzle pivoting axis A2 within a range in which the chemical liquids discharged from the plurality of discharge ports 34 land on the upper surface of the substrate W. In this process, each discharge port 34 reciprocates horizontally once or more along an arcuate path with a center on the nozzle rotational axis A2. The distances from the rotational axis A1 to the respective discharge ports 34 are thus changed.

The measurement A and the measurement B indicate etching amount distributions when the substrates W are etched with the plurality of nozzles 26 being kept still. When the nozzle moving unit 24 swings the plurality of nozzles 26, the liquid landing positions move in the radial direction Dr and the line indicating the etching amount distribution is made even closer to being the straight line extending in the right/left direction (the straight line of fixed etching amount). The etching uniformity can thereby be increased further.

With the second preferred embodiment, the following actions and effects can be exhibited in addition to the actions and effects according to the first preferred embodiment.

Also with the present preferred embodiment, the nozzle moving unit 24 swings the plurality of discharge ports 34 in the state where the substrate W is rotating and the plurality of discharge ports 34 are discharging the chemical liquids. The distances from the rotational axis A1 to the respective discharge ports 34 are thereby changed. The chemical liquids discharged from the plurality of discharge ports 34 land on the plurality of liquid landing positions within the upper surface of the substrate W. The etching amount of the substrate W is greatest at each liquid landing position and decreases with distance away from the liquid landing position. The plurality of discharge ports 34 are moved horizontally and the plurality of liquid landing positions are also moved within the upper surface of the substrate W accordingly. The processing uniformity can thereby be increased in comparison to a case where the plurality of discharge ports 34 are not moved.

Also with the present preferred embodiment, the processing liquids that have been heated at the downstream temperatures higher than the upstream temperature by the downstream heaters 53 are supplied to the discharge ports 34 besides the innermost discharge port (first discharge port 34A) from the upstream flow passages 48 besides the innermost upstream flow passage (first upstream flow passage 48A) and are discharged from the discharge ports 34. That is, whereas the processing liquid of the upstream temperature is discharged from the innermost discharge port, the processing liquid of higher temperature than the upstream temperature is discharged from each of the discharge ports 34 positioned further to the outer side than the innermost discharge port.

The temperatures of the processing liquids supplied to the upper surface of the substrate W thus increase stepwise with distance away from the rotational axis A1 and the temperature uniformity can thus be increased in comparison to the case where the processing liquid of the same temperature is discharged from each discharge port 34. The processing uniformity can thus be increased while reducing the consumption amount of the processing liquid.

The present invention is not restricted to the content of the preferred embodiment and various modifications are possible within the scope of the present invention.

For example, although the case where the chemical liquid flow passage 42 that supplies the chemical liquid to the supply flow passage 47 is provided was described, a plurality of processing liquid flow passages that supply liquids to the supply flow passage 47 may be provided.

For example, a first liquid may be supplied from a first liquid flow passage to the supply flow passage 47 and a second liquid may be supplied from a second liquid flow passage to the supply flow passage 47. In this case, the first liquid and the second liquid are mixed in the supply flow passage 47 and therefore a mixed liquid containing the first liquid and the second liquid is supplied from the supply flow passage 47 to the plurality of upstream flow passages 48. The first liquid and the second liquid may be liquids of the same type or may be liquids of different types. Specific examples of the first liquid and the second liquid include a combination of sulfuric acid and hydrogen peroxide water and a combination of TMAH and pure water.

Two or more of any of the arrangements described above may be combined. Two or more of any of the processes described above may be combined.

Third Preferred Embodiment

A third preferred embodiment of the present invention shall now be described. Components equivalent to the respective portions described above shall be provided with the same reference symbols as in FIG. 1, etc., and description thereof shall be omitted.

Figure 17:
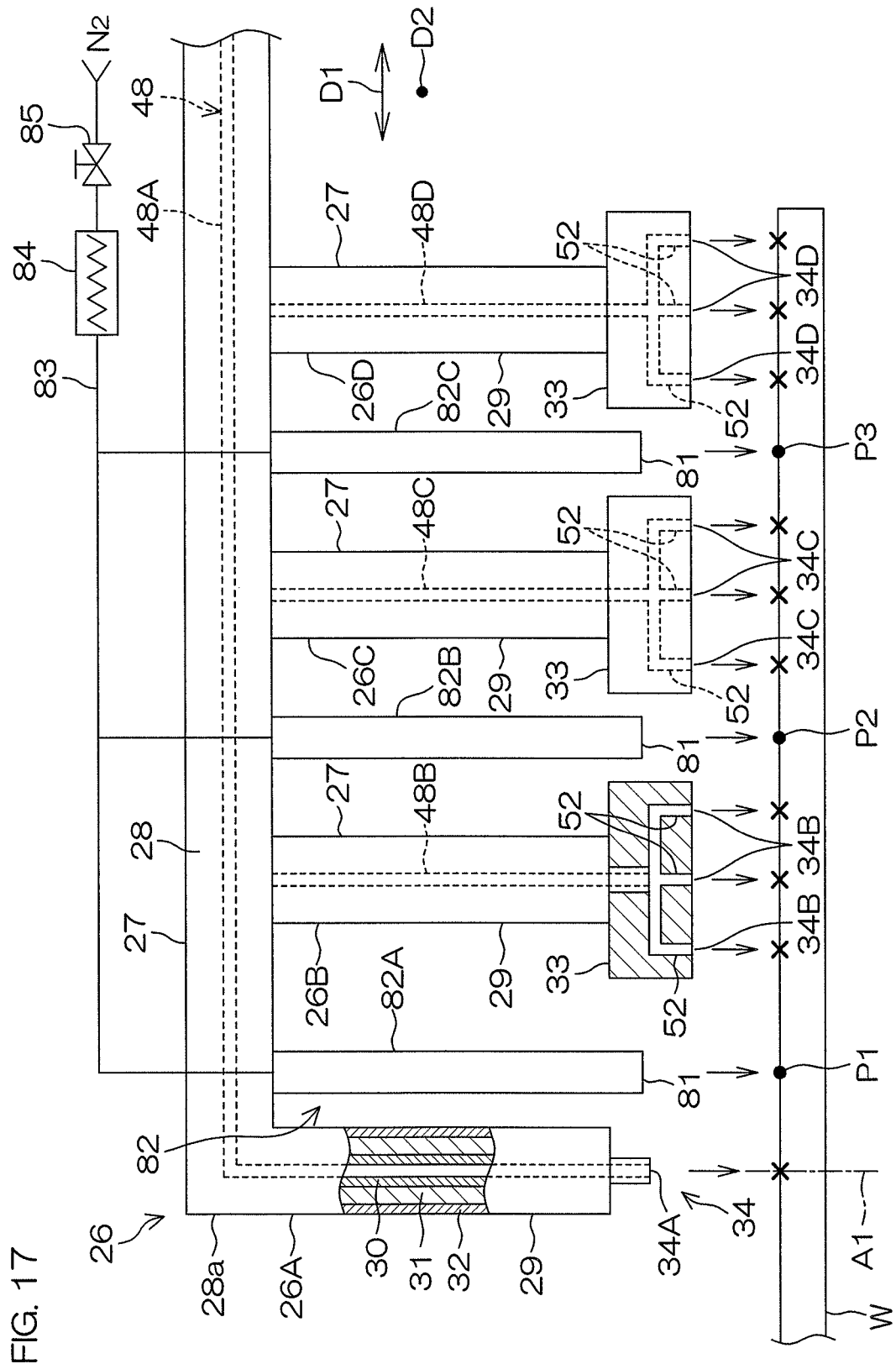
FIG. 17 is a schematic front view of a plurality of nozzles and a plurality of gas nozzles according to a third preferred embodiment of the present invention.
Figure 18:
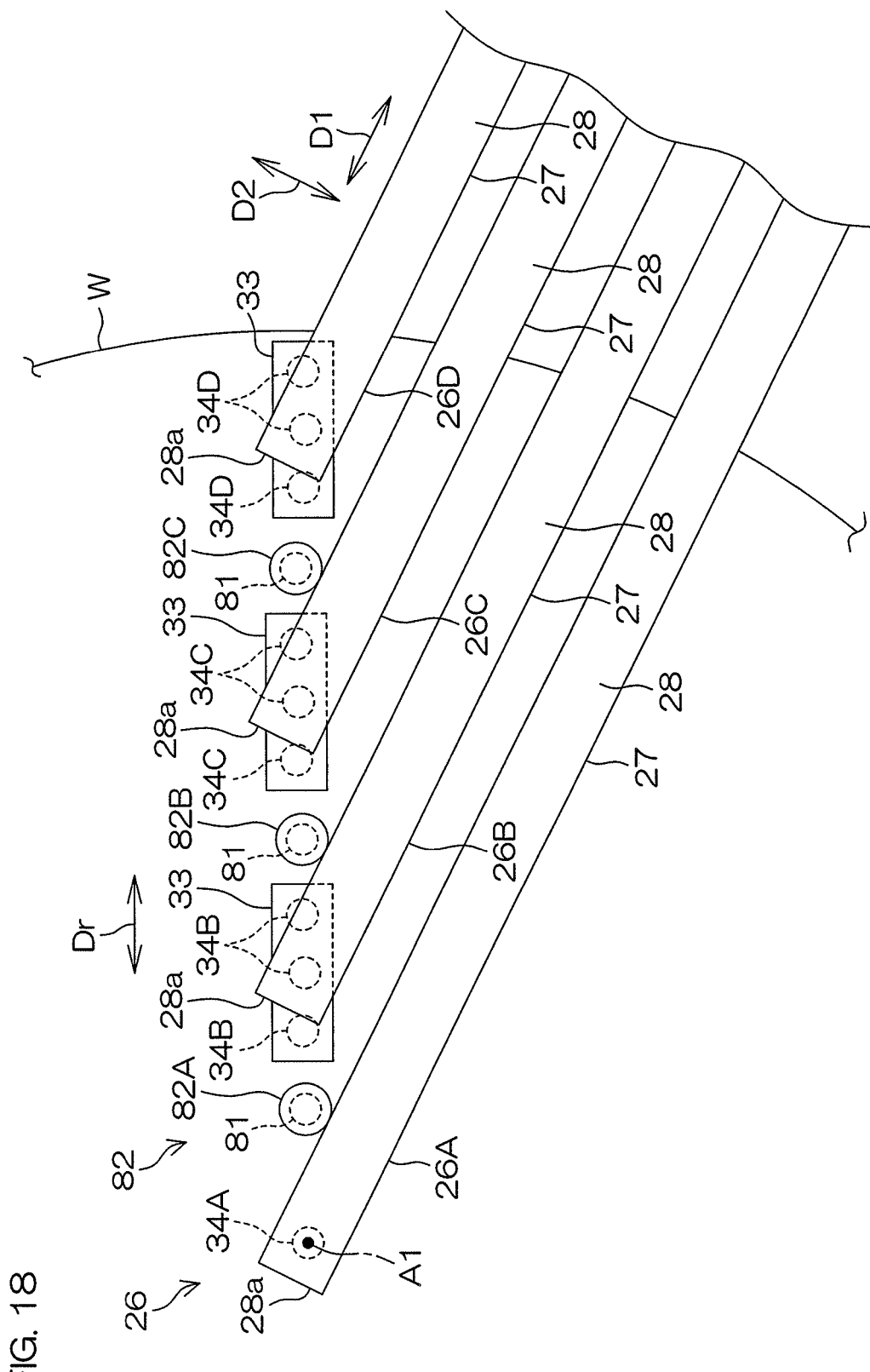
FIG. 18 is a schematic plan view of the plurality of nozzles and the plurality of gas nozzles.

The substrate processing apparatus 1 includes a gas supplying unit that discharges a high temperature gas toward the substrate W to heat the liquid on the substrate W. As shown in FIG. 17 and FIG. 18, the gas supplying unit includes a plurality of gas nozzles 82 (first gas nozzle 82A, second gas nozzle 82B, and third gas nozzle 82C) provided with a plurality of gas discharge ports 81 that discharge a gas downward. An example of the gas is nitrogen gas. The gas may be an inert gas besides nitrogen gas or may be clean air filtered by a filter or may be a gas besides the above.

As shown in FIG. 17, the gas supplying unit includes a gas piping 83 guiding the gas to the plurality of gas nozzles 82, a gas heater 84 heating the gas, flowing through the gas piping toward the plurality of gas discharge ports 81, at a temperature higher than room temperature, and a gas valve 85 opening and closing the gas piping 83. The temperature of heating of the gas by the gas heater 84 is higher than room temperature and lower than the boiling point of the chemical liquid.

The first gas nozzle 82A to the third gas nozzle 82C are respectively held by the first nozzle 26A to the third nozzle 26C. The gas nozzles 82 move together with the nozzles 26. The plurality of nozzles 26 and the plurality of gas nozzles 82 are aligned alternately in regard to the radial direction Dr. The plurality of discharge ports 34 and the plurality of gas discharge ports 81 are aligned in the radial direction Dr in a plan view. The first discharge port 34A is disposed further to the inner side than the innermost gas discharge port 81 and the second discharge port 34B is disposed further to the outer side than the innermost gas discharge port 81. The plurality of discharge ports 34 and the plurality of gas discharge ports 81 are shifted in position so that, in regard to the radial direction Dr, a gas discharge port 81 is positioned between two adjacent discharge ports 34.

The plurality of gas nozzles 82 discharge the gas toward a plurality of blowing-on positions P1 to P3 within the upper surface of the substrate W. The plurality of blowing-on positions P1 to P3 are separate positions that respectively differ in distance from the rotational axis A1. In FIG. 17, the liquid landing positions at which the chemical liquids land are indicated by "x." The plurality of liquid landing positions respectively corresponding to the plurality of second discharge ports 34B are positioned between the innermost blowing-on position P1 and the middle blowing-on position P2 in regard to the radial direction Dr. The plurality of liquid landing positions respectively corresponding to the plurality of third discharge ports 34C are positioned between the middle blowing-on position P2 and the outermost blowing-on position P3 in regard to the radial direction Dr.

Figure 19:
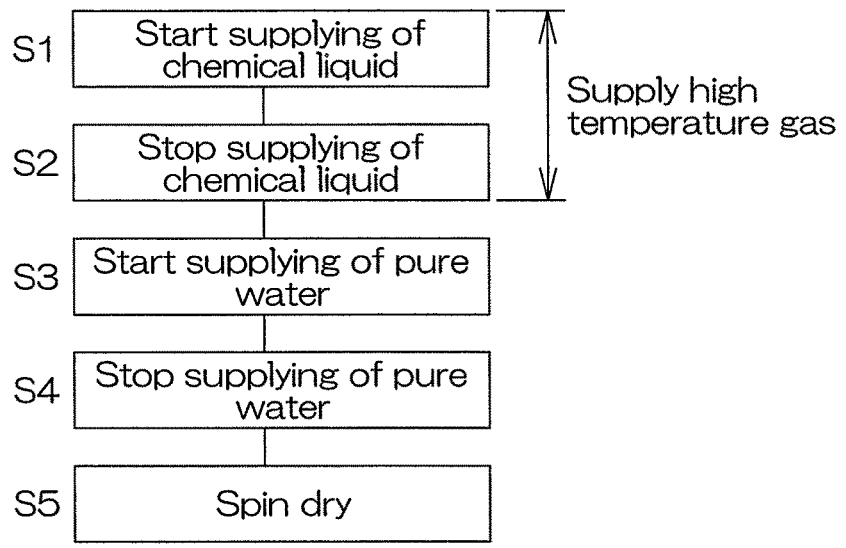
FIG. 19 is a process flowchart for describing an example of substrate processing executed by the substrate processing apparatus.

FIG. 19 is a process flowchart for describing an example of processing of the substrate W executed by the substrate processing apparatus 1. The respective operations described below are executed by the controller 3 controlling the substrate processing apparatus 1. FIG. 3 and FIG. 4 shall be referenced in the following description. FIG. 17 and FIG. 19 shall be referenced where suitable.

When the substrate W is to be processed by the processing unit 2, the substrate W is carried into the interior of the chamber 7 by the hand (not shown) of the transfer robot in the state where the plurality of nozzles 26 are retracted from above the spin chuck 11 and the splash guard 17 is positioned at the lower position. The substrate W is thereby placed, in a state where the front surface is faced up, on the plurality of chuck pins 13. Thereafter, the hand of the transfer robot is retracted from the interior of the chamber 7 and the carry-in/carry-out port 8a of the chamber 7 is closed by the shutter 9.

After the substrate W has been placed on the plurality of chuck pins 13, the plurality of chuck pins 13 are pressed against the peripheral edge portions of the substrate W and the substrate W is gripped by the plurality of chuck pins 13. Also, the guard raising/lowering unit 18 moves the splash guard 17 from the lower position to the upper position. The upper end of the splash guard 17 is thereby disposed higher than the substrate W. Thereafter, the spin motor 14 is driven to start rotation of the substrate W. The substrate W is thereby rotated at a predetermined liquid processing speed (of, for example, several hundred rpm).

Thereafter, the nozzle moving unit 24 moves the plurality of nozzles 26 from the standby position to the processing position. The plurality of discharge ports 34 are thereby overlapped with the substrate W in a plan view. Thereafter, the plurality of discharge valves 51, etc., are controlled and the chemical liquids are discharged at the same time from the plurality of nozzles 26 (step S1 of FIG. 19). The plurality of nozzles 26 discharge the chemical liquids in a state where the nozzle moving unit 24 keeps the plurality of nozzles 26 still. When a predetermined time elapses from the opening of the plurality of discharge valves 51, the discharges of chemical liquids from the plurality of nozzles 26 are stopped at the same time (step S2 of FIG. 19). Thereafter, the nozzle moving unit 24 moves the plurality of nozzles 26 from the processing position to the standby position.

The chemical liquids discharged from the plurality of nozzles 26 land on the upper surface of the rotating substrate W and thereafter flow outward (in the direction away from the rotational axis A1) along the upper surface of the substrate W due to the centrifugal force. The chemical liquid that reaches the upper surface peripheral edge portion of the substrate W is scattered to the periphery of the substrate W and received by the inner peripheral surface of the splash guard 17. The chemical liquid is thereby supplied to the entire upper surface of the substrate W and the liquid film of chemical liquid that covers the entire upper surface of the substrate W is formed on the substrate W. The entire upper surface of the substrate W is thereby processed by the chemical liquid.

Also, when the plurality of nozzles 26 are disposed at the processing position, the gas valve 85 (see FIG. 17) is opened and the high temperature gas, such as nitrogen gas, etc., is discharged from the gas discharge ports 81 of the plurality of gas nozzles 82. The high temperature gas is thereby blown onto the liquid film of chemical liquid that covers the entire upper surface of the substrate W. When a predetermined time elapses from the opening of the gas valve 85, the gas valve 85 is closed and the discharge of gas from the plurality of gas nozzles 82 is stopped. As long as at least a portion of the gas discharging period overlaps with the chemical liquid discharging period, the discharge of the gas may be started at the same time as the discharges of the chemical liquids or may be started before or after the discharges of the chemical liquids. The same applies to discharge stoppage of the gas.

After the discharges of chemical liquids from the plurality of nozzles 26 have been stopped, the rinse liquid valve 23 is opened and discharge of the rinse liquid (pure water) from the rinse liquid nozzle 21 is started (step S3 of FIG. 19). The chemical liquid on the substrate W is thereby rinsed off by the rinse liquid and the liquid film of rinse liquid that covers the entire upper surface of the substrate W is formed. When a predetermined time elapses from the opening of the rinse liquid valve 23, the rinse liquid valve 23 is closed and the discharge of the rinse liquid from the rinse liquid nozzle 21 is stopped (step S4 of FIG. 19).

After the discharge of the rinse liquid from the rinse liquid nozzle 21 has been stopped, the substrate W is accelerated in the rotational direction by the spin motor 14 and the substrate W is rotated at a drying speed (of, for example, several thousand rpm) higher than the liquid processing speed (step S5 of FIG. 19). The rinse liquid attached to the substrate W is thereby spun off to the periphery of the substrate W and the substrate W is dried. When a predetermined time elapses from the start of high speed rotation of the substrate W, the rotation of the spin motor 14 and the substrate W is stopped.

After the rotation of the substrate W has been stopped, the guard raising/lowering unit 18 moves the splash guard 17 from the upper position to the lower position. Further, the holding of the substrate W by the plurality of chuck pins 13 is released. The transfer robot makes its hand enter the interior of the chamber 7 in the state where the plurality of nozzles 26 are retracted from above the spin chuck 11 and the splash guard 17 is positioned at the lower position. Thereafter, the transfer robot uses the hand to take the substrate W on the spin chuck 11 and carries out the substrate W from the chamber 7.

Figure 20:
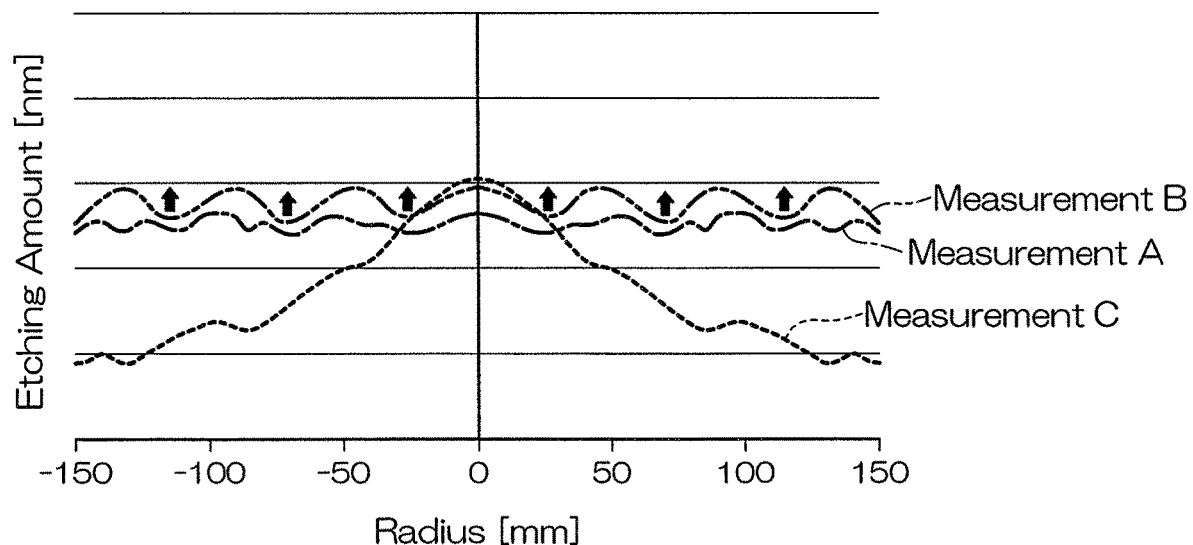
FIG. 20 is a graph of etching amount distributions of substrates.

FIG. 20 is a graph of etching amount distributions of substrates W.

The processing conditions of the substrates W of measurement A to measurement C shown in FIG. 20 are the same with the exception of the nozzles that discharge the chemical liquids.

The measurement A indicates the etching amount distribution when a substrate W is etched by making a plurality of discharge ports 34 (ten discharge ports 34) discharge the chemical liquids while keeping still the plurality of nozzles 26.

The measurement B indicates the etching amount distribution when a substrate W is etched by making a plurality of discharge ports 34 (four discharge ports 34) discharge the chemical liquids while keeping still the plurality of nozzles 26 from which all nozzle heads 33 have been removed. That is, the measurement B indicates the etching amount distribution when the four discharge ports 34 (corresponding to the first discharge port 34A) respectively disposed in the four main nozzle bodies 27 are made to discharge the chemical liquids.

The measurement C indicates the etching amount distribution when just a single discharge port 34 is made to discharge the chemical liquid and the liquid landing position of the chemical liquid is fixed at the upper surface central portion of the substrate W.

With the measurement C, the etching amount decreases with distance away from the central portion of the substrate W and the etching amount distribution exhibits a peak-shaped curve. That is, the etching amount is greatest at the liquid landing position of the chemical liquid and decreases with distance away from the liquid landing position. On the other hand, with the measurement A and the measurement B, the etching amounts at positions besides the central portion of the substrate W are increased and the etching uniformity is greatly improved in comparison to the measurement C.

With the measurement B, seven peaks are formed. The apex of the central peak is at a position corresponding to the innermost liquid landing position and the apexes of the two peaks at outer sides thereof are at positions corresponding to the second liquid landing position from the inner side. The positions of the apexes of the two peaks further to the outer sides are positions corresponding to the third liquid landing position from the inner side, and the positions of the two outermost peaks are positions corresponding to the fourth liquid landing position from the inner side.

With the measurement A, a plurality of peaks corresponding to the plurality of liquid landing positions are formed similarly to the measurement B. Whereas with the measurement B, the number of discharge ports 34 is four, with the measurement A, the number of discharge ports 34 is ten and therefore the number of peaks is increased. Further in comparison to the measurement B, the curve indicating the etching amount distribution is closer to being the straight line extending in the right/left direction (the straight line of fixed etching amount) and the etching uniformity is improved.

With the processing of the substrates W for the measurement A to the measurement C, the discharge of gas from the gas nozzles 82 is not performed. As mentioned above, the controller 3 makes the plurality of gas discharge ports 81 discharge the high temperature gas in the state where the plurality of discharge ports 34 are discharging the chemical liquids toward the upper surface of the rotating substrate W. The high temperature gas is thereby blown onto the liquid film of the chemical liquid covering the entire upper surface of the substrate W.

The gas discharge ports 81 discharge the gas toward the blowing-on positions P1 to P3 (see FIG. 17) within the upper surface of the substrate W. Each of the blowing-on positions P1 to P3 is a position between two liquid landing positions in the radial direction Dr. Therefore as indicated by arrows in FIG. 20, temperature decrease of the chemical liquid is suppressed or prevented at positions, each located between two liquid landing positions, and improvement is made in regard to the decrease of etching amount at such positions. The curve indicating the etching amount distribution is thereby made even closer to being the straight line extending in the right/left direction (the straight line of fixed etching amount) and the etching uniformity is increased.

With the third preferred embodiment, the following actions and effects can be exhibited in addition to the actions and effects according to the first preferred embodiment.

With the present preferred embodiment, the gas discharge ports 81 discharge the gas toward blowing-on positions P1 to P3 within the upper surface of the substrate W in a state where the upper surface of the substrate W is covered with the liquid film of the chemical liquid. A discharge pressure of the gas is a pressure such that the blowing-on positions P1 to P3 do not become exposed from the chemical liquid. The discharged gas is a high temperature gas of higher temperature than room temperature. Therefore, by the supplying of the gas, an improvement can be made in regard to the temperature decrease of the chemical liquid on the substrate W. Further, the plurality of gas discharge ports 91 are respectively disposed at the plurality of positions differing in distance from the rotational axis A1 and the chemical liquid on the substrate W can thus be heated at the plurality of positions that are separated in the radial direction Dr. The temperature uniformity of the chemical liquid can thereby be increased.

Also with the present preferred embodiment, the plurality of liquid landing positions and the plurality of blowing-on positions P1 to P3 are not aligned in the circumferential direction (the direction around the rotational axis A1) but are shifted in the radial direction Dr. The etching amount of the substrate W decreases with distance away from a liquid landing position and is the smallest at an intermediate position between two liquid landing positions in the radial direction Dr. Each of the blowing-on positions P1 to P3 is a position between two liquid landing positions in the radial direction Dr. Temperature decrease of the chemical liquid at a position between two liquid landing positions is thus suppressed or prevented and improvement is achieved in regard to the decrease of the etching amount at this position. The processing uniformity is thereby increased.

Also with the present preferred embodiment, the processing liquids that have been heated at the downstream temperatures higher than the upstream temperature by the downstream heaters 53 are supplied to the discharge ports 34, besides the innermost discharge port (the first discharge port 34A), from the upstream flow passages 48 besides the innermost upstream flow passage (the first upstream flow passage 48A) and are discharged from the discharge ports 34. That is, whereas the processing liquid of the upstream temperature is discharged from the innermost discharge port, the processing liquid of higher temperature than the upstream temperature is discharged from each of the discharge ports 34 positioned further to the outer side than the innermost discharge port.

The temperatures of the processing liquids supplied to the upper surface of the substrate W thus increase stepwise with distance away from the rotational axis A1 and the temperature uniformity can thus be increased in comparison to the case where the processing liquid of the same temperature is discharged from each discharge port 34. The processing uniformity can thereby be increased while reducing the consumption amount of the processing liquid.

The present invention is not restricted to the content of the preferred embodiment and various modifications are possible within the scope of the present invention.

For example, although with the preferred embodiment described above, the case where the number of the nozzles 26 is four was described, the number of the nozzles 26 may be two or three or may be five or more. The same applies to the gas nozzles 82.

Although with the preferred embodiment, the case where the plurality of discharge ports 34 and the plurality of gas discharge ports 81 are aligned in the radial direction Dr in a plan view was described, the plurality of gas discharge ports 81 may be shifted in the circumferential direction with respect to the plurality of discharge ports 34. Also, as long as the plurality of discharge ports 34 are respectively disposed at a plurality of positions differing in distance from the rotational axis A1, the plurality of discharge ports 34 do not have to be aligned in the radial direction Dr in a plan view. The same applies to the gas discharge ports 81.

The substrate processing apparatus 1 may include, in addition to or in place of the gas supplying unit, a chamber temperature raising unit that raises the atmospheric temperature inside the chamber 7. The chamber temperature raising unit may be a heater that heats the gas inside the chamber 7 or a fan that feeds a gas of higher temperature than room temperature into the chamber 7. In this case, temperature decrease of the processing liquid on the substrate W is suppressed or prevented because the atmospheric temperature inside the chamber 7 increases. An improvement can thereby be made in regard to the temperature decrease of the processing liquid on the substrate W to increase the processing uniformity.

The substrate processing apparatus 1 may include, in addition to or in place of the gas supplying unit, a light emitting unit that emits light toward the upper surface of the substrate W held by the spin chuck 11 to heat the processing liquid on the substrate W. The light emitting unit may be an infrared irradiation unit (for example, an infrared heater) that emits infrared rays or a laser irradiation unit that emits a laser.

The light emitting unit emits light toward a plurality of irradiation positions within the upper surface of the substrate W in a state where the upper surface of the substrate W is covered by the liquid film of the processing liquid. The plurality of liquid landing positions and the plurality of irradiation positions are preferably shifted in regard to the radial direction Dr so that an irradiation position is positioned between two adjacent liquid landing positions. Temperature decrease of the processing liquid on the substrate W is suppressed by the irradiation of light. Further, the plurality of irradiation positions are separate positions that respectively differ in distance from the rotational axis A1, and the processing liquid on the substrate W can thus be heated at a plurality of positions separated in the radial direction Dr. The temperature uniformity of the processing liquid can thereby be increased.

Although with the preferred embodiment, the case where the chemical liquid flow passage 42 that supplies the chemical liquid to the supply flow passage 47 is provided was described, a plurality of processing liquid flow passages that supply liquids to the supply flow passage 47 may be provided.

For example, a first liquid may be supplied from a first liquid flow passage to the supply flow passage 47 and a second liquid may be supplied from a second liquid flow passage to the supply flow passage 47. In this case, the first liquid and the second liquid are mixed in the supply flow passage 47 and therefore a mixed liquid containing the first liquid and the second liquid is supplied from the supply flow passage 47 to the plurality of upstream flow passages 48. The first liquid and the second liquid may be liquids of the same type or may be liquids of different types. Specific examples of the first liquid and the second liquid include a combination of sulfuric acid and hydrogen peroxide water and a combination of TMAH and pure water.

Two or more of any of the arrangements described above may be combined. Two or more of any of the processes described above may be combined.

Fourth Preferred Embodiment

A fourth preferred embodiment of the present invention shall now be described. Components equivalent to the respective portions described above shall be provided with the same reference symbols as in FIG. 1, etc., and description thereof shall be omitted.

Figure 24:
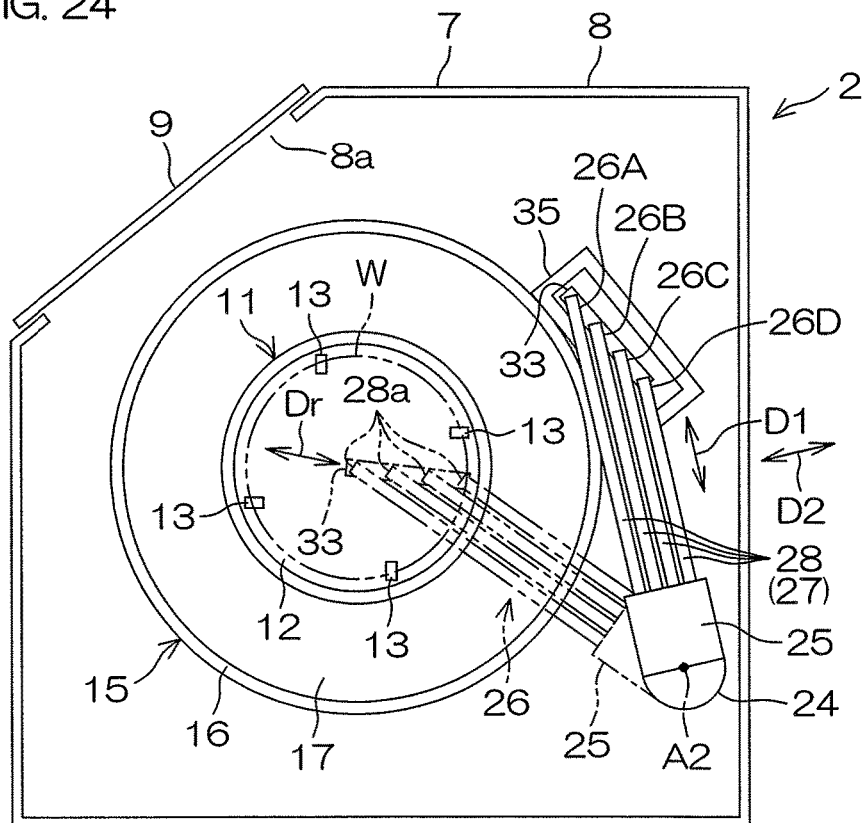
FIG. 24 is a schematic plan view of the interior of the processing unit included in the substrate processing apparatus.

As shown in FIG. 24, the processing unit 2 includes the plurality of nozzles 26 (first nozzle 26A, second nozzle 26B, third nozzle 26C, and fourth nozzle 26D) that discharge the chemical liquids downward, the holder 25 that holds each of the plurality of nozzles 26, and the nozzle moving unit 24 that moves the holder 25 to move the plurality of nozzles 26 between the processing position (position indicated by alternate long and two short dashes lines in FIG. 24) and the standby position (position indicated by solid lines in FIG. 24).

Representative examples of the chemical liquid include etching liquids, such as TMAH, etc., and resist removing liquids, such as SPM, etc. The chemical liquid is not restricted to TMAH and SPM, and may be a liquid containing at least one of sulfuric acid, acetic acid, nitric acid, hydrochloric acid, hydrofluoric acid, ammonia water, hydrogen peroxide water, an organic acid, an organic alkali besides TMAH, a surfactant, and a corrosion inhibitor.

Figure 23:
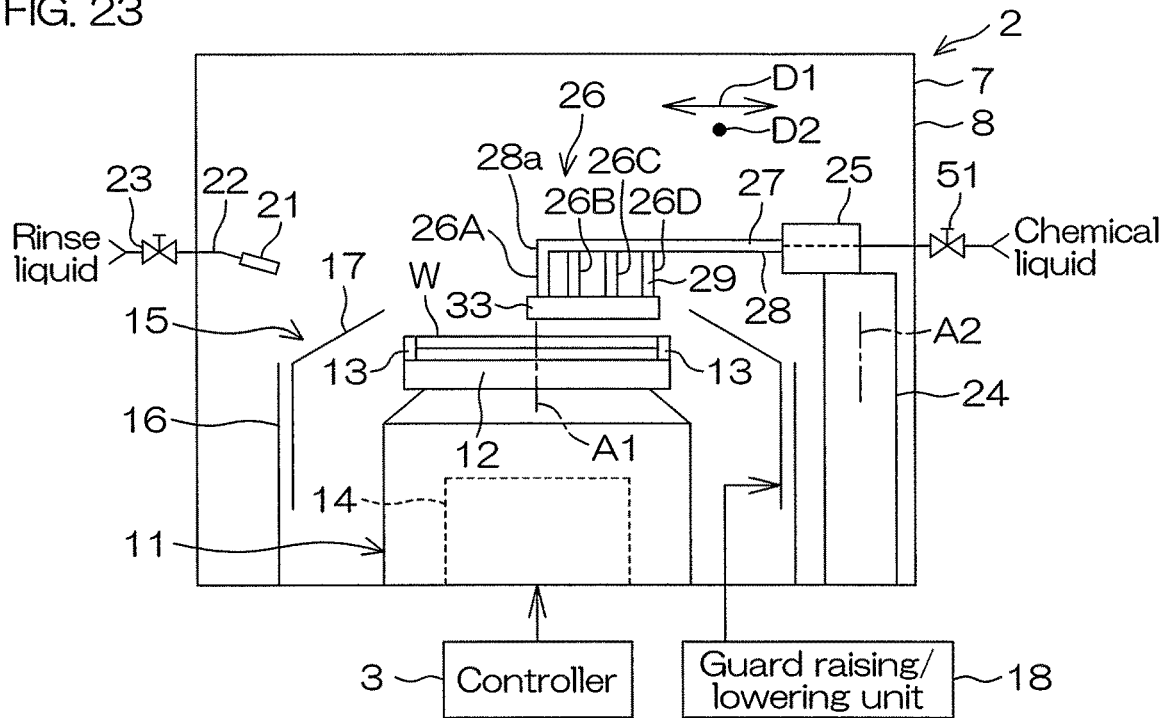
FIG. 23 is a schematic front view of an interior of a processing unit included in the substrate processing apparatus.

As shown in FIG. 23, each of the nozzles 26 includes the main nozzle body 27 that is cantilevered by the holder 25 and a nozzle head 33 that is shared with the other nozzles 26. The main nozzle body 27 includes the arm portion 28 extending in the horizontal longitudinal direction D1 from the holder 25 and the tip portion 29 extending downward from the tip 28a of the arm portion 28. The tip 28a of the arm portion 28 means the portion disposed furthest in the longitudinal direction D1 from the holder 25 in a plan view. The nozzle head 33 is supported by the tip portions 29 of the respective main nozzle bodies 29.

As shown in FIG. 24, the plurality of arm portions are aligned in the horizontal alignment direction D2, orthogonal to the longitudinal direction D1, in the order of the first nozzle 26A to the fourth nozzle 26D. The plurality of arm portions 28 are disposed at the same height. The interval between two arm portions 28 that are adjacent in the alignment direction D2 may be the same as any of the other intervals or may differ from at least one of the other intervals. FIG. 24 shows an example where the plurality of arm portions 28 are disposed at equal intervals.

The lengths of the plurality of arm portions 28 in the longitudinal direction D1 decrease in the order of the first nozzle 26A to the fourth nozzle 26D. The tips of the plurality of nozzles 26 (the tips 28a of the plurality of arm portions 28) are shifted in the longitudinal direction D1 so as to be aligned in the order of the first nozzle 26A to the fourth nozzle 26D in regard to the longitudinal direction D1. The tips of the plurality of nozzles 26 are aligned rectilinearly in a plan view.

The nozzle moving unit 24 makes the holder 25 pivot around the nozzle pivoting axis A2 extending vertically at the periphery of the cup 15 to move the plurality of nozzles 26 along the arcuate path passing the substrate W in a plan view. The plurality of nozzles 26 are thereby moved horizontally between the processing position and the standby position. The processing unit 2 includes the bottomed cylindrical standby pot 35 that is disposed below the standby position of the plurality of nozzles 26. The standby pot 35 is disposed at the periphery of the cup 15 in a plan view.

The processing position is a position at which the chemical liquids discharged from the nozzle head 33 land on the upper surface of the substrate W. At the processing position, the nozzle head 33 and the substrate W overlap in a plan view and the tips of the plurality of nozzles 26 are aligned in the radial direction Dr in the order of the first nozzle 26A to the fourth nozzle 26D from the rotational axis A1 side in a plan view. In this state, the tip of the first nozzle 26A overlaps with the central portion of the substrate W in a plan view and the tip of the fourth nozzle 26D overlaps with the peripheral edge portion of the substrate W in a plan view.

The standby position is a position to which the plurality of nozzles 26 are retracted so that the nozzle head 33 and the substrate W do not overlap in a plan view. At the standby position, the tips of the plurality of nozzles 26, in a plan view, are positioned outside the cup 15 and along the outer circumferential surface of the cup 15 (outer circumferential surface of the outer wall 16) and are aligned in the circumferential direction (direction around the rotational axis A1) in the order of the first nozzle 26A to the fourth nozzle 26D. The plurality of nozzles 26 are disposed to be further away from the rotational axis A1 in the order of the first nozzle 26A to the fourth nozzle 26D.

Figure 25:
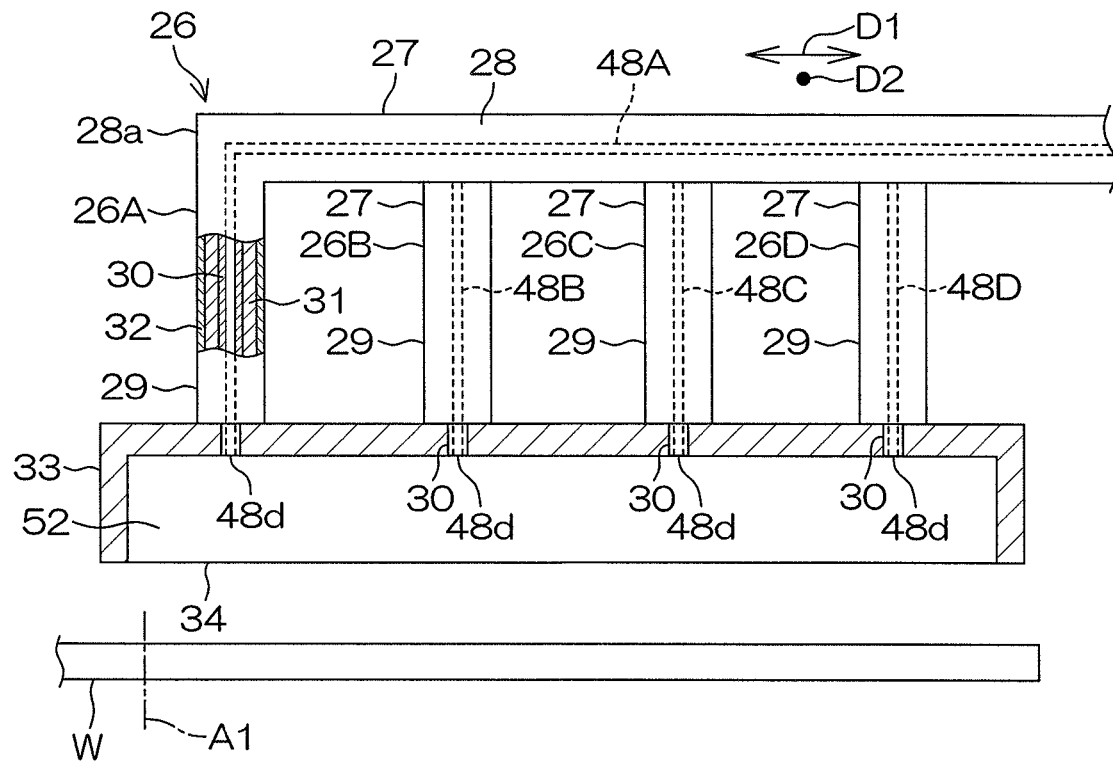
FIG. 25 is a schematic partial sectional view of a plurality of nozzles and a nozzle head as viewed horizontally.
Figure 26:
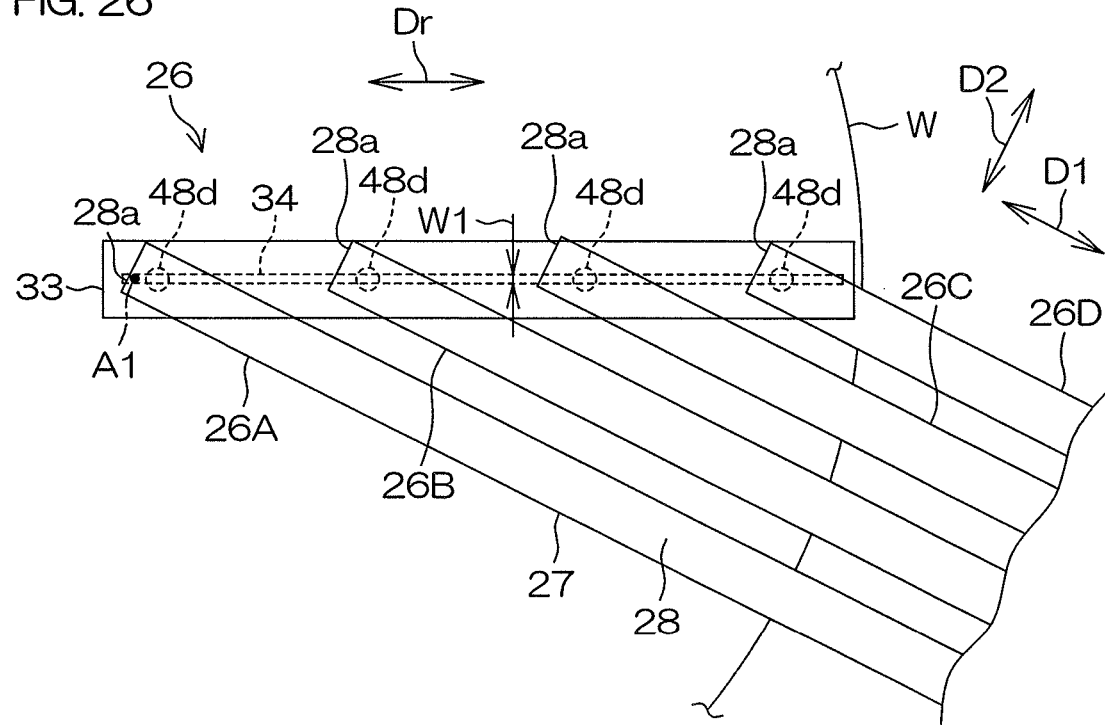
FIG. 26 is a schematic plan view of the plurality of nozzles and the nozzle head.
Figure 27:
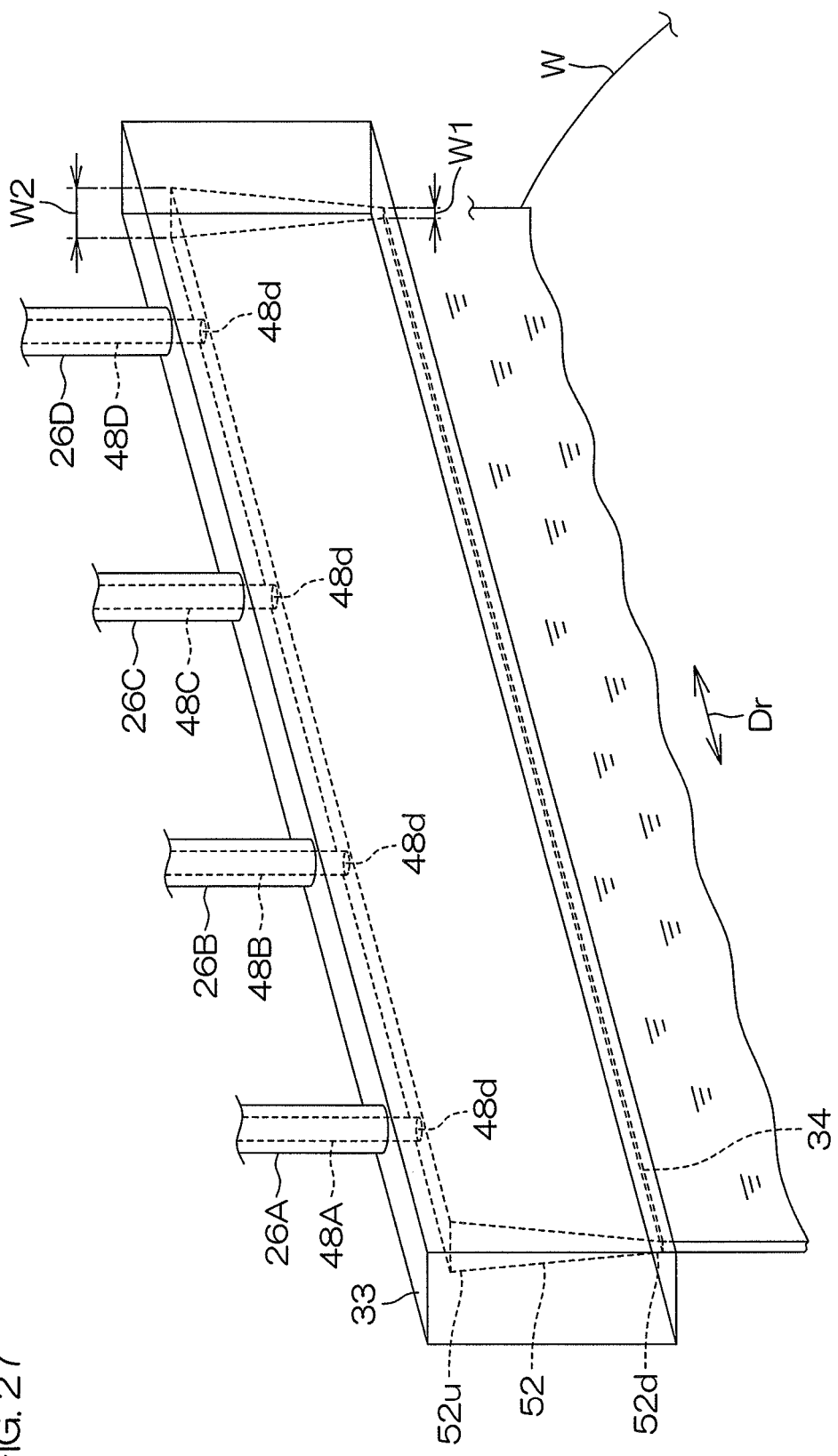
FIG. 27 is a schematic perspective view of the plurality of nozzles and the nozzle head.

The plurality of nozzles 26 shall now be described with reference to FIG. 25 to FIG. 27. Thereafter, the processing liquid supplying system shall be described. FIG. 25 to FIG. 27 show a state where the plurality of nozzles 26 are disposed at the processing position.

In the following description, "first" and "A" may be added to the beginning and the end of an arrangement corresponding to the first nozzle 26A. For example, the upstream flow passage 48 associated with the first nozzle 26A may be referred to as the "first upstream flow passage 48A." The same applies to arrangements associated with the second nozzle 26B to the fourth nozzle 26D.

Also in the following description, the temperature at which the processing liquid is heated by the upstream heater 43 may be referred to as the "upstream temperature" and the temperature at which the processing liquid is heated by the downstream heater 53 may be referred to as the "downstream temperature." The temperatures at which the processing liquids are heated by the second downstream heater 53 to the fourth downstream heater 53 may be referred to respectively as the "second downstream temperature" to the "fourth heating temperature."

As shown in FIG. 25, each main nozzle body 27 includes the resin tube 30 that guides the processing liquid, the core bar 31 of cylindrical cross section that surrounds the resin tube 30, and the resin coating 32 of cylindrical cross section that surrounds the outer surface of the core bar 31. A lower surface of the resin tube 30 at which a discharge port is defined is disposed in an interior of the nozzle head 33.

Each main nozzle body 27 defines a single flow passage extending along the main nozzle body 27. The flow passage of the main nozzle body 27 corresponds to a portion of the upstream flow passage 48 to be described below. As shown in FIG. 26, downstream ends 48d of the first upstream flow passage 48A to the fourth upstream flow passage 48D are respectively disposed at a plurality of positions differing in distance from the rotational axis A1 and are aligned in the radial direction Dr in a plan view.

The downstream end 48d of the first upstream flow passage 48A is disposed further to the rotational axis A1 side than the downstream ends 48d of the second upstream flow passage 48B to the fourth upstream flow passage 48D. The first upstream flow passage 48A is an example of a main upstream flow passage and the second upstream flow passage 48B to the fourth upstream flow passage 48D are an example of a plurality of auxiliary upstream flow passages. The downstream end 48d of the first upstream flow passage 48 is an example of a main downstream end and the downstream ends 48d of the second upstream flow passage 48B to the fourth upstream flow passage 48D are an example of a plurality of downstream ends.

As shown in FIG. 25, the nozzle head 33 defines a single flow passage (collective flow passage 52) that guides the processing liquids supplied from the plurality of main nozzle bodies 27 and a slit-shaped slit discharge port 34 opening at a lower surface of the nozzle head 33. The slit discharge port 34 is parallel to the upper surface of the substrate W. The slit discharge port 34 is disposed below the downstream ends 48d of the respective upstream flow passages 48A to 48D.

As shown in FIG. 26, the slit discharge port 34 extends, in a plan view, in the radial direction Dr from the upper surface central portion of the substrate W to the upper surface peripheral edge portion of the substrate W. A width W1 (the width means a length in a horizontal direction orthogonal to the radial direction Dr; the same applies hereinafter) of the slit discharge port 34 is fixed from one end of the slit discharge port 34 to the other end of the slit discharge port 34. The width W1 of the slit discharge port 34 is smaller than a diameter of each of the downstream ends 48d of the upstream flow passages 48A to 48D. A portion of each of the downstream ends 48d of the upstream flow passages 48A to 48D overlaps with the slit discharge port 34 in a plan view and the remaining portion does not overlap with the slit discharge port 34 in a plan view. The slit discharge port 34 discharges the chemical liquids supplied from the collective flow passage 52 perpendicularly toward the upper surface of the substrate W.

As shown in FIG. 27, the collective flow passage 52 connects the downstream ends 48d of the respective upstream flow passages 48A to 48D to the slit discharge port 34. A width of the collective flow passage 52 decreases continuously from an upstream end 52u of the collective flow passage 52 to a downstream end 52d of the collective flow passage 52. A width W2 of the upstream end 52u of the collective flow passage 52 is not less than the diameter of each of the downstream ends 48d of the upstream flow passages 48A to 48D. A width of the downstream end 52d of the collective flow passage 52 is equal to the width W1 of the slit discharge port 34.

A height of the collective flow passage 52, that is, a distance in the vertical direction from the downstream end 52d of the collective flow passage 52 to the upstream end 52u of the collective flow passage 52 is greater than the width W2 of the upstream end 52u of the collective flow passage 52. A length of the collective flow passage 52 in the radial direction Dr is longer than the distance in the radial direction Dr from the downstream end 48*d* of the first upstream flow passage 48A to the downstream end 48*d* of the fourth upstream flow passage 48D. Respective ends of the collective flow passage 52 in the radial direction Dr are closed by the nozzle head 33.

The processing liquids supplied to the respective upstream flow passages 48A to 48D are supplied to the interior of the collective flow passage 52. The width W1 of the slit discharge port 34 is narrow and therefore a portion of the processing liquid supplied to the downstream end 48*d* of each of the upstream flow passages 48A to 48D spreads in the longitudinal direction within the collective flow passage 52 before arriving at the slit discharge port 34 while the remaining portion of the processing liquid is discharged from the slit discharge port 34 without spreading in the longitudinal direction of the slit discharge port 34 within the collective flow passage 52. A portion of the processing liquid supplied to a certain upstream flow passage 48 is thus mixed with the processing liquid supplied to another upstream flow passage 48 in the interior of the collective passage 52 or in a space between the substrate W and the slit discharge port 34. The processing liquids are thereby supplied to an entirety or substantially an entirety of the slit discharge port 34 and a band-shaped liquid film extending in the radial direction Dr is formed between the slit discharge port 34 and the substrate W.

Figure 21:
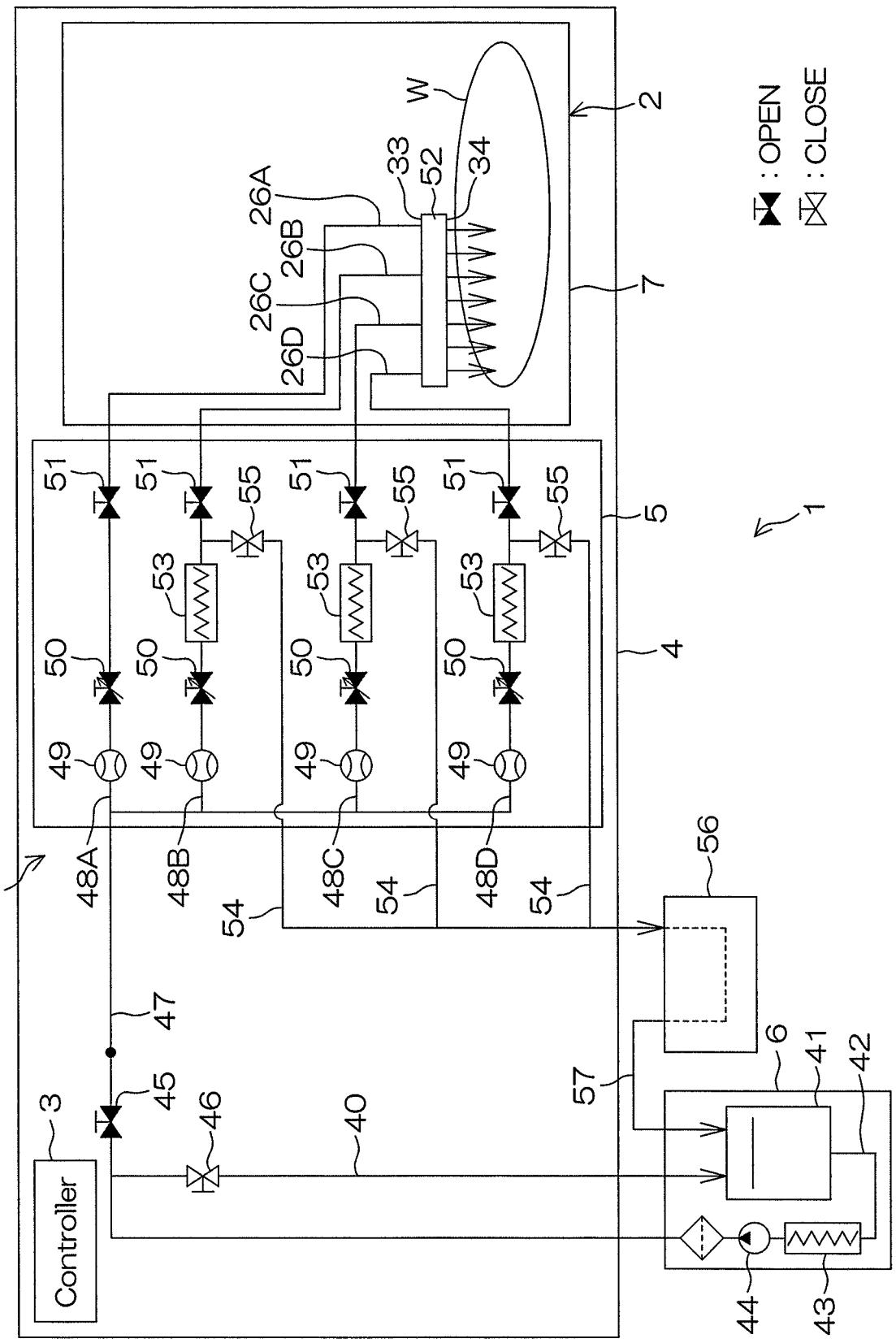
FIG. 21 is a schematic view of a processing liquid supplying system of a substrate processing apparatus according to a fourth preferred embodiment of the present invention and shows the processing liquid supplying system in a discharging state.
Figure 22:
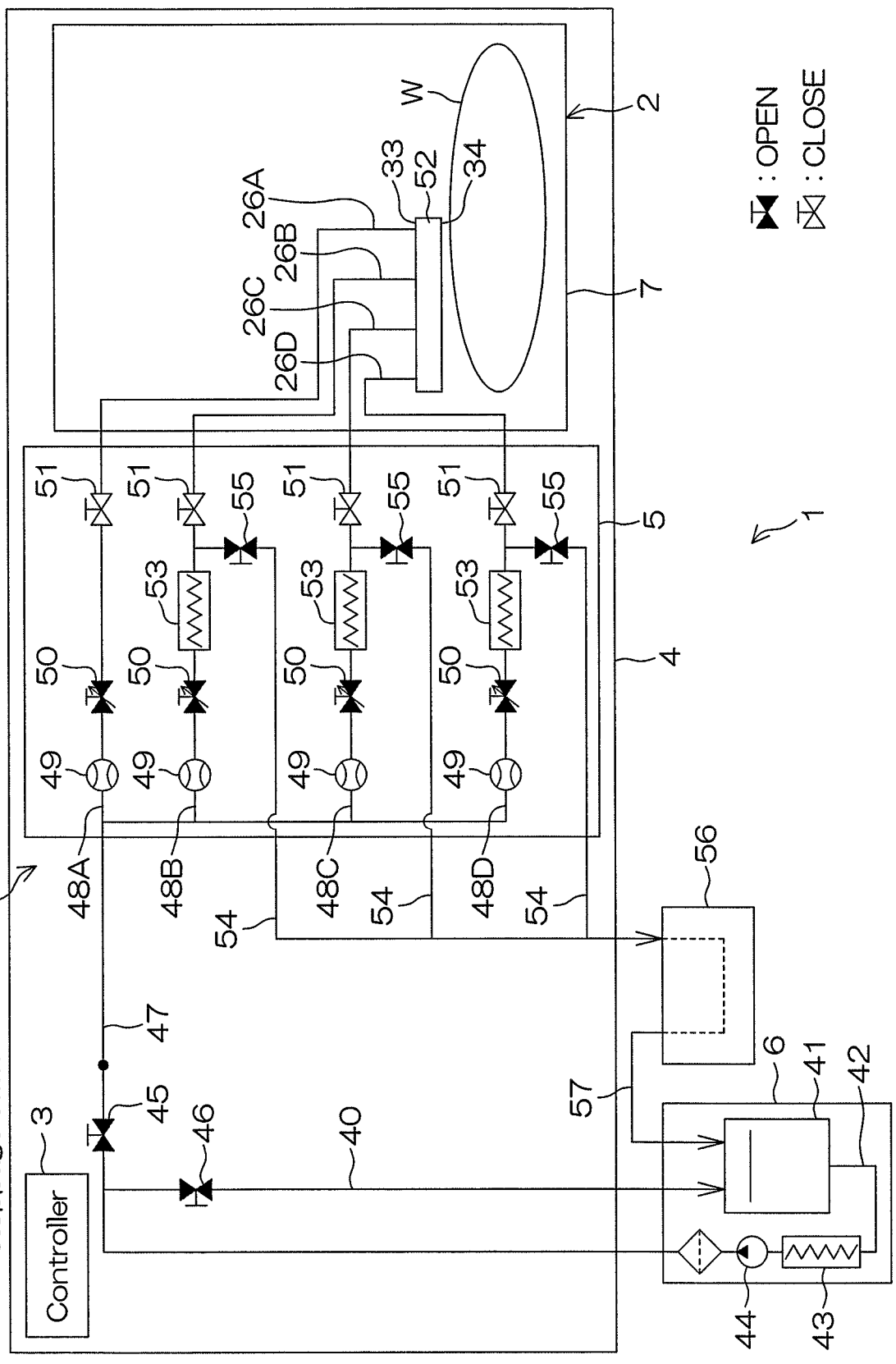
FIG. 22 is a schematic view of a processing liquid supplying system of the substrate processing apparatus according to the fourth preferred embodiment of the present invention and shows the processing liquid supplying system in a discharge stoppage state.

The processing liquid supplying system shall now be described in detail with reference to FIG. 21 and FIG. 22.

The processing liquid supplying system includes the chemical liquid tank 41 storing the chemical liquid, the chemical liquid flow passage 42 guiding the chemical liquid fed from chemical liquid tank 41, the upstream heater 43 heating the chemical liquid flowing inside the chemical liquid flow passage 42 at the upstream temperature higher than room temperature (for example, of 20 to 30° C.) to adjust the temperature of the chemical liquid inside the chemical liquid tank 41, the pump 44 feeding the chemical liquid inside the chemical liquid tank 41 to the chemical liquid flow passage 42, and the circulation flow passage 40 returning the chemical liquid inside the chemical liquid flow passage 42 to the chemical liquid tank 41.

The processing liquid supplying system includes the supply valve 45 that opens and closes the chemical liquid flow passage 42, the circulation valve 46 that opens and closes the circulation flow passage 40, and the supply flow passage 47 connected to the chemical liquid flow passage 42. An upstream switching unit includes the supply valve 45.

The processing liquid supplying system includes the plurality of upstream flow passages 48 guiding the chemical liquid supplied from the supply flow passage 47 toward the slit discharge port 34 and the collective flow passage 52 supplying the chemical liquids supplied from the plurality of upstream flow passages 48 to the slit discharge port 34. The processing liquid supplying system further includes the plurality of flowmeters 49 detecting flow rates of the liquids flowing inside the plurality of upstream flow passages 48, the plurality of flow control valves 50 that change the flow rates of the liquids flowing inside the plurality of upstream flow passages 48, and the plurality of discharge valves 51 respectively opening and closing the plurality of upstream flow passages 48. Although unillustrated, each flow control valve 50 includes the main valve body that opens and closes the flow passage and the actuator that changes the open degree of the main valve body. The actuator may be a pneumatic actuator or an electric actuator or an actuator besides these.

The processing liquid supplying system includes the plurality of downstream heaters 53 that heat the chemical liquids flowing inside the plurality of upstream flow passages 48 besides the first upstream flow passage 48A at downstream temperatures higher than the upstream temperature. The processing liquid supplying system further includes the plurality of return flow passages 54, respectively connected to the plurality of upstream flow passages 48 besides the first upstream flow passage 48A at positions further downstream than the plurality of downstream heaters 53, and the plurality of return valves 55, respectively opening and closing the plurality of return flow passages 54. A downstream switching unit includes the plurality of discharge valves 51 and the plurality of return valves 55.

The processing liquid supplying system includes the cooler 56 cooling the chemical liquids supplied from the plurality of return flow passages 54 and the tank recovery flow passage 57 guiding the chemical liquid from the cooler 56 to the chemical liquid tank 41. The chemical liquids supplied from the plurality of return flow passage 54 to the cooler 56 are made closer in temperature to the upstream temperature by the cooler 56 and thereafter guided via the tank recovery flow passage 57 to the chemical liquid tank 41. The cooler 56 may be a water cooled unit or an air cooled unit or may be a cooling unit other than these.

The processing liquid supplying system in a discharging state in which the chemical liquids are discharged from the slit discharge port 34 shall now be described with reference to FIG. 21. In FIG. 21, an open valve is indicated in black and a closed valve is indicated in white.

The chemical liquid inside the chemical liquid tank 41 is fed to the chemical liquid flow passage 42 by the pump 44. The chemical liquid fed by the pump 44 is heated by the upstream heater 43 and thereafter flows from the chemical liquid flow passage 42 to the supply flow passage 47 and flows to the plurality of upstream flow passages 48 from the supply flow passage 47. The chemical liquids supplied to the plurality of upstream flow passages 48 are supplied from the plurality of upstream flow passages 48 to the slit discharge port 34 via the collective flow passage 52. The chemical liquids supplied to the plurality of upstream flow passages 48 are thereby discharged from the slit discharge port 34 toward the upper surface of the substrate W.

Before being supplied to the slit discharge port 34, the chemical liquids supplied to the plurality of upstream flow passages 48 besides the first upstream flow passage 48A are heated by the downstream heaters 53. The temperatures (downstream temperatures) of heating of the processing liquids by the downstream heaters 53 are higher than the temperature (upstream temperature) of heating of the processing liquid by the upstream heater 43. The second to fourth downstream temperatures increase in the order of the second to the fourth downstream temperatures. The temperatures of the chemical liquids supplied to the downstream ends 48*d* (see FIG. 25) of the first upstream flow passage 48A to the fourth upstream flow passage 48D thus increase stepwise in the order of the first upstream flow passage 48A to the fourth upstream flow passage 48D.

The processing liquid supplying system in a discharge stoppage state in which the discharges of chemical liquids from the slit discharge port 34 are stopped shall now be described with reference to FIG. 22. In FIG. 22, an open valve is indicated in black and a closed valve is indicated in white.

The chemical liquid inside the chemical liquid tank 41 is fed to the chemical liquid flow passage 42 by the pump 44. A portion of the chemical liquid fed by the pump 44 is heated by the upstream heater 43 and thereafter returned to the chemical liquid tank 41 via the circulation flow passage 40. The remaining portion of the chemical liquid fed by the pump 44 flows from the chemical liquid flow passage 42 to the supply flow passage 47 and flows from the supply flow passage 47 to the plurality of upstream flow passages 48 besides the first upstream flow passage 48A.

The chemical liquid inside the second upstream flow passage 48 is heated by the downstream heater 53 associated with the second upstream flow passage 48B and thereafter flows via the return flow passage 54 to the cooler 56. The same as the second upstream flow passage 48B applies to the third upstream flow passage 48C and the fourth upstream flow passage 48D. The chemical liquids supplied to the cooler 56 are cooled by the cooler 56 and return to the chemical liquid tank 41 via the tank recovery flow passage 57. All of the chemical liquid fed to the chemical liquid flow passage 42 by the pump 44 is thereby returned to the chemical liquid tank 41.

The temperature of the processing liquid may have a large influence on the processing of the substrate W. If the downstream heaters 53 are stopped during discharge stoppage, it will take time for the temperatures of the processing liquids, heated by the downstream heaters 53, to stabilize at the intended temperatures when operation of the downstream heaters 53 is restarted. The discharge of processing liquid thus cannot be restarted immediately and throughput decreases.

As described above, even during discharge stoppage, the chemical liquids are made to continue to flow to the downstream heaters 53 and the downstream heaters 53 are made to heat the chemical liquids. A state where the temperatures of the downstream heaters 53 are stable can thus be maintained. Further, the chemical liquids heated by the downstream heaters 53 are returned to the chemical liquid tank 41 and the consumption amount of the chemical liquid can thus be reduced. Moreover, the chemical liquid that is cooled by the cooler 56 is returned to the chemical liquid tank 41 and therefore variation of temperature of the chemical liquid inside the chemical liquid tank 41 can be suppressed.

An example of processing of the substrate W executed by the substrate processing apparatus 1 shall now be described. The respective operations described below are executed by the controller 3 controlling the substrate processing apparatus 1. FIG. 23 and FIG. 24 shall be referenced in the following description. FIG. 7 shall be referenced where suitable.

When the substrate W is to be processed by the processing unit 2, the substrate W is carried into the interior of the chamber 7 by the hand (not shown) of the transfer robot in a state where the plurality of nozzles 26 are retracted from above the spin chuck 11 and the splash guard 17 is positioned at the lower position. The substrate W is thereby placed, in the state where the front surface is faced up, on the plurality of chuck pins 13. Thereafter, the hand of the transfer robot is retracted from the interior of the chamber 7 and the carry-in/carry-out port 8a of the chamber 7 is closed by the shutter 9.

After the substrate W has been placed on the plurality of chuck pins 13, the plurality of chuck pins 13 are pressed against peripheral edge portions of the substrate W and the substrate W is gripped by the plurality of chuck pins 13. Also, the guard raising/lowering unit 18 moves the splash guard 17 from the lower position to the upper position. The upper end of the splash guard 17 is thereby disposed higher than the substrate W. Thereafter, the spin motor 14 is driven to start rotation of the substrate W. The substrate W is thereby rotated at a predetermined liquid processing speed (of, for example, several hundred rpm).

Thereafter, the nozzle moving unit 24 moves the plurality of nozzles 26 from the standby position to the processing position. The nozzle head 33 are thereby overlapped with the substrate W in a plan view. Thereafter, the plurality of discharge valves 51, etc., are controlled and the chemical liquids are discharged at the same time from the plurality of nozzles 26 (step S1 of FIG. 7). The plurality of nozzles 26 discharge the chemical liquids in the state where the nozzle moving unit 24 keeps the plurality of nozzles 26 still. When a predetermined time elapses from the opening of the plurality of discharge valves 51, the discharges of chemical liquids from the plurality of nozzles 26 are stopped at the same time (step S2 of FIG. 7). Thereafter, the nozzle moving unit 24 moves the plurality of nozzles 26 from the processing position to the standby position.

The chemical liquids discharged from the plurality of nozzles 26 land at the same time on a rectilinear region within the upper surface of the substrate W (see FIG. 27). The plurality of nozzles 26 discharge the chemical liquids toward the upper surface of the rotating substrate W. A relative positional relationship of the substrate W and the rectilinear region changes due to the rotation of the substrate W. The chemical liquids are thereby made to land on the entire upper surface of the substrate W. The chemical liquids are thereby supplied to the entire upper surface of the substrate W and the liquid film of chemical liquid that covers the entire upper surface of the substrate W is formed on the substrate W. The entire upper surface of the substrate W is thereby processed by the chemical liquid. Also, the chemical liquid on the substrate W is scattered to the periphery of the substrate W from the upper surface peripheral edge portion of the substrate Wand received by the inner peripheral surface of the splash guard 17.

After the discharges of chemical liquids from the plurality of nozzles 26 have been stopped, the rinse liquid valve 23 is opened and discharge of the rinse liquid (pure water) from the rinse liquid nozzle 21 is started (step S3 of FIG. 7). The chemical liquid on the substrate W is thereby rinsed off by the rinse liquid and the liquid film of the rinse liquid that covers the entire upper surface of the substrate W is formed. When a predetermined time elapses from the opening of the rinse liquid valve 23, the rinse liquid valve 23 is closed and the discharge of the rinse liquid from the rinse liquid nozzle 21 is stopped (step S4 of FIG. 7).

After the discharge of the rinse liquid from the rinse liquid nozzle 21 has been stopped, the substrate W is accelerated in the rotational direction by the spin motor 14 and the substrate W is rotated at a drying speed (of, for example, several thousand rpm) higher than the liquid processing speed (step S5 of FIG. 7). The rinse liquid attached to the substrate W is thereby spun off to the periphery of the substrate W and the substrate W is dried. When a predetermined time elapses from the start of high speed rotation of the substrate W, the rotation of the spin motor 14 and the substrate W is stopped.

After the rotation of the substrate W has been stopped, the guard raising/lowering unit 18 moves the splash guard 17 from the upper position to the lower position. Further, the holding of the substrate W by the plurality of chuck pins 13 is released. The transfer robot makes its hand enter the interior of the chamber 7 in the state where the plurality of nozzles 26 are retracted from above the spin chuck 11 and the splash guard 17 is positioned at the lower position. Thereafter, the transfer robot uses the hand to take the substrate W on the spin chuck 11 and carries out the substrate W from the chamber 7.

Figure 28:
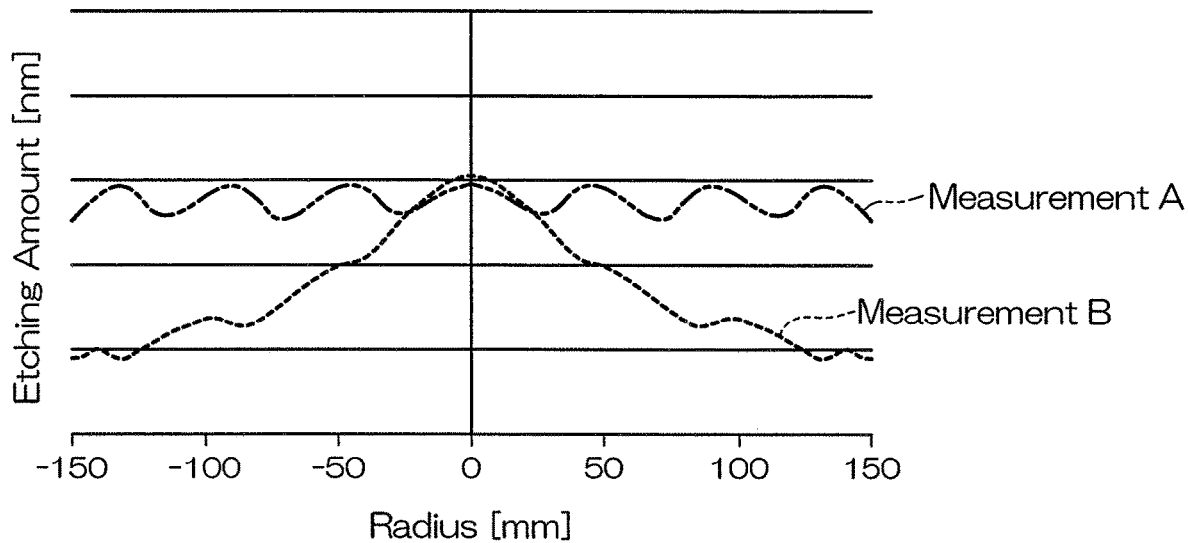
FIG. 28 is a graph of etching amount distributions of substrates.

FIG. 28 is a graph of etching amount distributions of substrates W.

The processing conditions of the substrates W of measurement A to measurement B shown in FIG. 28 are the same with the exception of the nozzles that discharge the chemical liquids.

The measurement A indicates the etching amount distribution when a substrate W is etched by making the plurality of nozzles 26, from which the nozzle head 33 has been removed, discharge the chemical liquids while keeping still the plurality of nozzles 26. That is, the measurement A indicates the etching amount distribution when the four discharge ports 34 (corresponding to the downstream ends 48d of the first upstream flow passage 48A to the fourth upstream flow passage 48D), respectively provided in the four main nozzle bodies 27, are made to discharge the chemical liquids.

The measurement B indicates the etching amount distribution when just a single discharge port (corresponding to the downstream end 48d of the first upstream flow passage 48A) is made to discharge the chemical liquid and the liquid landing position of the chemical liquid is fixed at the upper surface central portion of the substrate W.

With the measurement B, the etching amount decreases with distance away from the central portion of the substrate W and the etching amount distribution exhibits a peak-shaped curve. That is, the etching amount is greatest at the liquid landing position of the chemical liquid and decreases with distance away from the liquid landing position. On the other hand, with the measurement A, the etching amounts at positions besides the central portion of the substrate W are increased and the etching uniformity is greatly improved in comparison to the measurement B.

With the measurement A, seven peaks are formed. The apex of the central peak is at a position corresponding to the innermost liquid landing position and the apexes of the two peaks at outer sides thereof are at positions corresponding to the second liquid landing position from the inner side. The positions of the apexes of the two peaks further to the outer sides are positions corresponding to the third liquid landing position from the inner side, and the positions of the two outermost peaks are positions corresponding to the fourth liquid landing position from the inner side.

When chemical liquids are thus discharged toward the upper surface of the substrate W from a plurality of discharge ports that are aligned in the radial direction Dr, the chemical liquids land on a plurality of liquid landing positions that are separated in the radial direction Dr. The etching rate at a liquid landing position is higher than an etching rate at a position between two adjacent liquid landing positions. The processing uniformity is thus decreased. Such decrease of uniformity can thus be prevented by making the chemical liquids, discharged from the slit discharge port 34, land on the rectilinear region that is continuous in the radial direction Dr.

As described above, with the present preferred embodiment, the processing liquid is supplied from the supply flow passage 47 to all upstream flow passages 48 and supplied from all upstream flow passages 48 to the collective flow passage 52. The processing liquids supplied to the collective flow passage 52 are discharged from the slit discharge port 34 toward the upper surface of the substrate W. The band-shaped liquid film extending in the radial direction Dr between the upper surface central portion of the substrate W and the upper surface peripheral edge portion of the substrate W is thereby formed between the slit discharge port 34 and the substrate W and lands on the rectilinear region within the upper surface of the substrate W. The processing uniformity can thus be increased in comparison to a case of making the processing liquids be discharged from a plurality of discharge ports aligned in the radial direction Dr.

Also, the temperatures of the processing liquids supplied to the downstream ends 48d of the first upstream flow passage 48A to the fourth upstream flow passage 48D increase with increase of distance from the rotational axis A1 to the downstream end 48d. The processing liquids of the same or substantially the same temperatures as the processing liquids supplied to the plurality of downstream ends 48d land on positions directly below the plurality of downstream ends 48d. On the other hand, a mixed liquid of processing liquids, supplied to two of the plurality of downstream ends 48d that are adjacent to each other, lands at each position between the directly-below positions. That is, processing liquids that mutually differ in temperature are supplied to two of the plurality of downstream ends 48d that are adjacent to each other, and a processing liquid of a temperature between the two temperatures lands on a position between the directly-below positions.

The temperature of the processing liquid at each position of the slit discharge port 34 thus increases stepwise or continuously with distance from the rotational axis A1 and the temperature uniformity of the processing liquid on the substrate W can thus be increased in comparison to a case where a processing liquid of uniform temperature is discharged from the slit discharge port 34. The processing uniformity can thereby be increased further. Therefore in comparison to a case where a processing liquid is made to land on just the upper surface central portion of the substrate W, the processing uniformity can be increased while reducing the consumption amount of the processing liquid supplied to the substrate W.

Also with the present preferred embodiment, the slit discharge port 34 overlaps, in a plan view, with the upper surface central portion and the upper surface peripheral edge portion of the substrate W. The processing liquids discharged from the slit discharge port 34 land at the same time on the rectilinear region that includes the upper surface central portion and the upper surface peripheral edge portion of the substrate W. The slit discharge port 34 discharges the processing liquids toward the upper surface of the rotating substrate W. The relative positional relationship of the substrate W and the rectilinear region changes due to the rotation of the substrate W. The processing liquids are thereby made to land on the entire upper surface of the substrate W and the processing uniformity can thus be increased.

Also with the present preferred embodiment, the width W1 of the slit discharge port 34 is narrow and therefore a portion of the processing liquid supplied to an upstream flow passage 48 spreads in the longitudinal direction within the collective flow passage 52 before arriving at the slit discharge port 34 while the remaining portion of the processing liquid supplied to the upstream flow passage 48 arrives at the slit discharge port 34 without spreading in the longitudinal direction of the slit discharge port 34 within the collective flow passage 52. A portion of the processing liquid is thus mixed with the processing liquid supplied to another upstream flow passage 48 in the interior of the collective passage 52 or in the space between the substrate W and the slit discharge port 34. The temperatures of the processing liquids supplied to the substrate W can thereby be increased stepwise or continuously with distance away from the rotational axis A1.

Figure 29A:
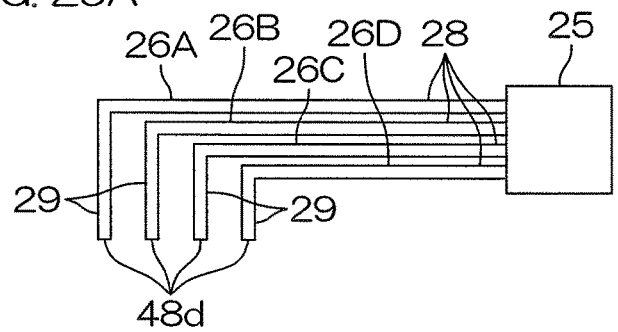
FIG. 29A and FIG. 29B are schematic views of a plurality of nozzles according to a second modification example of the fourth preferred embodiment, with FIG. 29A being a schematic front view of the plurality of nozzles and FIG. 29B being a schematic plan view of the plurality of nozzles.
Figure 29B:
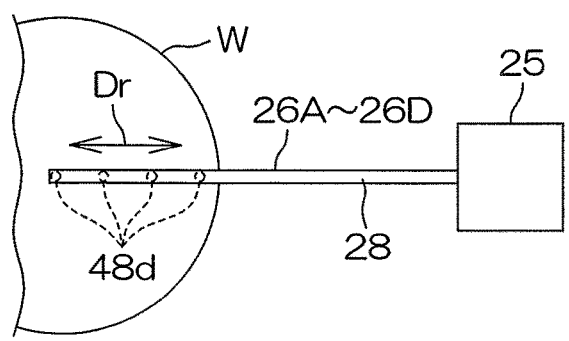

Also with the present preferred embodiment, the tips 28a of the plurality of arm portions 28 are aligned in a plan view in the radial direction Dr (see FIG. 24). When the plurality of nozzles 26 of the same length are aligned in the horizontal direction orthogonal to the longitudinal direction D1 so that the tips 28a of the plurality of arm portions 28 are aligned in a plan view in the radial direction Dr, the entirety of the plurality of nozzles 26 increases in width (see FIG. 9). When the plurality of nozzles 26 of different lengths are aligned in the vertical direction so that the tips 28a of the plurality of arm portions 28 are aligned in a plan view in the radial direction Dr, the entirety of the plurality of nozzles 26 increases in height (see FIG. 29A and FIG. 29B).

On the other hand, with the present preferred embodiment, the plurality of arm portions 28 are aligned in the horizontal alignment direction D2 orthogonal to the longitudinal direction D1. Further, the tips 28a of the plurality of arm portions 28 are shifted in the longitudinal direction D1 such that, in regard to the longitudinal direction D1, the tips 28a of the plurality of arm portions 28 are aligned in the order of the first nozzle 26A to the fourth nozzle 26D from the rotational axis A1 side (see FIG. 24). The tips 28a of the first nozzle 26A to the fourth nozzle 26D can thereby be aligned in the radial direction Dr in a plan view while suppressing both the width and the height of the entirety of the plurality of nozzles 26.

Also with the present preferred embodiment, the upstream ends of the plurality of upstream flow passages 48 are disposed inside the fluid box 5. The supply flow passage 47 branches into the plurality of upstream flow passages 48 inside the fluid box 5. Each upstream flow passage 48 can thus be reduced in length (length in the direction in which the liquid flows) in comparison to a case where the supply flow passage 47 branches into the plurality of upstream flow passages 48 at a position further upstream than the fluid box 5. Temperature decrease of the processing liquid due to heat transfer from the processing liquid to each upstream flow passage 48 can thereby be suppressed.

The present invention is not restricted to the content of the preferred embodiment and various modifications are possible within the scope of the present invention.

For example, although with the preferred embodiment described above, the case where the number of the nozzles 26 is four was described, the number of the nozzles 26 may be two or three or may be five or more.

Although with the preferred embodiment, the case where the slit discharge port 34 discharges the processing liquids in the discharge direction perpendicular to the upper surface of the substrate W was described, the slit discharge port 34 may discharge the processing liquids in a discharge direction that is obliquely inclined with respect to the upper surface of the substrate W.

Although with the preferred embodiment, the case where the width W1 of the slit discharge port 34 is fixed was described, the width W1 of the slit discharge port 34 does not have to be fixed. For example, the width W1 of the slit discharge port 34 increases stepwise or continuously with distance away from the rotational axis A1.

Figure 30:
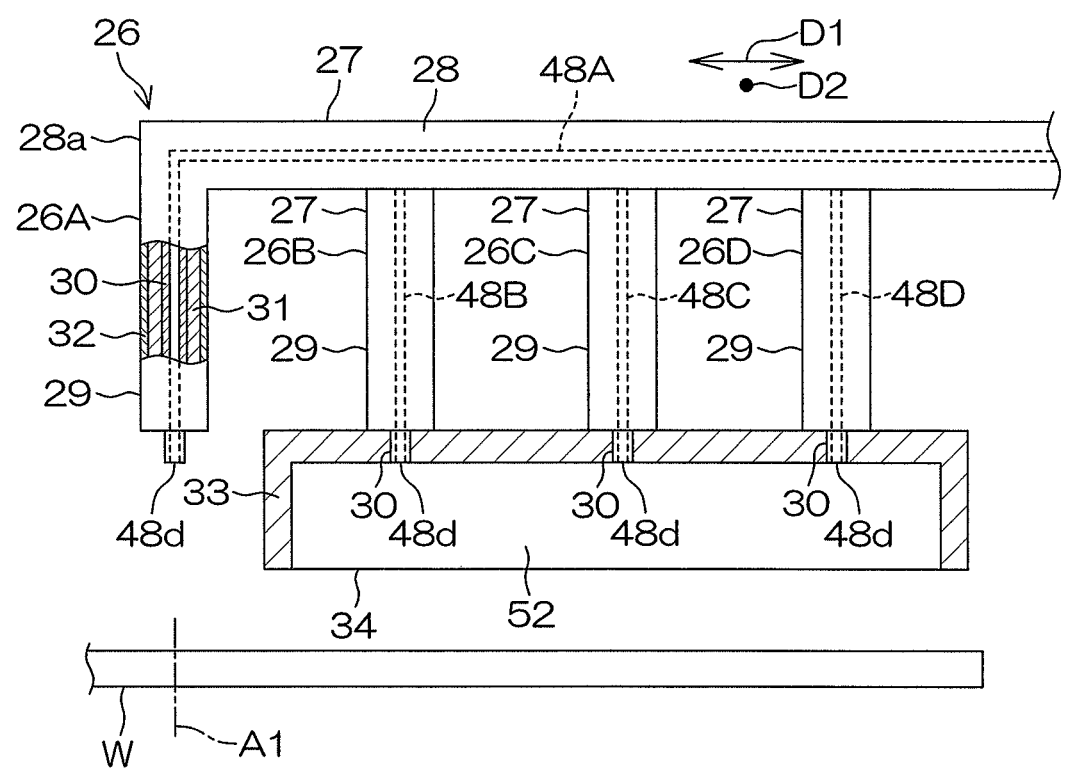
FIG. 30 is a schematic partial sectional view of a plurality of nozzles and a nozzle head according to another preferred embodiment of the present invention as viewed horizontally.

Although with the preferred embodiment, the case where the nozzle head 33 is connected to all nozzles (first nozzle 26A to fourth nozzle 26D) was described, one or two of the four nozzles do not have to be connected to the nozzle head 33. For example, the nozzle head 33 may be connected to just the second nozzle 26B to the fourth nozzle 26D as shown in FIG. 30. In this case, the processing liquid supplied to the first nozzle 26A is discharged toward the upper surface central portion of the substrate W from the downstream end 48d of the first upstream flow passage 48A.

Although with the preferred embodiment, the case where the chemical liquid flowing through each of the return flow passages 54 toward the chemical tank 41 is cooled by the cooler 56 was described, the cooler 56 may be omitted.

The controller 3 may decrease the flow rate of the processing liquid supplied from the supply flow passage 47 to the plurality of upstream flow passages 48 in the discharge stoppage state in comparison to the flow rate of the processing liquid supplied from the supply flow passage 47 to the plurality of upstream flow passages 48 in the discharging state. In this case, the flow rate of the chemical liquids returning from the return flow passages 54 to the chemical liquid tank 41 decreases during discharge stoppage, so that a heat amount applied to the chemical liquid inside the chemical liquid tank 41 can be reduced and variation of liquid temperature can be suppressed.

Although with the preferred embodiment, the case where, during discharge stoppage, the liquids heated by the downstream heaters 53 are made to flow from the upstream flow passages 48 to the return flow passages 54 was described, if the downstream heaters 53 are to be stopped during discharge stoppage, the return flow passages 54 may be omitted.

Although with the preferred embodiment, the case where a downstream heater 53 is not disposed at the first upstream flow passage 48A while downstream heaters 53 are disposed at all upstream flow passages 48 besides the first upstream flow passage 48A was described, the downstream heaters 53 may be disposed at all upstream flow passages 48 including the first upstream flow passage 48A.

Although with the preferred embodiment, the case where the plurality of nozzles 26 are made to discharge the chemical liquids while keeping the plurality of nozzles 26 still was described, the plurality of nozzles 26 may be made to discharge the chemical liquids while making the plurality of nozzles 26 pivot around the nozzle pivoting axis A2.

Although with the preferred embodiment, the case where the chemical liquid flow passage 42 that supplies the chemical liquid to the supply flow passage 47 is provided was described, a plurality of processing liquid flow passages that supply liquids to the supply flow passage 47 may be provided.

For example, a first liquid may be supplied from a first liquid flow passage to the supply flow passage 47 and a second liquid may be supplied from a second liquid flow passage to the supply flow passage 47. In this case, the first liquid and the second liquid are mixed in the supply flow passage 47 and therefore a mixed liquid containing the first liquid and the second liquid is supplied from the supply flow passage 47 to the plurality of upstream flow passages 48. The first liquid and the second liquid may be liquids of the same type or may be liquids of different types. Specific examples of the first liquid and the second liquid include a combination of sulfuric acid and hydrogen peroxide water and a combination of TMAH and pure water.

The controller 3 may control the temperatures of the processing liquids supplied to respective portions of the front surface of the substrate W in accordance with a thickness of a thin film before processing to make uniform the thickness of the thin film after processing.

FIG. 14 is a graph showing a conceptual image of the thickness of a thin film before and after processing and the temperature of a processing liquid supplied to a substrate W.

The alternate long and short dashes line in FIG. 14 indicates the film thickness before processing and the alternate long and two short dashes line in FIG. 14 indicates the film thickness after processing. The solid line in FIG. 14 indicates the temperatures of the processing liquids supplied to the substrate W. The abscissa axis of FIG. 14 indicates the radius of the substrate W. The film thickness before processing may be input into the substrate processing apparatus 1 from an apparatus (for example, a host computer) other than the substrate processing apparatus 1 or may be measured by a measuring instrument provided in the substrate processing apparatus 1.

With the example shown in FIG. 14, the controller 3 may control the substrate processing apparatus 1 so that the temperatures of the processing liquids vary similarly to the film thickness before processing. Specifically, the controller 3 may control the plurality of downstream heaters 53 so that the temperatures of the processing liquids in the plurality of upstream flow passages 48 are temperatures that are in accordance with the film thickness before processing.

In this case, processing liquid of relatively high temperature is supplied to a position at which the film thickness before processing is relatively large and processing liquid of relatively low temperature is supplied to a position at which the film thickness before processing is relatively small. The etching amount of the thin film formed on the front surface of the substrate W increases relatively at a position at which processing liquid of high temperature is supplied and decreases relatively at a position at which processing liquid of low temperature is supplied. The thin film is thus made uniform in thickness after processing.

Two or more of any of the arrangements described above may be combined. Two or more of any of the processes described above may be combined.

A feature of a certain preferred embodiment may be added to another preferred embodiment.

The present application corresponds to Japanese Patent Application Nos. 2015-029843, 2015-035519, 2015-035520, 2015-035521 and 2015-064802 respectively filed on Feb. 18, 2015, Feb. 25, 2015, Feb. 25, 2015, Feb. 25, 2015 and Mar. 26, 2015 in the Japan Patent Office, and the entire disclosures of these applications are incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus comprising:
a substrate holding unit rotating a substrate around a vertical rotational axis passing through a central portion of the substrate while holding the substrate horizontally; and
a processing liquid supplying system including a supply flow passage, a plurality of upstream flow passages, a plurality of discharge ports, and a nozzle moving unit, the processing liquid supplying system supplying a processing liquid to the substrate held by the substrate holding unit; and
wherein the supply flow passage guides the processing liquid toward the plurality of upstream flow passages,
the plurality of upstream flow passages branch from the supply flow passage and guide the processing liquid, supplied from the supply flow passage, toward the plurality of discharge ports,
the plurality of discharge ports include a main discharge port, discharging the processing liquid toward an upper surface central portion of the substrate, and a plurality of auxiliary discharge ports, disposed away from the upper surface central portion, differing in distance from the rotational axis, and respectively discharging the processing liquid toward a plurality of positions within an upper surface of the substrate, and are respectively disposed at a plurality of positions differing in distance from the rotational axis and discharge the processing liquid, supplied via the plurality of upstream flow passages, toward the upper surface of the substrate held by the substrate holding unit,
the plurality of upstream flow passages include a main upstream flow passage connected to the main discharge port and a plurality of auxiliary upstream flow passages connected to the plurality of auxiliary discharge ports, and
the nozzle moving unit swings the plurality of discharge ports to change distances from the rotational axis to the plurality of discharge ports in a state where the substrate holding unit is rotating the substrate and the plurality of discharge ports are discharging the processing liquid toward the upper surface of the substrate,
wherein the plurality of discharge ports include an innermost discharge port that overlaps with the central portion of the substrate in a plan view and an outermost discharge port that overlaps with a peripheral edge portion of the substrate in a plan view.

2. The substrate processing apparatus according to claim 1, wherein the processing liquid supplying system further includes a plurality of downstream flow passages,
each of the plurality of auxiliary upstream flow passages is a branching upstream flow passage that branches into a plurality of the downstream flow passages and each auxiliary discharge port is respectively provided according to each downstream flow passage.

3. The substrate processing apparatus according to claim 2, wherein the substrate processing apparatus further comprises: a chamber housing the substrate held by the substrate holding unit; and
the branching upstream flow passages branch into the plurality of downstream flow passages inside the chamber.

4. The substrate processing apparatus according to claim 1, wherein the processing liquid supplying system further includes an upstream heater and a plurality of downstream heaters,
the upstream heater heats the processing liquid to be supplied to the supply flow passage at an upstream temperature, and
the plurality of downstream heaters are respectively connected to the plurality of auxiliary upstream flow passages at positions further upstream than the plurality of auxiliary discharge ports and heat the processing liquid, flowing through the plurality of auxiliary upstream flow passages, at downstream temperatures higher than the upstream temperature.

5. The substrate processing apparatus according to claim 4, wherein the plurality of downstream heaters heat the processing liquid flowing through the plurality of auxiliary upstream flow passages such that temperature of the processing liquid discharged from the plurality of auxiliary discharge ports increase in a stepwise manner as a distance from the rotational axis to the auxiliary discharge port increase.

6. The substrate processing apparatus according to claim 1, wherein the processing liquid supplying system further includes a plurality of return flow passages, a plurality of downstream heaters, and a downstream switching unit, the plurality of return flow passages are respectively connected to the plurality of auxiliary upstream flow passages at connection positions further upstream than the plurality of auxiliary discharge ports, the plurality of downstream heaters are respectively connected to the plurality of auxiliary upstream flow passages at positions further upstream than the connection positions of the return flow passages and the auxiliary upstream flow passages and heat liquid flowing through the plurality of auxiliary upstream flow passages, and the downstream switching unit switches to any of a plurality of states including a discharging state, in which the liquid supplied to the plurality of upstream flow passages from the supply flow passage is supplied to the plurality of discharge ports, and a discharge stoppage state, in which the liquid supplied to the plurality of upstream flow passages from the supply flow passage is supplied to the plurality of return flow passages.

7. A substrate processing apparatus comprising:

a substrate holding unit rotating a substrate around a vertical rotational axis passing through a central portion of the substrate while holding the substrate horizontally; and a processing liquid supplying system including a supply flow passage, a plurality of upstream flow passages, a plurality of discharge ports, and a nozzle moving unit, the processing liquid supplying system supplying a processing liquid to the substrate held by the substrate holding unit; and wherein the supply flow passage guides the processing liquid toward the plurality of upstream flow passages, the plurality of upstream flow passages branch from the supply flow passage and guide the processing liquid, supplied from the supply flow passage, toward the plurality of discharge ports, the plurality of discharge ports include a main discharge port, discharging the processing liquid toward an upper surface central portion of the substrate, and a plurality of auxiliary discharge ports, disposed away from the upper surface central portion, differing in distance from the rotational axis, and respectively discharging the processing liquid toward a plurality of positions within an upper surface of the substrate, and are respectively disposed at a plurality of positions differing in distance from the rotational axis and discharge the processing liquid, supplied via the plurality of upstream flow passages, toward the upper surface of the substrate held by the substrate holding unit, the plurality of upstream flow passages include a main upstream flow passage connected to the main discharge port and a plurality of auxiliary upstream flow passages connected to the plurality of auxiliary discharge ports, and the nozzle moving unit swings the plurality of discharge ports to change distances from the rotational axis to the plurality of discharge ports in a state where the substrate holding unit is rotating the substrate and the plurality of discharge ports are discharging the processing liquid toward the upper surface of the substrate, wherein the processing liquid supplying system further includes a first nozzle and a second nozzle, the plurality of discharge ports include a first discharge port, disposed in the first nozzle, and a second discharge port, disposed in the second nozzle, and are aligned in a plan view in a radial direction orthogonal to the rotational axis, the first nozzle includes a first arm portion extending in a horizontal longitudinal direction and a first tip portion extending downward from a tip of the first arm portion, the second nozzle includes a second arm portion extending in the longitudinal direction and a second tip portion extending downward from a tip of the second arm portion, the first arm portion and the second arm portion are aligned in a horizontal alignment direction orthogonal to the longitudinal direction, and the tip of the first arm portion and the tip of the second arm portion are separated in the longitudinal direction in a plan view such that the tip of the first arm portion is positioned at the rotational axis side.

8. The substrate processing apparatus according to claim 7, wherein the processing liquid supplying system further includes a plurality of downstream flow passages, each of the plurality of auxiliary upstream flow passages is a branching upstream flow passage that branches into a plurality of the downstream flow passages and each auxiliary discharge port is respectively provided according to each downstream flow passage.

9. The substrate processing apparatus according to claim 8, wherein the substrate processing apparatus further comprises: a chamber housing the substrate held by the substrate holding unit; and the branching upstream flow passages branch into the plurality of downstream flow passages inside the chamber.

10. A substrate processing apparatus comprising:

a substrate holding unit rotating a substrate around a vertical rotational axis passing through a central portion of the substrate while holding the substrate horizontally; and a processing liquid supplying system including a supply flow passage, a plurality of upstream flow passages, a plurality of discharge ports, and a nozzle moving unit, the processing liquid supplying system supplying a processing liquid to the substrate held by the substrate holding unit; and wherein the supply flow passage guides the processing liquid toward the plurality of upstream flow passages, the plurality of upstream flow passages branch from the supply flow passage and guide the processing liquid, supplied from the supply flow passage, toward the plurality of discharge ports, the plurality of discharge ports include a main discharge port, discharging the processing liquid toward an upper surface central portion of the substrate, and a plurality of auxiliary discharge ports, disposed away from the upper surface central portion, differing in distance from the rotational axis, and respectively discharging the processing liquid toward a plurality of positions within an upper surface of the substrate, and are respectively disposed at a plurality of positions differing in distance from the rotational axis and discharge the processing liquid at the same time, supplied via the plurality of upstream flow passages, toward the upper surface of the substrate held by the substrate holding unit, the plurality of upstream flow passages include a main upstream flow passage connected to the main discharge port and a plurality of auxiliary upstream flow passages connected to the plurality of auxiliary discharge ports, and the nozzle moving unit swings all of the plurality of discharge ports to change distances from the rotational axis to the plurality of discharge ports in a state where the substrate holding unit is rotating the substrate, the plurality of discharge ports are discharging the processing liquid toward the upper surface of the substrate and all of the plurality of discharge ports overlap with the substrate in a plan view, wherein the processing liquid supplying system further includes a first nozzle and a second nozzle, the plurality of discharge ports include a first discharge port, disposed in the first nozzle, and a second discharge port, disposed in the second nozzle, the first nozzle includes a first arm portion extending in a horizontal longitudinal direction and a first tip portion extending downward from a tip of the first arm portion, the second nozzle includes a second arm portion extending in the longitudinal direction and a second tip portion extending downward from a tip of the second arm portion.

11. The substrate processing apparatus according to claim 10, wherein the processing liquid supplying system further includes a plurality of downstream flow passages, each of the plurality of auxiliary upstream flow passages is a branching upstream flow passage that branches into a plurality of the downstream flow passages and each auxiliary discharge port is respectively provided according to each downstream flow passage.

12. The substrate processing apparatus according to claim 11, wherein the substrate processing apparatus further comprises: a chamber housing the substrate held by the substrate holding unit; and the branching upstream flow passages branch into the plurality of downstream flow passages inside the chamber.

13. The substrate processing apparatus according to claim 10, wherein the plurality of discharge ports are aligned in a plan view in a radial direction orthogonal to the rotational axis.

\* \* \* \* \*